(12) United States Patent
Nakaya

(10) Patent No.: US 10,790,430 B2
(45) Date of Patent: Sep. 29, 2020

(54) THERMOELECTRIC CONVERSION ELEMENT AND THERMOELECTRIC CONVERSION POWER GENERATION DEVICE

(76) Inventor: Hiroaki Nakaya, Osakasayama (JP)

( * ) Notice: Subject to any disclaimer, the term of this patent is extended or adjusted under 35 U.S.C. 154(b) by 262 days.

(21) Appl. No.: 14/233,480

(22) PCT Filed: Jul. 20, 2012

(86) PCT No.: PCT/JP2012/068465
§ 371 (c)(1),
(2), (4) Date: Jan. 17, 2014

(87) PCT Pub. No.: WO2013/012065
PCT Pub. Date: Jan. 24, 2013

(65) Prior Publication Data
US 2014/0174495 A1    Jun. 26, 2014

(30) Foreign Application Priority Data

Jul. 20, 2011 (JP) .................. 2011-159036
Jul. 20, 2011 (JP) .................. 2011-159055
(Continued)

(51) Int. Cl.
    *H01L 35/32* (2006.01)
(52) U.S. Cl.
    CPC .................. *H01L 35/32* (2013.01)
(58) Field of Classification Search
    CPC ................ H01L 35/325; H01L 35/10; H01L 31/0224–022491; H01L 31/035254; H01L 31/0745; H01L 35/12–26
    See application file for complete search history.

(56) References Cited

U.S. PATENT DOCUMENTS 2,928,253 A * 3/1960 Lopp .................. F25B 21/02
                                              165/201
3,305,405 A * 2/1967 Jamieson .............. G01K 7/06
                                              136/232
(Continued)

FOREIGN PATENT DOCUMENTS

EP    0 196 011 A2    10/1986
JP    H08-335722       12/1996
(Continued)

OTHER PUBLICATIONS

B. Yang et al., "Measurements of anisotropic thermoelectric properties in superlattices", Applied Physics Letters 81(19), p. 3588 (Year: 2002).*

(Continued)

*Primary Examiner* — Eric R Smith
(74) *Attorney, Agent, or Firm* — Stites & Harbison, PLLC; Terry L. Wright; Jeffrey A. Haeberlin

(57) ABSTRACT

A thermoelectric conversion element comprising a thermoelectric conversion section and electrodes, wherein the thermoelectric conversion section includes at least: a thermoelectric conversion material section or a thermoelectric conversion material layer which is formed of a thermoelectric conversion material; and a charge transport section or a charge transport layer which is formed of a charge transport material having at least both semiconducting electric conduction properties and metallic electric conduction properties.

7 Claims, 17 Drawing Sheets

(30) Foreign Application Priority Data

Feb. 22, 2012 (JP) ................................. 2012-036267
Jun. 8, 2012 (JP) ................................. 2012-130940

(56) References Cited

U.S. PATENT DOCUMENTS

| | | | | |
|---|---|---|---|---|
| 3,330,703 | A * | 7/1967 | Podolsky | H01L 35/22 136/201 |
| 3,391,030 | A * | 7/1968 | Beaver, Jr. | H01L 35/22 136/201 |
| 3,931,673 | A * | 1/1976 | Eggemann | C04B 37/026 136/205 |
| 5,936,192 | A * | 8/1999 | Tauchi | H01L 35/325 136/203 |
| 5,966,939 | A * | 10/1999 | Tauchi | H01L 35/325 62/3.2 |
| 6,043,423 | A * | 3/2000 | Satomura | H01L 35/08 136/203 |
| 6,269,645 | B1 * | 8/2001 | Yamaguchi | F01K 23/06 60/653 |
| 8,962,970 | B2 | 2/2015 | Mingo Bisquert et al. | |
| 2006/0016248 | A1 * | 1/2006 | Walsh | H01L 35/16 73/40 |
| 2007/0101737 | A1 * | 5/2007 | Akei | F25B 1/00 62/238.6 |
| 2011/0220164 | A1 * | 9/2011 | Guha | C04B 35/547 136/225 |
| 2012/0060888 | A1 * | 3/2012 | Mingo Bisquert | |
| 2012/0068157 | A1 * | 3/2012 | Kub | B82Y 10/00 257/15 |
| 2014/0251403 | A1 * | 9/2014 | Ghoshal | H01L 35/08 136/200 |

FOREIGN PATENT DOCUMENTS

| | | |
|---|---|---|
| JP | H9-162448 | 6/1997 |
| JP | 2004-056054 A | 2/2004 |
| JP | 2009-141079 A | 6/2009 |
| JP | 2010-147379 | 7/2010 |
| JP | 2010-192780 A | 9/2010 |
| WO | WO 2010093323 A1 * | 8/2010 ........... B60N 2/5678 |

OTHER PUBLICATIONS

JPO, International Search Report issued in corresponding international application No. PCT/JP02012/068465, dated Oct. 23, 2012.

* cited by examiner

THERMOELECTRIC CONVERSION ELEMENT AND THERMOELECTRIC CONVERSION POWER GENERATION DEVICE

TECHNICAL FIELD

The present invention relates to a thermoelectric conversion element and a thermoelectric conversion power generation device.

BACKGROUND ART

Thermoelectric conversion elements are known as clean energy conversion elements without the use of petroleum or ozone, and have been desired to be made more efficient, larger in area and thinner in recent years. For example, power generation elements using the Seebeck effect (thermoelectric conversion power generation elements) and cooling/heating elements using the Peltier effect (Peltier elements) have been under development.

The structure and the principle of such thermoelectric conversion elements will be described. FIG. 17 is a conception diagram for illustrating a structure of a conventional thermoelectric conversion element.

As illustrated in FIG. 17, a conventional thermoelectric conversion element 100 is composed of a plurality of opposed electrodes (metallic electrode) 120 and 121, and 180; and a block 130 made of an n-type thermoelectric semiconductor and a block 131 made of a p-type thermoelectric semiconductor which are disposed between the electrodes. The blocks 130 and 131 are electrically connected with each other by the electrode 180 at their ends on one side (connection ends). The n-type thermoelectric semiconductor block and the p-type thermoelectric semiconductor block are connected in series. The blocks 130 and 131 are connected to the electrodes 120 and 121, respectively, at their ends on the other side.

In this configuration, thermal energy is converted into electric energy due to the Seebeck effect by using the electrode 180 as a high temperature side and the opposite electrodes 120 and 121 as a low temperature side to create a temperature difference therebetween. Electric energy is converted into thermal energy also by the Peltier effect by applying a direct voltage between the electrode 180 and the electrodes 120 and 121 and passing an electric current through the electrode 120 to the electrode 121 via the electrode 180 so that the electrode 180 acts as an endothermic electrode, and the electrodes 120 and 121 act as radiative electrodes, for example.

Here, the endothermic energy in the case where the conventional thermoelectric conversion element is used as a Peltier element will be discussed. The endothermic energy Q on an upper side of the electrode 180 is represented by the following equation (1):

$$Q = Q_P - Q_R - Q_K \quad (1),$$

wherein $Q_P$ is an amount of Peltier endotherm, $Q_R$ is an amount of Joule heat, and $Q_R$ is an amount of heat conduction (see FIG. 17).

In addition, specifically, where the height of the blocks (distance between the electrode 180 and the electrodes 120 and 121) is L, and the cross sectional area of the blocks (cross sectional area of a surface perpendicular to a direction of the height) is S, $Q_R$ is in proportion to the height L of the blocks and in inverse proportion to the cross sectional area S. Furthermore, $Q_K$ is in proportion to the cross sectional area S of the blocks and in inverse proportion to the height L. To discuss the shape of the thermoelectric element, the larger the cross sectional area S is, the smaller $Q_R$ is and the larger $Q_K$ is, provided that the height L of the blocks is determined, for example. That is, once properties of the material are determined, the relationship between the cross sectional area S and the height L will be definitely determined as the shape of the element that provides ideal thermoelectric conversion efficiency.

Using a Bi—Te material as a thermoelectric material, for example, the thermoelectric conversion element can perform efficient thermoelectric conversion when the relationship of $S\ (m^2) = (0.6\ to\ 6) \times 10^{-3} \times L\ (m)$ is satisfied, wherein $S\ (m^2)$ is the cross sectional area of the blocks (in the shape of a rectangular parallelepiped or a circular cylinder) made of a Bi—Te material and L (m) is the height thereof. In this case, given a 10 cm×10 cm square liquid crystal display panel is cooled with two blocks made of n-type and p-type thermoelectric semiconductors, for example, the height L of the blocks of the thermoelectric conversion element needs to be cm or higher, making the thermoelectric conversion element impracticable. To solve the problem, a plurality of blocks having a cross sectional area S of approximately 0.01 cm² to 3 cm² are connected in series and modularized, and a thermoelectric conversion element (Peltier element) enlarged in endotherm area (cooling area) by the modularization has been put to practical use.

However, the radiating side of the thermoelectric conversion element reaches a high temperature and the material thereof expands, whereas the endothermic side reaches a lower temperature and contracts. Accordingly, in the case of a thermoelectric conversion element in which the electrodes are adhered to the blocks by soldering, for example, the adhered region may have fatigue crack due to stress. The larger the area of the thermoelectric conversion element is, the more significant this tendency is, and therefore the cooling area of a commercialized Peltier module is approximately 5 cm×5 cm.

Based on such a background, a technique to inhibit cracking in the adhered region has been reported. For example, there has been developed a thermoelectric conversion element module including opposed carbon substrates, and a plurality of n-type semiconductors and a plurality of p-type semiconductors planarly arranged between the substrates, wherein the carbon substrates are formed of a high thermal conductivity carbon composite material (see Patent Document 1, for example). According to the patent document, the thermoelectric conversion element module has superior thermal conductivity to those including substrates formed of general carbon materials, and can lessen heat loss in the substrates and prevent cracking in the adhered region between the substrates and the semiconductors. However, this invention employs thermoelectric conversion elements having a conventional element structure, and therefore the thermoelectric conversion elements do not have sufficient properties. In addition, the invention employs a conventional module structure obtained by modularizing a large number of thermoelectric conversion elements, and therefore the elements cannot be sufficiently enlarged in area.

In order to improve the efficiency of a thermoelectric conversion element, there have been reported various techniques to inhibit the thermal conduction between the endothermic side and the radiating side. For example, there has been developed a thermoelectric conversion module including a plurality of pairs of thermoelectric conversion elements each obtained by linearly arranging a p-type thermoelectric conversion material and a n-type thermoelectric conversion material, wherein a boundary between the p-type thermoelectric conversion material and the n-type thermoelectric conversion material is placed in contact with a high temperature heat source, and an electric and thermal insulator is placed on a side of the thermoelectric conversion element for thermally insulating low temperature parts distal to the boundary from the high temperature heat source (see Patent Document 2, for example). In this structure, however, the p-type thermoelectric conversion material and the n-type thermoelectric conversion material are arranged linearly and continuous with each other, and thus the thermal conduction between the thermoelectric conversion materials is not inhibited, and the thermoelectric conversion elements do not have sufficient properties. In addition, the module structure is conventional, and therefore the thermoelectric conversion elements cannot be sufficiently enlarged in area.

Furthermore, it has been reported to use a carbon material formed by conjugating graphene or fullerene and carbon nanotube as a thermoelectric conversion material (see Patent Documents 3 and 4, for example). By conjugating graphene or fullerene and carbon nanotube, it is possible to reduce the thermal conductivity of the carbon nanotube and form a thermoelectric conversion material having high electric conductivity. Consequently, there have been proposed thermoelectric conversion elements in which these carbon materials are used as thermoelectric conversion materials. Basically, however, carbon materials do not have high thermoelectric force, and therefore it is difficult to obtain sufficient performance from a thermoelectric conversion element formed by merely improving carbon materials and using the materials as thermoelectric conversion materials. Accordingly, a large number of thermoelectric conversion elements need to be modularized, and with such a structure, it is difficult to enlarge the elements in area.

RELATED ART DOCUMENTS

Patent Documents

Patent Document 1: Japanese Unexamined Patent Publication No. 2009-141079
Patent Document 2: Japanese Unexamined Patent Publication No. HEI 8(1996)-335722
Patent Document 3: Japanese Unexamined Patent Publication No. 2010-192780
Patent Document 4: Japanese Unexamined Patent Publication No. 2010-147379

SUMMARY OF THE INVENTION

Problems to be Solved by the Invention

During the operation of a general thermoelectric conversion element, heat: $Q_K$ is conducted from a high temperature effect part (or heat generation effect part) to a low temperature effect part (or endothermic effect part) because of the temperature difference: $\Delta T$ between the high temperature effect part (or heat generation effect part) and the low temperature effect part (or endothermic effect part). Accordingly, the thermoelectric conversion element is reduced in thermoelectric conversion efficiency as the $\Delta T$ decreases.

A conventional way to reduce the amount of heat: $Q_K$ to be conducted from the high temperature effect part (or heat generation effect part) to the low temperature effect part (or endothermic effect part) is to decrease the cross sectional area of a thermoelectric conversion material layer and increase the thickness of a thermoelectric conversion material layer. In order to achieve a large area with a thermoelectric conversion element whose thermoelectric conversion material layer has a decreased cross sectional area, however, a large number of thermoelectric conversion elements need to be modularized for use. However, the size of a thermoelectric conversion module obtained by such modularization is approximately 5 cm×5 cm, being incapable of providing a large area.

In addition, a conventional thermoelectric conversion element has a structure in which a high temperature part and a low temperature part having almost the same area are stacked one on top the other. In the thermoelectric conversion element having such a structure, an electrode on the high temperature side and an electrode on the low temperature side face each other and have a short distance therebetween, and thus the thermal conduction from the electrode on the high temperature side to the electrode on the low temperature side is greater. With such a structure, therefore, it is difficult to produce a thermoelectric conversion element having high thermoelectric conversion efficiency. Where the temperature difference is no more than 10° C. in a space at normal temperature, the thermal energy conducted from the electrode on the high temperature side to the electrode on the low temperature side is stored in the electrode on the low temperature, and soon the high temperature side and the low temperature side will no longer have a temperature difference. At present, therefore, it is impossible to perform power generation by thermoelectric conversion using the temperature difference in a space at normal temperature.

Since thermoelectric conversion elements need to satisfy three sorts of properties: high thermoelectric force, high electric conductivity and low thermal conductivity at the same time, conventional thermoelectric conversion elements have been developed by imparting the three sorts of properties to their materials. However, materials satisfying the three sorts of properties at the same time are quite limited, and therefore it is difficult to develop a thermoelectric conversion element having excellent properties by imparting all the three sorts of properties to its materials.

In view of the above-described circumstances, the present invention has been made to achieve a structure of a thermoelectric conversion element capable of satisfying high electric conductivity and low thermal conductivity at the same time by forming a charge transport layer in the element. The present invention is to provide a thermoelectric conversion element having much higher thermoelectric conversion efficiency than conventional thermoelectric conversion elements. Moreover, the present invention is to provide a thermoelectric conversion element and a thermoelectric conversion power generation device which can be enlarged in area and which can generate power in a space at normal temperature.

Means for Solving the Problems

The present invention provides a thermoelectric conversion element comprising a thermoelectric conversion section and electrodes, wherein the thermoelectric conversion section includes at least: a thermoelectric conversion material section or a thermoelectric conversion material layer which is formed of a thermoelectric conversion material; and a charge transport section or a charge transport layer which is formed of a charge transport material having at least both semiconducting electric conduction properties and metallic electric conduction properties.

The present invention also provides a thermoelectric conversion power generation device comprising at least a thermoelectric conversion power generation element and a Peltier element which are combined with each other, wherein the Peltier element absorbs heat of a low temperature effect part of the thermoelectric conversion power generation element and releases heat to a high temperature effect part of the thermoelectric conversion power generation element or to an object serving as a heat reservoir in contact with the high temperature effect part, and the thermoelectric conversion power generation element generates electric power.

Effects of the Invention

The present invention has achieved a structure of a thermoelectric conversion element capable of satisfying high electric conductivity and low thermal conductivity at the same time by forming a charge transport section or a charge transport layer in the element. Accordingly, an effect of the present invention is that the thermoelectric conversion materials that are used for the thermoelectric conversion element of the present invention only need to have high thermoelectric force. In addition, the present invention provides a thermoelectric conversion element having much higher thermoelectric conversion efficiency than conventional thermoelectric conversion elements. Using the thermoelectric conversion element of the present invention, it is possible to provide a thermoelectric conversion element and a thermoelectric conversion power generation device which can be enlarged in area and which can generate power in a space at normal temperature.

MODE FOR CARRYING OUT THE INVENTION

Figure 1:
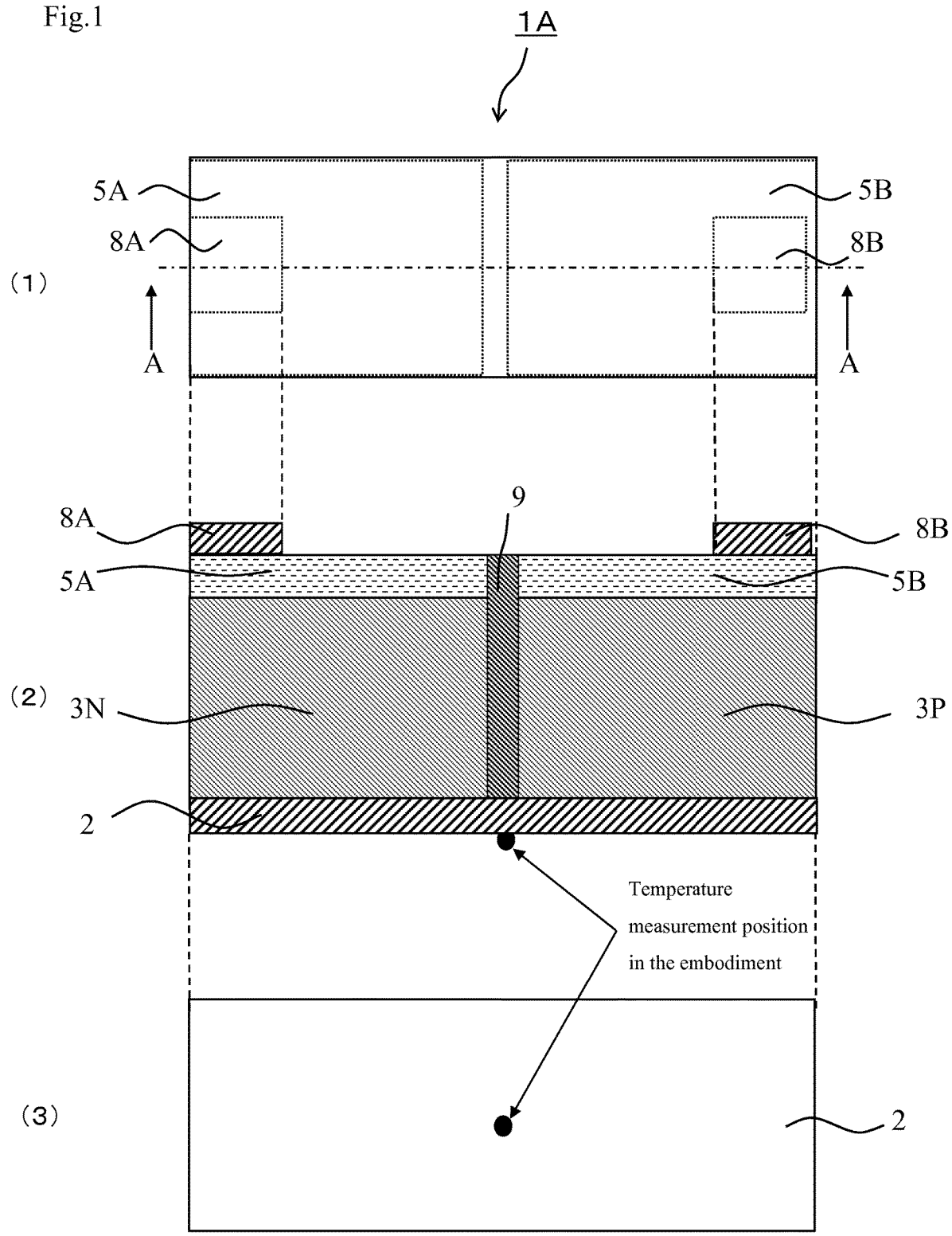
FIG. 1 is a top view, a sectional view and a bottom view of a thermoelectric conversion element according to Embodiment 1 of the present invention.

In general, a thermoelectric conversion element has a structure having electrodes arranged on and beneath a thermoelectric conversion material, and one of the electrodes absorbs heat and the other electrode generates heat when a direct voltage is applied between the electrodes and a current flows through the thermoelectric conversion material. For example, the upper electrode absorbs heat and in turn the lower electrode generates heat. The heat absorption and the heat generation are reversed in the case of a current in an opposite direction. Throughout the present specification, the former is referred to as an endothermic effect part, and the latter is referred to as a heat generation effect part, according to their effects. Used as an electric power generating element, for example, the thermoelectric conversion element converts thermal energy into electric energy to generate electric power using the temperature difference between the electrodes with the upper electrode at a lower temperature and the lower electrode at a higher temperature, for example. According to their effects, the former is also referred to as a low temperature effect part and the latter is also referred to as a high temperature effect part.

The thermoelectric conversion element of the present invention comprises a thermoelectric conversion section and electrodes, the thermoelectric conversion section having at least: a thermoelectric conversion material section or a thermoelectric conversion material layer that is formed of a thermoelectric conversion material; and a charge transport section or a charge transport layer that is formed of a charge transport material having at least both semiconducting electric conduction properties and metallic electric conduction properties.

The thermoelectric conversion element of the present invention is characterized in that it has a charge transport section or a charge transport layer. Since thermoelectric conversion elements need to satisfy three sorts of properties: high thermoelectric force, high electric conductivity and low thermal conductivity at the same time, conventional thermoelectric conversion elements have been developed by imparting the three sorts of properties to their materials.

However, materials satisfying the three sorts of properties at the same time are quite limited, and therefore it is difficult to develop a thermoelectric conversion element having excellent properties by imparting all the three sorts of properties to its materials. The present invention has achieved a structure of a thermoelectric conversion element capable of satisfying high electric conductivity and low thermal conductivity at the same time by forming a charge transport section or a charge transport layer in the element, and can provide a thermoelectric conversion element having much higher thermoelectric conversion efficiency than conventional thermoelectric conversion elements. Moreover, the present invention provides a thermoelectric conversion element and a thermoelectric conversion power generation device which can be enlarged in area and which can generate power in a space at normal temperature. At the same time, an effect of the present invention is that the thermoelectric conversion materials that are used for the thermoelectric conversion element of the present invention only need to have high thermoelectric force.

The thermoelectric conversion material to be used for the thermoelectric conversion element of the present invention is not particularly limited, and any well-known thermoelectric conversion materials may be used. In particular, the thermoelectric conversion element of the present invention does not require the thermoelectric conversion material to have both high electric conductivity and low thermal conductivity; the thermoelectric conversion material only needs to have high thermoelectric force. As examples of the thermoelectric conversion material to be used for the thermoelectric conversion element of the present invention, therefore, commonly-known thermoelectric conversion materials may be mentioned such as Bi—Te materials, Bi—Se materials, Sb—Te materials, Pb—Te materials, Ge—Te materials, Bi—Sb materials, Zn—Sb materials, Co—Sb materials, Ag—Sb—Ge—Te materials, Si—Ge materials, Fe—Si materials, Mg—Si materials, Mn—Si materials, Fe—O materials, Zn—O materials, Cu—O materials, Al—O materials, Co—O materials, Ti—O materials, Pb—O materials, Na—Co—O materials, Ti—Sr—O materials and Bi—Sr—Co—O materials.

The thermoelectric conversion material layer, which is formed of such thermoelectric conversion materials, may be formed of a platy thermoelectric conversion material cut out of a sinter prepared by melting a predetermined raw material or may be formed by a well-known method such as vapor deposition, sputtering and CVD methods. Alternatively, the thermoelectric conversion material layer may be formed by preparing a paste of a thermoelectric conversion material, applying and printing the paste by a printing method, and heating the same. The thickness of the thermoelectric conversion material layer is not particularly limited and may be approximately 0.1 to 10 mm.

The conductive material to be used for the charge transport section or the charge transport layer, which is a feature of the present invention, needs to be a charge transport material having at least both semiconducting electric conduction properties and metallic electric conduction properties or a charge transport material having semiconducting electric conduction properties. In general, the thermoelectric conversion material is a semiconductor and therefore has a band gap. That is, in the semiconductor, the conduction band is positioned energetically higher than the valence band to some extent. If the conductive material does not have a band gap and the conduction band is on the valence band as in the case of a metal, energy will be released as carriers in the conduction band of the thermoelectric conversion material transfer to the conduction band of the conductive material, and thus heat will be generated. If such heat generation is too much, the thermoelectric conversion element of the present invention will not be able to sufficiently produce the effect of the present invention. It is therefore necessary that the charge transport material for forming the charge transport section or the charge transport layer of the present invention have a certain degree of bandgap, and it is essential that energy be hardly released or absorbed as carriers in the conduction band of the thermoelectric conversion material transfer to the conduction band of the charge transport material.

In the thermoelectric conversion element of the present invention, the charge transport material may be selected from the group consisting of graphite, crystalline graphite and graphene.

Graphite and crystalline graphite have semiconducting properties between layers and exhibit metallic conductivity within a layer plane. Contact of graphite with the thermoelectric conversion material does not produce such a heat generation effect as produced by the contact of a metal with the thermoelectric conversion material. It is therefore expected that the energy level of the conduction band made of $\Pi^*$ orbitals of the graphite as the whole graphite is close to the energy level of the conduction band of the thermoelectric conversion materials such as a Bi—Te material, and therefore energy is hardly released with carrier transfer. Accordingly, the thermoelectric conversion material layer can be used as a laminate with the graphite layer. In addition, graphite has anisotropy with respect to conductivity. A sheet produced from natural graphite has an electronic conductivity in a plane direction of approximately 2000 to 7000 (S/cm) and an electric conductivity in a thickness direction of approximately 1 (S/cm). A graphite sheet obtained by graphitization of a sheet of a polymer such as polyimide has an electric conductivity in a plane direction of approximately 10000 to 25000 (S/cm) and an electric conductivity in a thickness direction of approximately 5 (S/cm). The thermoelectric conversion material has an electric conductivity of approximately 500 to 900 (S/cm), and either of the graphite sheets can be used as an effective charge transport layer or anisotropic conductive material layer by using the high electric conductivity in a plane direction of the graphite.

The crystalline graphite and the graphene are synthesized at a temperature in the range from 1000° C. to 1500° C. by a vapor phase method using acetylene as a raw material. In general, the synthesis is carried out in the presence of a metal catalyst such as Ni and Co. In the present invention, however, the decomposition and the synthesis are carried out in a vapor phase without the use of a metal catalyst. Preferably, a layer of a mixture of crystalline graphite and graphene is formed to be used for the thermoelectric conversion element.

The thermoelectric conversion element of the present invention may be a thermoelectric conversion element wherein the charge transport layer is an anisotropic conductive material layer having anisotropy with respect to conductivity, and the anisotropic conductive material layer has a larger electric conductivity in a plane direction than an electric conductivity in a thickness direction, and an electrode is provided on a part of the anisotropic conductive material layer.

The anisotropic conductive material layer of the present invention has a larger electric conductivity in a plane direction than an electric conductivity in a thickness direction. By using the anisotropy with respect to conductivity of the anisotropic conductive material layer, the electrode, which is disposed in contact with the anisotropic conductive material or in the vicinity of the anisotropic conductive material, can be disposed over a part within the layer plane of the anisotropic conductive material. Thus, one of the electrodes functioning as the high temperature effect part (heat generation effect part) of the thermoelectric conversion element can be configurationally separated from the other electrode functioning as the low temperature effect part (endothermic effect part) with some distance. The configuration allows reduction of the amount of heat: $Q_K$ conducted between the high temperature effect part and the low temperature effect part in the equation (1), and improvement of the thermoelectric conversion efficiency. The configuration also allows achievement of a thermoelectric conversion element having a larger area by itself without a conventional module structure.

The thermoelectric conversion element of the present invention may be a thermoelectric conversion element comprising the thermoelectric conversion section and the electrodes, wherein the thermoelectric conversion section includes at least: the thermoelectric conversion material section or the thermoelectric conversion material layer which is formed of the thermoelectric conversion material; and the anisotropic conductive material layer which is formed of a charge transport material having the semiconducting electric conduction properties selected from the group consisting of an electron transport material and a hole transport material.

When a charge transport material is used for the charge transport section or the charge transport layer, it is preferable that the charge transport material has an electric conductivity of 2000 (S/cm) or greater since the thermoelectric conversion material has an electric conductivity of approximately 500 to 900 (S/cm). However, it is difficult to obtain an electric conductivity of 2000 (S/cm) or greater in the charge transport material having only semiconducting electric conduction properties, and therefore such a charge transport material cannot be suitably used for the charge transport section or the charge transport layer of the present invention. On the other hand, the charge transport material can be effectively used for the anisotropic conductive material layer as long as the charge transport material has an electric conductivity of 100 to 500 (S/cm). In the present invention, therefore, the charge transport material having semiconducting electric conduction properties is used for the anisotropic conductive material layer. In particular, an electron transport material is preferably used for a charge transport layer included in an n-type thermoelectric conversion section, and a hole transport material is preferably used for a charge transport layer included in a p-type thermoelectric conversion section.

Preferable examples of the electron transport material include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives and silole derivatives.

Preferable examples of the hole transport material include porphyrin derivatives, aromatic tertiary amine compounds, styryl amine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide and zinc selenide.

Graphite is common as the anisotropic conductive material layer, and a layer formed of graphite is used as the anisotropic conductive material layer in the thermoelectric conversion element of the present invention. As an anisotropic conductive material layer other than graphite, an anisotropic conductive material layer obtained by forming a coat layer of a high conductivity material (charge transport layer) on a surface of a low conductivity material layer (backing layer) may be used. The anisotropic conductive material layer obtained by forming a coat layer of a high conductivity material on a surface of a low conductivity material layer also exhibits high electric conductivity in a plane direction and low electric conductivity in a thickness direction as in the case of graphite.

The low conductivity material layer can be formed by including a charge transport material having semiconducting electric conduction properties in a binder resin such as polycarbonate resin, polyarylate resin and polystyrene resin. It is preferable to include an electron transport material as the charge transport material in the binder resin to form a first backing layer in a first anisotropic conductive material layer to be included in an n-type thermoelectric conversion section, and it is preferable to include a hole transport material as the charge transport material in the binder resin to form a second backing layer in a second anisotropic conductive material layer to be included in a p-type thermoelectric conversion section. The electric conductivity can be controlled by varying the content and the material of the charge transport material in the binder resin. Preferably, the low conductivity material layer has an electric conductivity of approximately 1 to 10 S/cm. For forming the layer, common layer formation methods such as a vapor deposition method and a coating method may be used. In the present invention, the low conductivity material layer is formed by dissolving or dispersing the binder resin and the charge transport material in an appropriate organic solvent to prepare a coating solution for low conductivity material layer formation, applying the coating solution onto the thermoelectric conversion material layer, and subsequently drying the coating solution to remove the organic solvent. The thickness of the low conductivity material layer can be controlled by adjusting the viscosity of the coating solution for low conductivity material layer formation. The thickness of the low conductivity material layer is not particularly limited and is preferably in the range of approximately 0.1 µm to 10 µm.

Subsequently, a coat layer of a high conductivity material (charge transport layer) is formed on a surface of the low conductivity material layer. As the high conductivity material, a charge transport material having semiconducting electric conduction properties can be used. It is preferable to use an electron transport material to form a first charge transport layer in the first anisotropic conductive material layer to be included in the n-type thermoelectric conversion section, and it is preferable to use a hole transport material to form a second charge transport layer in a second anisotropic conductive material layer to be included in the p-type thermoelectric conversion section. For forming the coat layer of a charge transport material, common layer formation methods such as a vapor deposition method, a laser ablation deposition technique and a coating method may be used. The thickness of the charge transport layer is not particularly limited and is preferably in the range of approximately 10 to 1000 nm. The coat layer of the charge transport material has an electric conductivity of preferably 100 S/cm or greater, and more preferably 300 S/cm or greater within the layer plane.

The thermoelectric conversion element of the present invention may be a thermoelectric conversion element comprising the thermoelectric conversion section including a laminate structure of at least the thermoelectric conversion material layer and the anisotropic conductive material layer, wherein the anisotropic conductive material layer of the thermoelectric conversion section comprises extended portions protruded from the laminate structure, and the electrodes are provided on the extended portions.

The thermoelectric conversion element of the present invention may be a thermoelectric conversion element comprising: an n-type thermoelectric conversion section and a p-type thermoelectric conversion section, each of which includes a laminate structure of at least a thermoelectric conversion material layer and the anisotropic conductive material layer; a first electrode arranged beneath the n-type and the p-type thermoelectric conversion sections with respect to a laminate direction, wherein the first electrode extends over the n-type and the p-type thermoelectric conversion sections; and second and third electrodes arranged on the n-type and the p-type thermoelectric conversion sections, respectively, wherein the anisotropic conductive material layer of the n-type thermoelectric conversion section comprises an extended portion protruded from the laminate structure and the second electrode is provided on a part of the extended portion of the n-type thermoelectric conversion section, and the anisotropic conductive material layer of the p-type thermoelectric conversion section comprises an extended portion protruded from the laminate structure and the third electrode is provided on a part of the extended portion of the p-type thermoelectric conversion section.

The anisotropic conductive material layer on the thermoelectric conversion material layer of each thermoelectric conversion section is obtained by laminating an anisotropic electric conductivity material having a larger area than the area of contact with the thermoelectric conversion material layer using the anisotropy with respect to conductivity of the anisotropic conductive material layer. Thus, it is possible to form the thermoelectric conversion section having the extended portion protruded from the laminate structure. By disposing one of the electrodes on the extended portion, it is possible to configurationally separate the high temperature effect part from the low temperature effect part in the thermoelectric conversion element. Thus, the configuration allows further reduction of the amount of heat: $Q_K$ conducted between the high temperature effect part (heat generation effect part) and the low temperature effect part (endothermic effect part), and improvement of the thermoelectric conversion efficiency. The configuration also allows achievement of a thermoelectric conversion element having a larger area by itself without a conventional module structure.

The thermoelectric conversion element of the present invention may be a thermoelectric conversion element comprising the thermoelectric conversion section including at least a lower thermoelectric conversion material layer, a lower charge transport layer, an upper charge transport layer and an upper thermoelectric conversion material layer, wherein the lower charge transport layer and the upper charge transport layer of the thermoelectric conversion section are spaced by a distance and continuous with each other along a side surface of the thermoelectric conversion section and form one charge transport layer.

The thermoelectric conversion element of the present invention may be a thermoelectric conversion element comprising: an n-type thermoelectric conversion section and a p-type thermoelectric conversion section, each of which includes a laminate structure of at least the thermoelectric conversion material layer and the anisotropic conductive material layer; a first electrode arranged beneath the n-type and p-type thermoelectric conversion sections with respect to a laminate direction, wherein the first electrode extends over the n-type and the p-type thermoelectric conversion sections; and the second and the third electrodes arranged on the n-type and the p-type thermoelectric conversion sections, respectively, wherein each thermoelectric conversion section comprises at least a lower thermoelectric conversion material layer, a lower charge transport layer, an upper charge transport layer and an upper thermoelectric conversion material layer, and the lower charge transport layer and the upper charge transport layer of the thermoelectric conversion section are spaced by a distance and continuous with each other along a side surface of the thermoelectric conversion section and form one charge transport layer.

In the thermoelectric conversion element having the above-described structure, the lower charge transport layer and the upper charge transport layer are spaced by a distance and continuous with each other along a side surface of the thermoelectric conversion section and form an air layer in a cavity therebetween, and the thermal conduction part and the electric conduction part of the thermoelectric conversion element are configurationally separated using low thermal conductivity of the air layer and high electric conductivity of the charge transport layer. The configuration allows reduction of the amount of heat: $Q_K$ conducted between the high temperature effect part and the low temperature effect part, and ensures high electric conductivity. Thus, high thermoelectric conversion efficiency can be achieved. The configuration also allows achievement of a thermoelectric conversion element having a larger area by itself without a conventional module structure.

The thermoelectric conversion element of the present invention may be a thermoelectric conversion element comprising the thermoelectric conversion section and the electrodes, wherein the thermoelectric conversion section includes at least the thermoelectric conversion material section or the thermoelectric conversion material layer and the charge transport section or the charge transport layer, and wherein the thermoelectric conversion section further includes a heat insulating layer.

For the heat insulating layer, a heat insulation material having a thermal conductivity of preferably 0.5 W/(m·K) or lower and preferably 0.3 W/(m K) or lower is used. In addition, it is preferable that the heat insulation material has heat resistance with a burning point of 550° C. or higher due to constraints in the production. Specific examples of the heat insulation material include silica, porous silica, glass, glass wool, rock wool, silicious marl, phenol resin, melamine resin, silicon resin and inorganic particles in the form of hollow particles. Alternatively, a commercially available heat insulating material board obtained by binding glass wool or rock wool with phenol resin or melamine resin may be used as is as the heat insulating layer.

The thermoelectric conversion element of the present invention may be a thermoelectric conversion element comprising the thermoelectric conversion section includes a laminate structure, in which a lower thermoelectric conversion material layer, a lower charge transport layer, a heat insulating layer, an upper charge transport layer and an upper thermoelectric conversion material layer are laminated in sequence, wherein the lower charge transport layer and the upper charge transport layer of the thermoelectric conversion section are continuous with each other along a side surface of the heat insulating layer and form one charge transport layer.

In the thermoelectric conversion element having the above-described structure, the thermal conduction part and the electric conduction part of the thermoelectric conversion element can be configurationally separated from each other by using low thermal conductivity of the heat insulating material layer and high electric conductivity of the charge transport layer. The configuration allows reduction of the amount of heat: $Q_K$ conducted between the high temperature effect part and the low temperature effect part, and ensures high electric conductivity. Thus, high thermoelectric conversion efficiency can be achieved. The configuration also allows achievement of a thermoelectric conversion element having a larger area by itself without a conventional module structure. In this element structure, preferably, a graphite sheet is used as the charge transport material.

The thermoelectric conversion element of the present invention may be a thermoelectric conversion element comprising the thermoelectric conversion section including a laminate structure, in which a lower thermoelectric conversion material layer, a heat insulating layer and an upper thermoelectric conversion material layer are laminated in sequence, wherein the heat insulating layer of the thermoelectric conversion section comprises a through hole, and the through hole is provided with a charge transport material so that the heat insulating layer functions as a heat insulating layer and as a charge transport section.

The thermoelectric conversion element including the laminate structure of a heat insulating material layer and thermoelectric conversion material layers is produced through a step of forming a through hole in the above-mentioned heat insulating material board and filling the through hole with a thermoelectric conversion material. High electric conductivity of the thermoelectric conversion element can be ensured by filling the through hole with a thermoelectric conversion material having high electric conductivity. The through hole may be formed mechanically with a drill or the like, or formed by laser irradiation. As the charge transport material, graphite, crystalline graphite, graphene, electron transport materials and hole transport materials may be used.

In the thermoelectric conversion element having the above-described structure, the thermal conduction part and the electric conduction part of the thermoelectric conversion element can be configurationally separated from each other by using low thermal conductivity of the heat insulating material layer and high electric conductivity of the charge transport section or the charge transport layer. The configuration allows reduction of the amount of heat: $Q_K$ conducted between the high temperature effect part and the low temperature effect part, and ensures high electric conductivity. Thus, high thermoelectric conversion efficiency can be achieved.

The thermoelectric conversion element of the present invention may be a thermoelectric conversion element having a thermoelectric conversion section including the laminate structure, in which a lower thermoelectric conversion material layer, a heat insulating layer and an upper thermoelectric conversion material layer are laminated in sequence, wherein the heat insulating layer of the thermoelectric conversion section is made of a porous insulating material and pores of the porous material are provided with a charge transport material so that the heat insulating layer functions as a heat insulating layer and as a charge transport section.

The porous material is formed by mixing resin particles and thermoelectric conversion material powder with heat insulating material powder prepared by pulverizing the above-mentioned heat insulating material board or glass with a pulverizer such as a ball mill or with heat insulating material fine particles such as porous silica particles, silicious marl and inorganic particles in the form of hollow particles; adding an organic solvent and a binder thereto; and then kneading the mixture, giving a paste. The resulting paste is applied and printed on a releasable board such as a stainless plate, and heated to burn out the resin particles in the paste, thereby giving a porous heat insulating layer. The heat insulating layer is peeled off the releasable board to give a heat insulating material board. As the resin particles, polystyrene particles, polymethyl methacrylate particles and polyethylene particles may be used, of which polymethyl methacrylate particles are preferable as they can be completely burnt out at 350° C. As the inorganic particles in the form of hollow particles, hollow silica particles, hollow alumina particles and hollow titania particles are known. As the charge transport material, graphite, crystalline graphite, graphene, electron transport materials and hole transport materials may be used.

High electric conductivity of the thermoelectric conversion element can be ensured by filling the pores (porous material) with a charge transport material having high electric conductivity. In the thermoelectric conversion element having the above-described structure, the thermal conduction part and the electric conduction part of the thermoelectric conversion element can be configurationally separated from each other by using low thermal conductivity of the heat insulating material layer and high electric conductivity of the charge transport section or the charge transport layer. The configuration allows reduction of the amount of heat: $Q_K$ conducted between the high temperature effect part and the low temperature effect part, and ensures high electric conductivity. Thus, high thermoelectric conversion efficiency can be achieved.

The present invention is also directed to a thermoelectric conversion power generation device comprising at least a thermoelectric conversion power generation element and a Peltier element which are combined with each other, wherein the Peltier element absorbs heat of a low temperature effect part of the thermoelectric conversion power generation element and releases heat to a high temperature effect part of the thermoelectric conversion power generation element or to an object serving as a heat reservoir in contact with the high temperature effect part, and the thermoelectric conversion power generation element generates electric power.

The present invention may be also directed to the thermoelectric conversion power generation device, wherein the Peltier element is the thermoelectric conversion element comprising the thermoelectric conversion section including a laminate structure of at least the thermoelectric conversion material layer and the anisotropic conductive material layer, and the anisotropic conductive material layer comprises the extended portion protruded from the laminate structure and wherein the thermoelectric conversion element is the thermoelectric conversion element comprising the thermoelectric conversion section and the electrodes, and the thermoelectric conversion section includes at least a thermoelectric conversion material section or the thermoelectric conversion material layer and the charge transport section or the charge transport layer.

Here, the low temperature effect part refers to an electrode at a low temperature side of the thermoelectric conversion power generation element or a thermoelectric conversion section near the electrode at the low temperature side. The high temperature effect part refers to an electrode at a high temperature side of the thermoelectric conversion power generation element or a thermoelectric conversion section near the electrode at the high temperature side. In particular, the action of the above-described thermoelectric conversion power generation device can be readily achieved when the Peltier element is a thermoelectric conversion element of the present invention comprising the laminate structure of at least a thermoelectric conversion material layer and an anisotropic conductive material layer, wherein the anisotropic conductive material layer has extended portions protruded from the laminate structure, and the electrodes are provided on the extended portions.

The thermoelectric conversion element to be included in the thermoelectric conversion power generation device has achieved an element structure capable of satisfying high electric conductivity and low thermal conductivity at the same time by forming a charge transport section or a charge transport layer in the element. Furthermore, use of a heat insulating layer provides lower thermal conductivity. It is therefore possible to provide a thermoelectric conversion element having much higher thermoelectric conversion efficiency than conventional thermoelectric conversion elements, and high thermoelectric power generation efficiency can be achieved.

Since the thermoelectric conversion power generation device of the present invention includes the Peltier element of the present invention, it is possible to readily absorb heat from the low temperature effect part of the thermoelectric conversion power generation element and release heat to the high temperature effect part of the thermoelectric conversion power generation element, and consequently it is possible to ensure a stable temperature difference between the high temperature effect part and the low temperature effect part of the thermoelectric conversion power generation element. In the conventional art, it is difficult to perform power generation by thermoelectric conversion using the temperature difference in a space at normal temperature where the temperature difference is no more than 10° C., since the heat: $Q_K$ conducted from the high temperature effect part to the low temperature effect part is stored in the low temperature effect part, and soon the high temperature effect part and the low temperature effect part will no longer have a temperature difference. In the thermoelectric conversion power generation device of the present invention, in contrast, it is possible to return the heat: $Q_K$ conducted to the low temperature effect part back to the high temperature effect part by using the Peltier element of the present invention, and thus the temperature difference can be unfailingly used without any loss for the power generation even if the temperature difference is small as being in a space at normal temperature.

Conventional thermoelectric conversion elements cannot be enlarged in area considering the amount of heat: $Q_K$ conducted from the high temperature effect part to the low temperature effect part in the equation (1). In the thermoelectric conversion power generation device having the configuration of the present invention, in contrast, the thermoelectric conversion power generation element can be enlarged in area since the temperature difference between the high temperature effect part and the low temperature effect part can be reliably maintained. The enlargement in area allows thermoelectric electric power generation providing high power output even in a space at normal temperature where the temperature difference is no more than 10° C.

Next, thermoelectric conversion elements according to embodiments of the present invention will be described with reference to the drawings.

Embodiment 1

FIG. 1 is a top view, a sectional view and a bottom view of a thermoelectric conversion element 1A according to Embodiment 1 of the present invention. In FIG. 1, (1) is the top view, (2) is the sectional view taken along the line A-A in the top view, and (3) is the bottom view.

As illustrated in FIG. 1, the thermoelectric conversion element 1A according to Embodiment 1 includes a conductive substrate 2 (first electrode), electrodes 8A and 8B (second and third electrodes) disposed substantially in parallel with the conductive substrate 2, an n-type thermoelectric conversion section 3N disposed between the conductive substrate 2 and the electrode 8A, and a p-type thermoelectric conversion section 3P disposed between the conductive substrate 2 and the electrode 8B. More particularly, the thermoelectric conversion element 1A of the present embodiment is composed of the conductive substrate 2 (first electrode), the n-type and p-type thermoelectric conversion sections 3N, 3P formed on top of the conductive substrate 2, and the second electrode 8A formed on top of the n-type thermoelectric conversion section 3N and the third electrode 8B formed on top of the p-type thermoelectric conversion section 3P, wherein as the n-type thermoelectric conversion section 1N, an n-type thermoelectric conversion material layer 3N and a first anisotropic conductive material layer 5A are laminated in this order to the conductive substrate 2, and as the p-type thermoelectric conversion section 3P, a p-type thermoelectric conversion material layer 3P and a second anisotropic conductive material layer 5B are laminated in this order to the conductive substrate 2. The n-type thermoelectric conversion section 6N and the p-type thermoelectric conversion section 6P are separated from each other with an insulating layer 9 (insulator) therebetween.

In the thermoelectric conversion element 1A, the n-type and p-type thermoelectric conversion sections 3P and 3N are connected in series via the conductive substrate 2, and connected with the second electrode 8A and the third electrode 8B, respectively, at opposite ends thereof. Thus, the side of the second and third electrodes 8A and 8B generates heat, and the side of the conductive substrate 2 absorbs heat when a direct voltage is applied between the second electrode 8A and the third electrode 8B, and a current flows in a direction from the second electrode 8A to the third electrode 8B through the conductive substrate 2 (the heat generation side and the heat absorption side are reversed in the case of a current in an opposite direction).

Throughout the present specification, the former is referred to as a heat generation effect part, and the latter is referred to as an endothermic effect part, according to their effects. Used as an electric power generating element, the thermoelectric conversion element 1A converts thermal energy into electric energy to generate electric power using the temperature difference between the side of the second and third electrodes 8A and 8B, which is at a lower temperature, and the side of the conductive substrate 2, which is at a higher temperature, for example. According to their effects, the former is also referred to as a high temperature effect part and the latter is also referred to as a low temperature effect part.

The conductive substrate (first electrode) 2, and the second and third electrodes 8A and 8B are each formed of an aluminum board. They may be formed of any material having sufficient electric conductivity to function as electrodes and may be formed of copper, silver or platinum, for example, other than aluminum. Furthermore, the conductive substrate 2, and the second and third electrodes 8A and 8B are each formed of a material having excellent thermal conductivity since they function as the endothermic effect part or the heat generation effect part in the thermoelectric conversion element. When a copper board is used for the conductive substrate 2, and the second and third electrodes 8A and 8B, the conductive substrate 2 is formed so as to have a thickness of approximately 0.2 to 1.0 mm, and the second and third electrodes 8A and 8B are formed so as to have a thickness of approximately 0.1 to 0.5 mm, for example.

The materials of the n-type thermoelectric conversion material layer 3N and the p-type thermoelectric conversion material layer 3P are not particularly limited as long as they are well-known thermoelectric conversion materials and are preferably Bi—Te materials in the case of 500 K or lower. The Bi—Te materials include, as the n-type semiconductor material, $Bi_2Te_3$ and $Bi_2Te_{3-x}Se_x$ obtained by adding Se to Bi and Te, and as the p-type semiconductor material, $Bi_2Te_3$ and $Bi_{2-x}Sb_xTe_3$ obtained by adding Sb to Bi and Te. Preferably, the n-type thermoelectric conversion material layer 3N and the p-type thermoelectric conversion material layer 3P are formed of these materials. In the thermoelectric conversion element 1A of Embodiment 1, Bi—Te materials are used. Specifically, the n-type thermoelectric conversion material layer 3N is formed of a $Bi_2Te_{3-x}Se_x$ material, and the p-type thermoelectric conversion material layer 3P is formed of a $Bi_{2-x}Sb_xTe_3$ material. These thermoelectric conversion material layers may be formed of a platy thermoelectric conversion material cut out of a sinter or may be formed by a well-known method such as vapor deposition, sputtering and CVD methods. Alternatively, the thermoelectric conversion material layers may be formed by preparing a paste of a thermoelectric conversion material, printing the paste by screen printing or a doctor blade process, and heating the same.

In the present embodiment, the n-type thermoelectric conversion material layer 3N and the p-type thermoelectric conversion material layer 3P are each formed of a board cut out of a sinter of a Bi—Te material. For example, powder raw materials including Bi, Te and additives are mixed and melted, and subsequently the resulting base material is pulverized to give a powdered Bi—Te material. A Bi—Te material sinter is prepared from the resulting Bi—Te material by zone melting, and the sinter is cut out into a certain size to give a board as the n-type thermoelectric conversion material layer or the p-type thermoelectric conversion material layer. The Bi—Te material board is formed so as to have a layer thickness of 10 mm, for example.

As the anisotropic conductive material layers 5A and 5B, a graphite sheet or a sheet obtained by coating a low conductivity material with a high conductivity material is used.

First, the case where the anisotropic conductive material layers 5A and 5B are graphite sheets will be described. As the graphite sheets, a commercially available graphite sheet having a thickness of approximately 50 to 300 µm is used and bonded to the Bi—Te material board. The graphite sheet is bonded to the board as follows. That is, a layer of a Bi—Te material having the same composition as the board is formed on a mating surface of the graphite sheet by vapor deposition of the Bi—Te material, and subsequently the surface having the layer of the Bi—Te material of the graphite sheet is brought into close contact with the Bi—Te material board and subjected to thermal compression bonding.

The above-described processes is performed for the n-type Bi—Te material board and for the p-type Bi—Te material board to give the n-type thermoelectric conversion section 1N formed from the n-type Bi—Te material layer and the graphite layer, and the p-type thermoelectric conversion section 1P formed from the p-type Bi—Te material layer and the graphite layer, respectively.

Next, will be described the case where sheets each obtained by forming a coat layer of a high conductivity material on a surface of a low conductivity material layer are used as the first and second anisotropic conductive material layers 5A and 5B.

The low conductivity material layer is obtained by adding a conductive material to a binder resin so as to give an electric conductivity of 1 to 10 S/cm. As the conductive material, an electron transport material is used for the n-type thermoelectric conversion section 1N and a hole transport material is used for the p-type thermoelectric conversion section 1P. In the present embodiment, for example, a polycarbonate resin is used for the binder resin, a diphenoquinone compound (Formula 1) is used as the electron transport material, and a hydrazone compound (Formula 2) is used as the hole transport material for the charge transport materials to be included in the resin. The low conductivity material layer is formed by dissolving and dispersing these materials in a tetrahydrofuran solvent, and applying the solution onto the Bi—Te material board. The low conductivity material layer is formed so as to have a thickness of approximately 1 µm and an electric conductivity of approximately 5 S/cm.

Subsequently, a coat layer of a high conductivity material is formed on a surface of the low conductivity material layer formed. As the conductive material, an electron transport material is preferably used for the n-type thermoelectric conversion section 1N, and a hole transport material is preferably used for the p-type thermoelectric conversion section 1P. In the present embodiment, for example, Alq3 (aluminato-tris-8B-hydoroxyquinolate: Formula 3) is used as the electron transport material, and NPP (N,N-di(naphthalene-1-yl)-N,N-diphenyl-benzidene) is used as the hole transport material. The coat layer of the high conductivity material is formed by a vapor deposition method. The coat layer is formed so as to have a thickness of approximately 300 nm and an in-plane electric conductivity of 300 S/cm or higher.

[Formula 1]

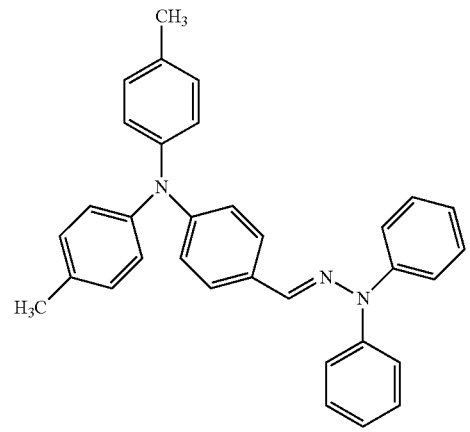

-continued

[Formula 2]

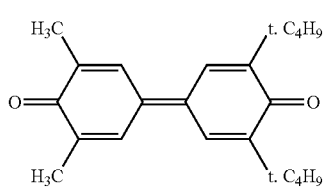

[Formula 3]

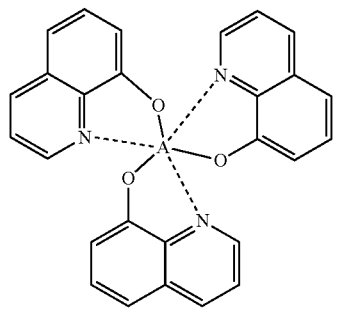

The above-described processes are performed for the n-type Bi—Te material board and for the p-type Bi—Te material board to give the n-type thermoelectric conversion section 1N including the n-type Bi—Te material layer 3N and the first anisotropic conductive material layer 5A, and the P-type thermoelectric conversion section 1P including the p-type Bi—Te material layer 3P and the second anisotropic conductive material layer 5B, respectively.

Al boards are used for the conductive substrate and the electrodes. Each Al board and the thermoelectric conversion material layer or the anisotropic conductive material layer are bonded by printing and heating a silver paste on an electrode formation region of each layer, and subsequently placing a solder on the silver paste and soldering the Al board. Alternatively, thermal compression bonding of the Al board to the thermoelectric conversion material layer, Al vapor deposition and an conductive adhesive may be employed. Here, the second electrode 8A is provided on a part of the first anisotropic conductive material layer 5A, and the third electrode 8B is provided on a part of the second anisotropic conductive material layer 5B.

In the present embodiment, a glass wool plate is used for the insulating layer 9. The insulating layer 9 may be formed of any well-known insulating material as appropriate in view of necessary insulating properties, considering that it is a layer for electrically insulating the n-type thermoelectric conversion section 1N from the p-type thermoelectric conversion section 1P. The glass wool plate is bonded to the Al board by applying an Al paste onto a mating surface of the glass wool plate, and bringing the mating surface into close contact with the Al board and heating the same.

The thermoelectric conversion element according to Embodiment 1 (FIG. 1) is produced by the above-described processes.

In Embodiment 1, the areas of the electrodes 8A and 8B can be held small, and a region where the electrodes 8A and 8B do not overlap the conductive substrate 2 in a plane arrangement viewed from above can be formed as illustrated in FIG. 1 by using the electric anisotropy with respect to conductivity of the anisotropic conductive material. Thus, the thermal conduction from the heat generation effect part (region of the electrodes 8A and 8B) to the endothermic effect part (region of the conductive substrate 2) will be configurationally inhibited. Accordingly, the thermoelectric conversion element 1A of the present embodiment can achieve high thermoelectric conversion efficiency.

Embodiment 2

Figure 2:
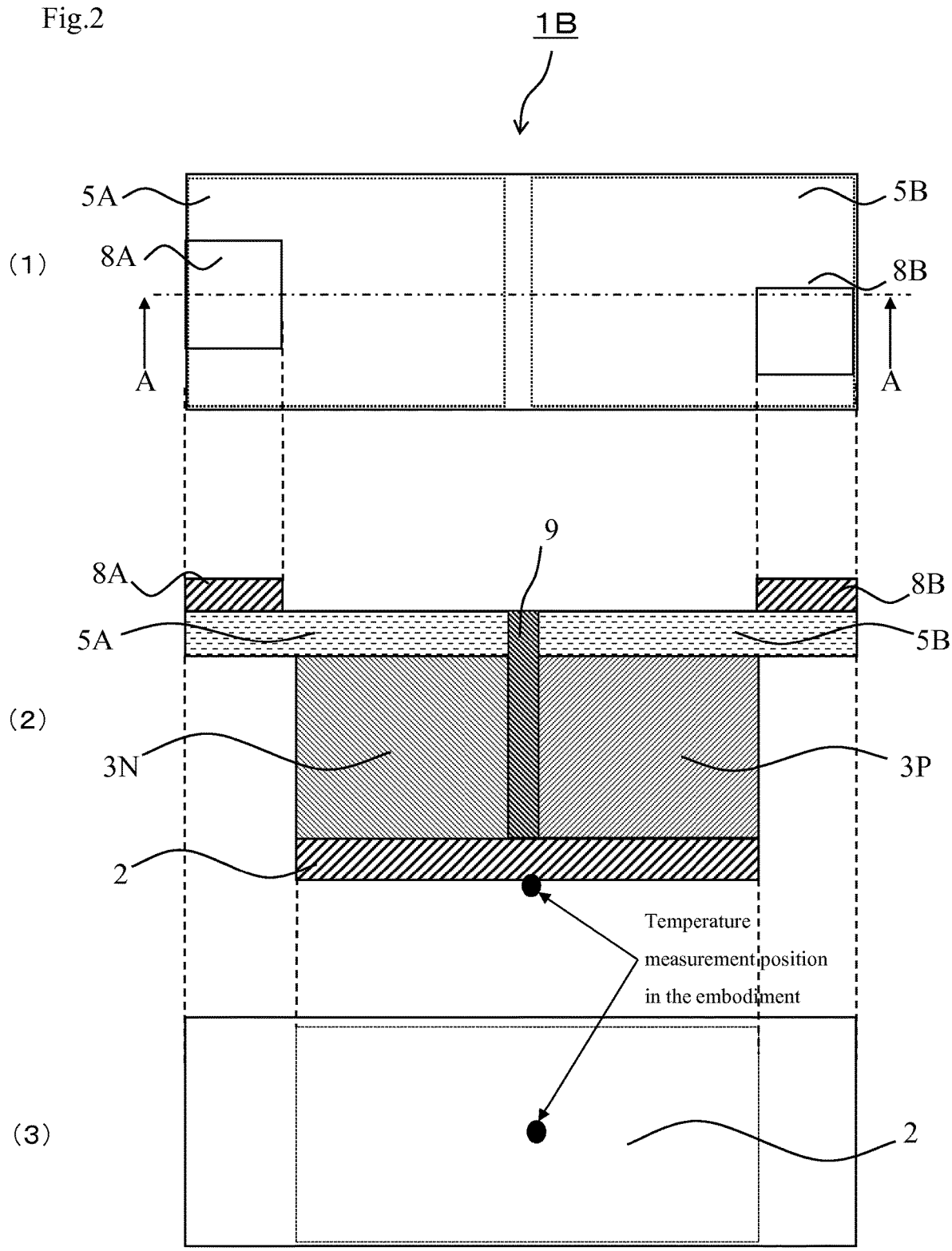
FIG. 2 is a top view, a sectional view and a bottom view of a thermoelectric conversion element according to Embodiment 2 of the present invention.

Next, a thermoelectric conversion element 1B according to Embodiment 2 will be described. FIG. 2 is a top view, a sectional view and a bottom view of the thermoelectric conversion element according to Embodiment 2 of the present invention. In FIG. 2, (1) is the top view, (2) is the sectional view taken along the line A-A in the top view, and (3) is the bottom view.

As illustrated in FIG. 2, the thermoelectric conversion element 1B shown as an example of the arrangement of electrodes has the same n-type thermoelectric conversion section 1N and the p-type thermoelectric conversion section 1P as in the thermoelectric conversion element 1A according to Embodiment 1, but the arrangement of the conductive substrate 2, and the electrode 8A and 8B is different. That is, the conductive substrate 2, and the electrodes 8A and 8B are arranged so that they do not overlap each other at all in a plane arrangement viewed from above.

In the present embodiment, for example, a graphite sheet which is longer than each thermoelectric conversion material layer and which has a shape with an extended portion protruded from the laminate structure is used as an anisotropic conductive material. The anisotropic conductive material layers 5A and 5B each having the extended portion are provided to the n-type thermoelectric conversion section 1N and the p-type thermoelectric conversion section 1P, respectively, and the electrodes 8A and 8B are disposed on top of the extended portions of the anisotropic conductive material layers.

Here, the extended portions will be described. As illustrated in FIG. 2 (2), the first anisotropic conductive material layer 5A has a first major surface on a side to be in contact with the n-type thermoelectric conversion material layer 3N and a second major surface on an opposite side. The n-type thermoelectric conversion material layer 3N is provided beneath a part of the first major surface, and the first major surface has a region where the n-type thermoelectric conversion material layer is not provided. The portion of the first anisotropic conductive material layer 5A having this region is referred to as the extended portion. In the thermoelectric conversion element 1B, the second electrode 8A is provided on the extended portion of the second major surface.

Likewise, as illustrated in FIG. 2 (2), the second anisotropic conductive material layer 5B has a third major surface on a side to be in contact with the p-type thermoelectric conversion material layer 3P and a forth major surface on an opposite side. The p-type thermoelectric conversion material layer 3P is provided beneath a part of the third major surface, and the third major surface has a region where the n-type thermoelectric conversion material layer is not provided. The portion of the second anisotropic conductive material layer 5B having this region is referred to as the extended portion. In the thermoelectric conversion element 1B, the third electrode 8B is provided on the extended portion of the forth major surface.

As described above, the anisotropic conductive material layers have properties of exhibiting high electric conductivity within the layer planes (ab plane) and low electric conductivity in a thickness direction (c axis), and it is therefore possible to form the second and third electrodes 8A and 8B on top of the extended portions of the first and second anisotropic conductive material layers 5A and 5B. As a result, the areas of the electrodes 8A and 8B can be held small, and the electrodes 8A and 8B, and the conductive substrate 2 can be formed so as not to overlap each other in the arrangement viewed from above. Thus, the thermal conduction from the heat generation effect part (region of the electrodes 8A and 8B) to the endothermic effect part (region of the conductive substrate 2) will be configurationally inhibited. Accordingly, the thermoelectric conversion element 1B of the present embodiment can achieve high thermoelectric conversion efficiency.

The effect of the thermoelectric conversion sections in the example illustrated in FIG. 2 are the same as that of the thermoelectric conversion element 1A of Embodiment 1, and the production method thereof is substantially the same.

Embodiment 3

Figure 3:
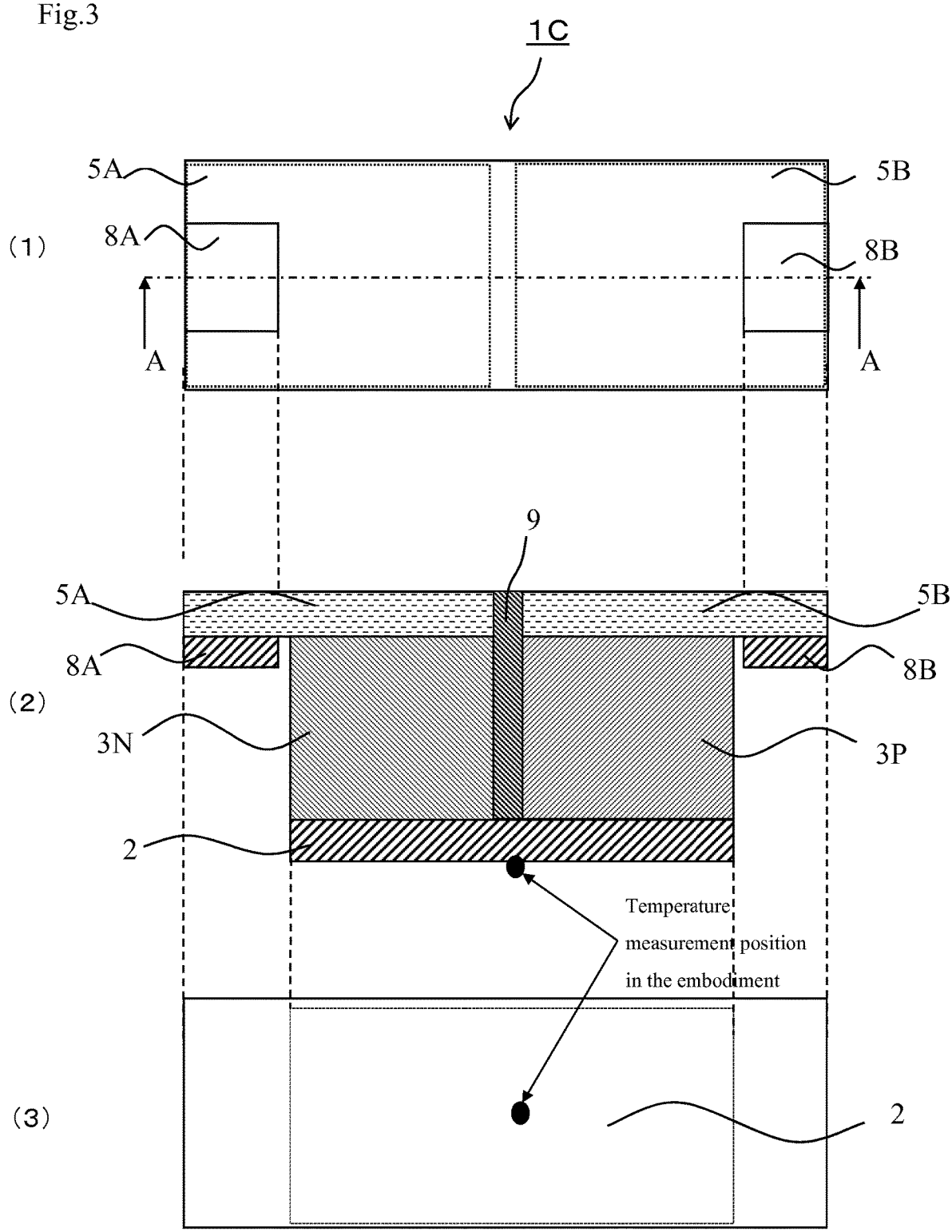
FIG. 3 is a top view, a sectional view and a bottom view of a thermoelectric conversion element according to Embodiment 3 of the present invention.

Next, a thermoelectric conversion element 1C according to Embodiment 3 will be described. FIG. 3 is a top view, a sectional view and a bottom view of the thermoelectric conversion element according to Embodiment 3 of the present invention. In FIG. 3, (1) is the top view, (2) is the sectional view taken along the line A-A in the top view, and (3) is the bottom view.

As illustrated in FIG. 3, the thermoelectric conversion element 1C has almost the same element structure as the thermoelectric conversion element 1B according to Embodiment 2 except that the electrodes 8A and 8B are disposed on different surfaces of the anisotropic conductive material layers, that is, the electrodes 8A and 8B are disposed beneath the extended portions of the anisotropic conductive material layers.

The extended portions are as described above. In the thermoelectric conversion element 1C, as illustrated in FIG. 3 (2), the second electrode 8A is provided beneath the extended portion of the first major surface on the side of the first anisotropic conductive material layer 5A in contact with the n-type thermoelectric conversion material layer 3N.

In the thermoelectric conversion element 1C, as illustrated in FIG. 3 (2), the third electrode 8B is provided beneath the extended portion of the third major surface on the side of the second anisotropic conductive material layer 5B in contact with the p-type thermoelectric conversion material layer 3P.

It is possible to achieve the element structure of the thermoelectric conversion element 1C when the in-plane electric conductivity of the anisotropic conductive material layers is one digit higher than the electric conductivity of the thermoelectric conversion material layers, although it depends also on the areas of the major surfaces of the thermoelectric conversion material layers. When a Bi—Te thermoelectric conversion material, which has an electric conductivity of approximately 1000 (S/cm), is used as a thermoelectric conversion material, the element structure of the thermoelectric conversion element 1C may be employed as long as the electric conductivity of the anisotropic conductive material layer in a plane direction is 10000 (S/cm) or greater. Of the cases where a graphite sheet is used for the anisotropic conductive material layers, the case of a sheet made of natural graphite, which has an electric conductivity of approximately 2000 to 5000 (S/cm) in a plane direction, does not provide a significant difference compared to the electric conductivity of the Bi—Te thermoelectric conversion material, and therefore does not allow employment of the element structure of the thermoelectric conversion element 1C. On the other hand, the case of a PGS graphite sheet obtained by graphitization of a sheet of a polymer such as polyimide, which has an electric conductivity of approximately 10000 to 25000 (S/cm) in a plane direction, allows employment of the element structure of the thermoelectric conversion element 1C. However, the larger the areas of the major surfaces of the thermoelectric conversion material layers are, the higher the in-plane electric conductivity in the anisotropic conductive material layers must be. Accordingly, too large areas of the major surfaces of the thermoelectric conversion material layers for the in-plane electric conductivity of the anisotropic conductive material layers may prevent a voltage from being applied to the entire thermoelectric conversion material layers to leave a region where carrier transfer is impossible, which may cause reduction of the thermoelectric conversion efficiency.

The element structure of the thermoelectric conversion element 1C of the present embodiment does not require current carriers to pass through the thickness of the anisotropic conductive material and thus has an effect of reducing waste compared to the element structure of the thermoelectric conversion element 1B. Furthermore, also in the present embodiment, the areas of the electrodes 8A and 8B can be held small, and the electrodes 8A and 8B, and the conductive substrate 2 can be formed so as not to overlap each other in the arrangement viewed from above. Thus, the thermal conduction from the heat generation effect part (region of the electrodes 8A and 8B) to the endothermic effect part (region of the conductive substrate 2) will be configurationally inhibited. Accordingly, the thermoelectric conversion element 1C of the present embodiment can achieve high thermoelectric conversion efficiency.

Embodiment 4

Figure 4:
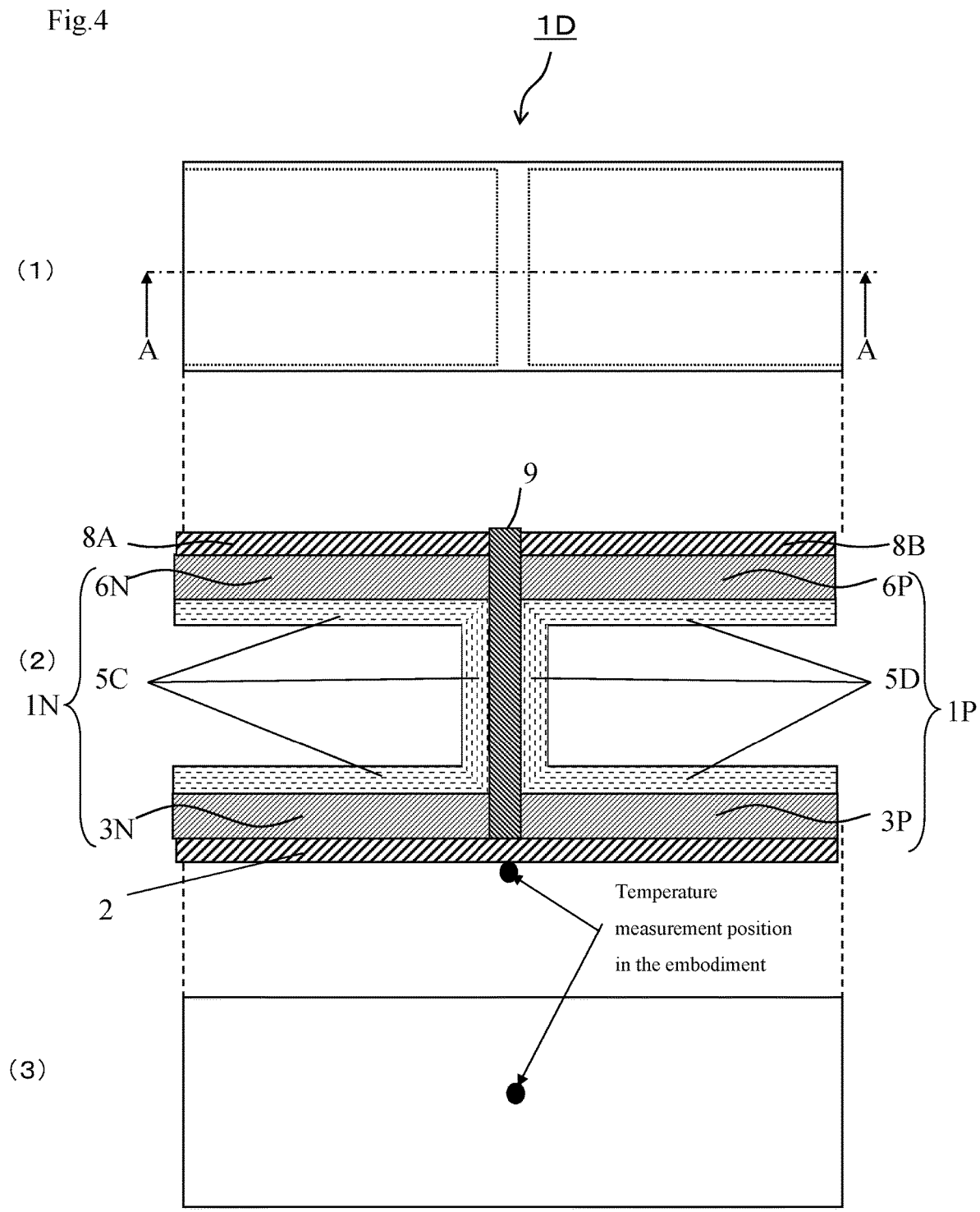
FIG. 4 is a top view, a sectional view and a bottom view of a thermoelectric conversion element according to Embodiment 4 of the present invention.

Next, a thermoelectric conversion element 1D according to Embodiment 4 will be described. FIG. 4 is a top view, a sectional view and a bottom view of the thermoelectric conversion element according to Embodiment 4 of the present invention. In FIG. 4, (1) is the top view, (2) is the sectional view taken along the line A-A in the top view, and (3) is the bottom view.

As illustrated in FIG. 4, the thermoelectric conversion element 1D according to the present embodiment includes a conductive substrate 2 (first electrode), an n-type thermoelectric conversion section 1N and a p-type thermoelectric conversion section 1P formed on top of the conductive substrate 2, and an electrode 8A formed on top of the n-type thermoelectric conversion section 1N and an electrode 8B formed on top of the p-type thermoelectric conversion section 1P (second and third electrodes). The n-type thermoelectric conversion section 1N and the p-type thermoelectric conversion section 1P are separated from each other with an insulating layer 9 (insulator) therebetween. As the n-type thermoelectric conversion section 1N, an n-type thermoelectric conversion material layer 3N, a lower charge transport layer 5C, a cavity (air layer), an upper charge transport layer 5C and an n-type thermoelectric conversion material layer 6N are laminated in this order to the conductive substrate 2, wherein the lower charge transport layer 5C and the upper charge transport layer 5C are disposed so as to form one layer continuous along a side surface of the insulating layer 9 and so as to be electrically contacted. As the p-type thermoelectric conversion section 1P, a p-type thermoelectric conversion material layer 3P, a lower charge transport layer 5D, a cavity (air layer), an upper charge transport layer 5D and a p-type thermoelectric conversion material layer 6P are laminated in this order to the conductive substrate 2, wherein the lower charge transport layer 5D and the upper charge transport layer 5D are disposed so as to form one layer continuous along a side surface of the insulating layer 9 and so as to be electrically contacted.

In the present embodiment, a graphite sheet is used for the charge transport layers 5C and 5D. In addition, a coat layer of a charge transport material may be used. Of the cases where a graphite sheet is used for the charge transport layers, the case of a PGS graphite sheet obtained by graphitization of a sheet of a polymer such as polyimide, which has an electric conductivity of approximately 10000 to 25000 (S/cm) in a plane direction is preferable rather than the case of a sheet made of natural graphite, which has an electric conductivity of approximately 2000 to 5000 (S/cm) in a plane direction. The thickness of the graphite sheet is not particularly limited, and a graphite sheet having a thickness of approximately 50 to 300 μm may be used and bonded to the Bi—Te material board. The graphite sheet is bonded to the board as follows. That is, a layer of a Bi—Te material having the same composition as the board is formed on a mating surface of the graphite sheet by printing a paste of the Bi—Te material, and subsequently the surface having the layer of the Bi—Te material of the graphite sheet is brought into close contact with the Bi—Te material board and subjected to thermal compression bonding.

In the thermoelectric conversion element 1D of the present embodiment, the cavities (air layers) are formed, and the cavities (air layers) inhibit the thermal conduction from the high temperature effect part (region of the electrodes 8A and 8B) to the low temperature effect part (region of the conductive substrate 2). In addition, the lower charge transport layer 5C and the upper charge transport layer 5C, and the lower charge transport layer 5D and the upper charge transport layer 5D in pairs each form one layer continuous along each side surface of the insulating layer 9. Thus, the charge transport layers 5C and 5D ensure sufficient electric conductivity. In this thermoelectric conversion element, the thermal conduction part and the electric conduction part of the thermoelectric conversion element can be configurationally separated by using the cavities (air layers) and the charge transport layers, and thus high electric conductivity and low thermal conductivity can be ensured. As a result, the thermoelectric conversion element 1D can achieve high thermoelectric conversion efficiency.

Embodiment 5

Figure 5:
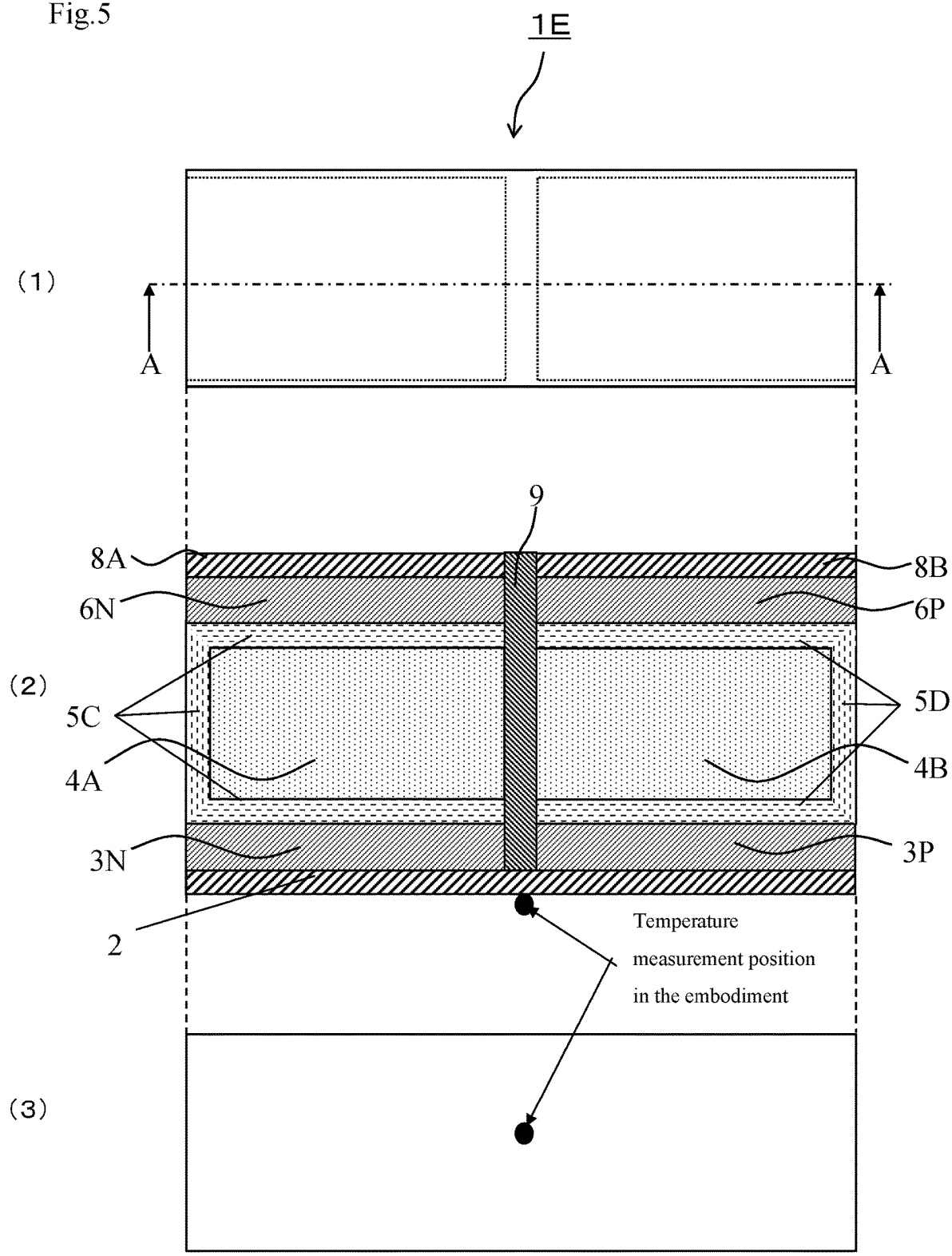
FIG. 5 is a top view, a sectional view and a bottom view of a thermoelectric conversion element according to Embodiment 5 of the present invention.

Next, a thermoelectric conversion element 1E according to Embodiment 5 will be described. FIG. 5 is a top view, a sectional view and a bottom view of the thermoelectric conversion element according to Embodiment 5 of the present invention. In FIG. 5, (1) is the top view, (2) is the sectional view taken along the line A-A in the top view, and (3) is the bottom view.

As illustrated in FIG. 5, the thermoelectric conversion element 1E according to the present embodiment includes a conductive substrate 2 (first electrode), an n-type thermoelectric conversion section 1N and a p-type thermoelectric conversion section 1P formed on top of the conductive substrate 2, and an electrode 8A formed on top of the n-type thermoelectric conversion section 1N and an electrode 8B formed on top of the p-type thermoelectric conversion section 1P (second and third electrodes). The n-type thermoelectric conversion section 1N and the p-type thermoelectric conversion section 1P are separated from each other with an insulating layer 9 (insulator) therebetween. As the n-type thermoelectric conversion section 1N, an n-type thermoelectric conversion material layer 3N, a lower charge transport layer 5C, a heat insulating layer 4A, an upper charge transport layer 5C and an n-type thermoelectric conversion material layer 6N are laminated in this order to the conductive substrate 2, wherein the lower charge transport layer 5C and the upper charge transport layer 5C are disposed so as to form one layer continuous along a side surface of the heat insulating layer 4A and so as to be electrically contacted. As the p-type thermoelectric conversion section 1P, a p-type thermoelectric conversion material layer 3P, a lower charge transport layer 5D, a heat insulating layer 4B, an upper charge transport layer 5D and a p-type thermoelectric conversion material layer 6P are laminated in this order to the conductive substrate 2, wherein the lower charge transport layer 5D and the upper charge transport layer 5D are disposed so as to form one layer continuous along a side surface of the heat insulating layer 4B and so as to be electrically contacted.

In the present embodiment, a graphite sheet is used for the charge transport layers 5C and 5D. As the graphite sheet, preferably, a graphite sheet having a thickness of 50 to 300 μm obtained by graphitization of a sheet of a polymer such as polyimide is used. The graphite sheet is bonded to the Bi—Te material board as follows. That is, a layer of a Bi—Te material having the same composition as the board is formed on a mating surface of the graphite sheet by printing a paste of the Bi—Te material, and subsequently the surface having the layer of the Bi—Te material of the graphite sheet is brought into close contact with the Bi—Te material board and subjected to thermal compression bonding.

Specific examples of the material used for the heat insulating layers 4A and 4B include silica, porous silica, glass, glass wool, rock wool, silicious marl, phenol resin, melamine resin, silicon resin and inorganic particles in the form of hollow particles. A commercially available heat insulating material board obtained by binding glass wool or rock wool with phenol resin or melamine resin may be used. The heat insulating material board has a thickness of approximately 1 to 20 mm.

In the thermoelectric conversion element 1E of the present embodiment, the heat insulating layers 4A and 4B are formed, and the heat insulating layers 4A and 4B inhibit the thermal conduction from the high temperature effect part (region of the electrodes 8A and 8B) to the low temperature effect part (region of the conductive substrate 2). In addition, the lower charge transport layer 5C and the upper charge transport layer 5C, and the lower charge transport layer 5D and the upper charge transport layer 5D in pairs each form one layer continuous along each side surface of the heat insulating layers 4A and 4B. Thus, the charge transport layers 5C and 5D ensure sufficient electric conductivity. In this thermoelectric conversion element, the thermal conduction part and the electric conduction part of the thermoelectric conversion element can be configurationally separated by using the heat insulating layers and the charge transport layers, and thus high electric conductivity and low thermal conductivity can be ensured. As a result, the thermoelectric conversion element 1E can achieve high thermoelectric conversion efficiency.

Embodiment 6

Figure 6:
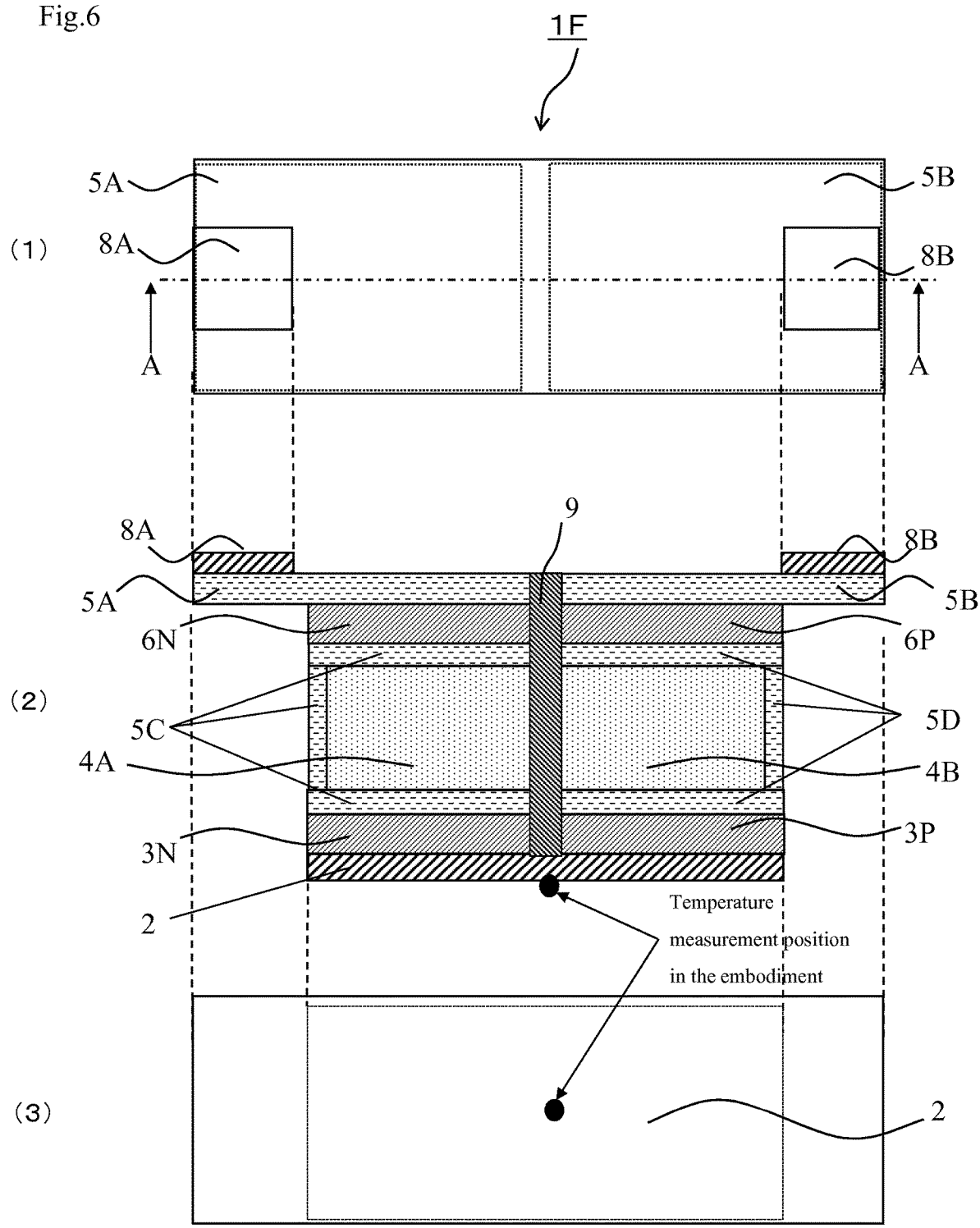
FIG. 6 is a top view, a sectional view and a bottom view of a thermoelectric conversion element according to Embodiment 6 of the present invention.

Next, a thermoelectric conversion element 1F according to Embodiment 6 will be described. FIG. 6 is a top view, a sectional view and a bottom view of the thermoelectric conversion element according to Embodiment 6 of the present invention. In FIG. 6, (1) is the top view, (2) is the sectional view taken along the line A-A in the top view, and (3) is the bottom view.

As illustrated in FIG. 6, the thermoelectric conversion element 1F according to the present embodiment includes a conductive substrate 2 (first electrode), an n-type thermoelectric conversion section 1N and a p-type thermoelectric conversion section 1P formed on top of the conductive substrate 2, and an electrode 8A formed on top of the n-type thermoelectric conversion section 1N and an electrode 8B formed on top of the p-type thermoelectric conversion section 1P (second and third electrodes). The n-type thermoelectric conversion section 1N and the p-type thermoelectric conversion section 1P are separated from each other with an insulating layer 9 (insulator) therebetween. As the n-type thermoelectric conversion section 1N, an n-type thermoelectric conversion material layer 3N, a lower charge transport layer 5C, a heat insulating layer 4A, an upper charge transport layer 5C, an n-type thermoelectric conversion material layer 6N and a first anisotropic conductive material layer 5A are laminated in this order to the conductive substrate 2, wherein the lower charge transport layer 5C and the upper charge transport layer 5C are disposed so as to form one layer continuous along a side surface of the heat insulating layer 4A and so as to be electrically contacted. The anisotropic conductive material layer 5A has an extended portion protruded from the laminated portion, and the electrode 8A is disposed on top of the extended portion of the anisotropic conductive material layer 5A. As the p-type thermoelectric conversion section 1P, a p-type thermoelectric conversion material layer 3P, a lower charge transport layer 5D, a heat insulating layer 4B, an upper charge transport layer 5D, a p-type thermoelectric conversion material layer 6P and a second anisotropic conductive material layer 5B are laminated in this order to the conductive substrate 2, wherein the lower charge transport layer 5D and the upper charge transport layer 5D are disposed so as to form one layer continuous along a side surface of the heat insulating layer 4B and so as to be electrically contacted. The anisotropic conductive material layer 5B has an extended portion protruded from the laminated portion, and the electrode 8B is disposed on top of the extended portion of the anisotropic conductive material layer 5B.

In Embodiment 6, a graphite sheet is used for the anisotropic conductive material layers 5A and 5B, and for the charge transport layers 5C and 5D. As the graphite sheet, preferably, a PGS graphite sheet having a thickness of 50 to 300 μm obtained by graphitization of a sheet of a polymer such as polyimide is used. The graphite sheet is bonded to the Bi—Te material board as follows. That is, a layer of a Bi—Te material having the same composition as the board is formed on a mating surface of the graphite sheet by printing a paste of the Bi—Te material, and subsequently the surface having the layer of the Bi—Te material of the graphite sheet is brought into close contact with the Bi—Te material board and subjected to thermal compression bonding.

In the thermoelectric conversion element 1F of the present embodiment, the heat insulating layers 4A and 4B are formed, and the heat insulating layers 4A and 4B inhibit the thermal conduction from the high temperature effect part (region of the electrodes 8A and 8B) to the low temperature effect part (region of the conductive substrate 2). In addition, the lower charge transport layer 5C and the upper charge transport layer 5C, and the lower charge transport layer 5D and the upper charge transport layer 5D in pairs each form one layer continuous along each side surface of the heat insulating layers 4A and 4B. Thus, the charge transport layers 5C and 5D ensure sufficient electric conductivity. In this thermoelectric conversion element, the thermal conduction part and the electric conduction part of the thermoelectric conversion element can be configurationally separated by using the heat insulating layers and the charge transport layers, and thus high electric conductivity and low thermal conductivity can be ensured. Furthermore, in the present embodiment, the areas of the electrodes 8A and 8B can be held small since the anisotropic conductive material layers 5A and 5B are formed, and the electrodes 8A and 8B, and the conductive substrate 2 can be formed so as not to overlap each other in the arrangement viewed from above. Thus, the thermal conduction from the heat generation effect part (region of the electrodes 8A and 8B) to the endothermic effect part (region of the conductive substrate 2) will be configurationally inhibited. Accordingly, the thermoelectric conversion element 1F of the present embodiment can achieve high thermoelectric conversion efficiency.

Embodiment 7

Figure 7:
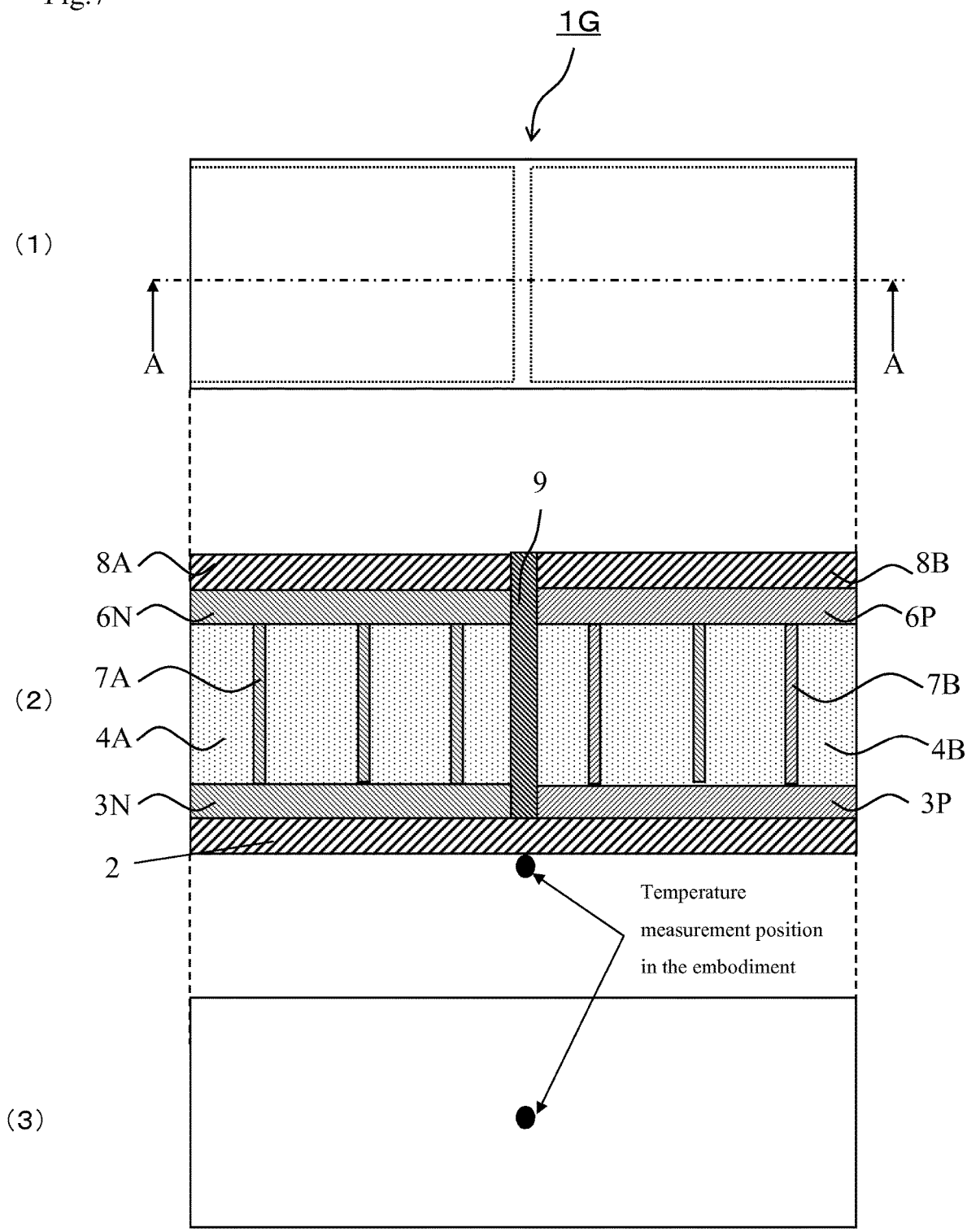
FIG. 7 is a top view, a sectional view and a bottom view of a thermoelectric conversion element according to Embodiment 7 of the present invention.

Next, a thermoelectric conversion element 1G according to Embodiment 7 will be described. FIG. 7 is a top view, a sectional view and a bottom view of the thermoelectric conversion element according to Embodiment 7 of the present invention. In FIG. 7, (1) is the top view, (2) is the sectional view taken along the line A-A in the top view, and (3) is the bottom view.

As illustrated in FIG. 7, the thermoelectric conversion element 1G according to Embodiment 7 includes a conductive substrate 2 (first electrode), an n-type thermoelectric conversion section 1N and a p-type thermoelectric conversion section 1P formed on top of the conductive substrate 2, and an electrode 8A formed on top of the n-type thermoelectric conversion section 1N and an electrode 8B formed on top of the p-type thermoelectric conversion section 1P (second and third electrodes). The n-type thermoelectric conversion section 1N and the p-type thermoelectric conversion section 1P are separated from each other with an insulating layer 9 (insulator) therebetween. As the n-type thermoelectric conversion section 1N, an n-type thermoelectric conversion material layer 3N, a heat insulating layer 4A and an n-type thermoelectric conversion material layer 6N are laminated in this order to the conductive substrate 2. As the p-type thermoelectric conversion section 1P, a p-type thermoelectric conversion material layer 3P, a heat insulating layer 4B and a p-type thermoelectric conversion material layer 6P are laminated in this order to the conductive substrate 2. The heat insulating layer 4A has through holes 7A, and the heat insulating layer 4B has through holes 7B.

Specific examples of the material used for the heat insulating layers 4A and 4B include silica, porous silica, glass, glass wool, rock wool, silicious marl, phenol resin, melamine resin, silicon resin and inorganic particles in the form of hollow particles. A commercially available heat insulating material board obtained by binding glass wool or rock wool with phenol resin or melamine resin may be used. The heat insulating material board has a thickness of approximately 1 to 20 mm.

In the present embodiment, the heat insulating layers 4A and 4B are formed using the above-mentioned heat insulating material board. The through holes 7A and 7B that penetrate the heat insulating layers are formed in the heat insulating material board. The through holes 7A and 7B are formed uniformly throughout the heat insulating layers 4A and 4B (a plurality of through holes are formed in each layer). The through holes may be formed mechanically with a drill or the like, or the through holes may be formed by laser irradiation. The through holes 7A and 7B are sized to have a shape of a cylinder with a diameter of 2 mm with respect to the heat insulating layers 4A and 4B having a thickness of 10 mm, for example, and planarly distributed in a proportion of one through hole to an area of approximately 100 mm². The shape may be cylindrical or square, for example.

The through holes are filled with the above-mentioned charge transport material. With the high conductivity charge transport material filling the through holes, it is possible to ensure the electric contact between the n-type semiconductor layers 3N and 6N, and between the p-type semiconductor layers 3P and 6P, which are laminated so as to respectively have the heat insulating layers 4A and 4B therebetween, and it is possible to achieve high electric conductivity of the thermoelectric conversion element. As the charge transport material, graphite, crystalline graphite, graphene, electron transport materials and hole transport materials may be used. In the present embodiment, the top surface and the bottom surface of each heat insulating material board and the inside of each through hole are coated with a layer of a mixture of crystalline graphite and graphene synthesized through decomposition of acetylene as a raw material by a vapor phase method at a temperature in the range from 1000° C. to 1500° C. without a metal catalyst. As described above, the thermoelectric conversion element 1G of the present embodiment is produced by laminating the heat insulating material boards having the through holes coated with the charge transport material, which correspond to the heat insulating layers 4A and 4B, and the thermoelectric conversion material boards.

In the thermoelectric conversion element 1G of the present embodiment, the heat insulating layers 4A and 4B are formed, and the heat insulating layers 4A and 4B inhibit the thermal conduction from the high temperature effect part (region of the electrodes 8A and 8B) to the low temperature effect part (region of the conductive substrate 2). Since the heat insulating layers 4A and 4B have the through holes 7A and 7B, and the inside of the through holes are filled with the high conductivity charge transport material, it is possible to ensure high electric conductivity of the thermoelectric conversion element. In the thermoelectric conversion element, the heat insulating layers can be given a function of a charge transport section as well as a function of a heat insulating layer, and thus high electric conductivity and low thermal conductivity can be achieved. As a result, the thermoelectric conversion element 1G can achieve high thermoelectric conversion efficiency.

Embodiment 8

Figure 8:
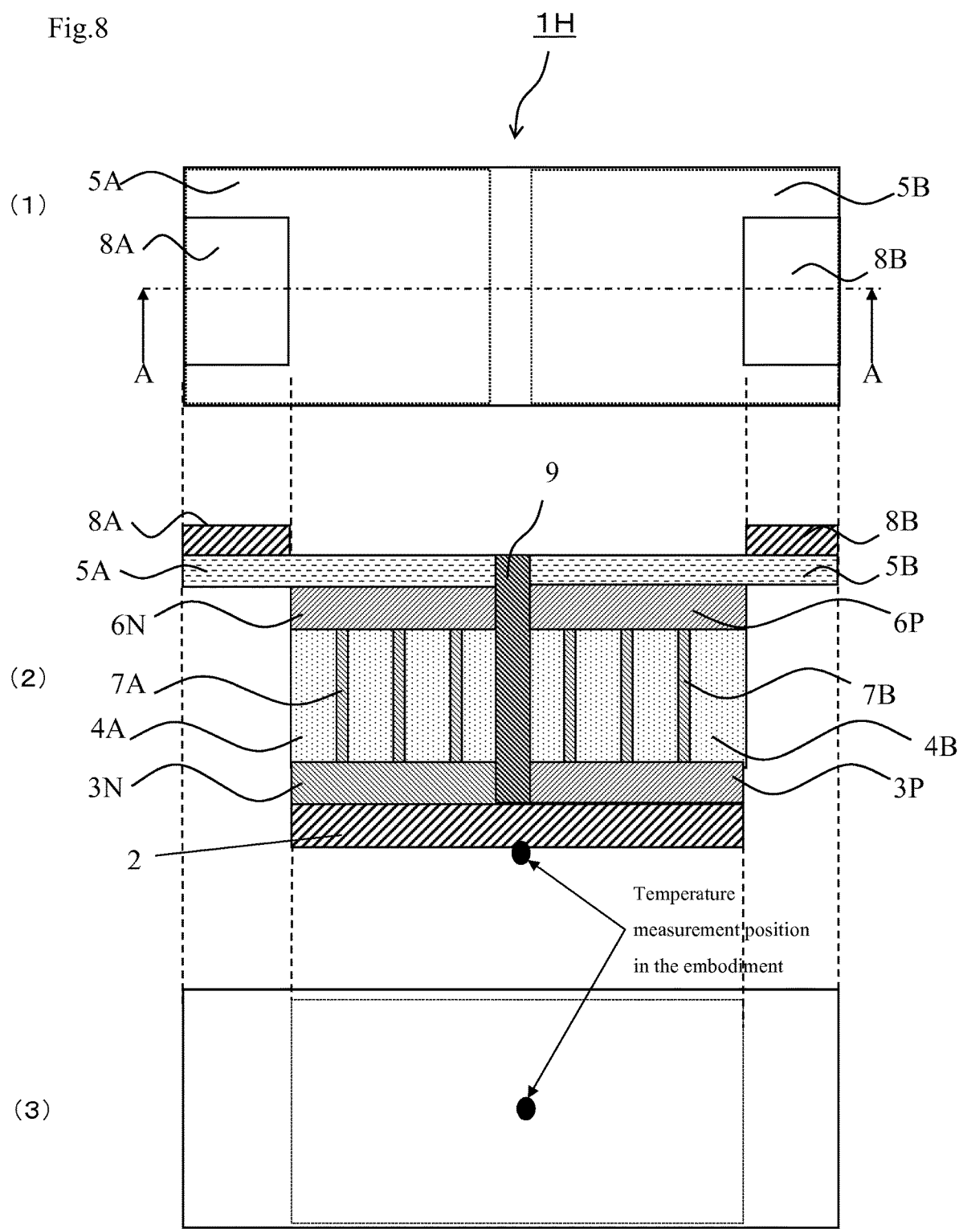
FIG. 8 is a top view, a sectional view and a bottom view of a thermoelectric conversion element according to Embodiment 8 of the present invention.

Next, a thermoelectric conversion element 1H according to Embodiment 8 will be described. FIG. 8 is a top view, a sectional view and a bottom view of the thermoelectric conversion element according to Embodiment 8 of the present invention. In FIG. 8, (1) is the top view, (2) is the sectional view taken along the line A-A in the top view, and (3) is the bottom view.

As illustrated in FIG. 8, the thermoelectric conversion element 1H according to Embodiment 8 includes a conductive substrate 2 (first electrode), an n-type thermoelectric conversion section 1N and a p-type thermoelectric conversion section 1P formed on top of the conductive substrate 2, and an electrode 8A formed on top of the n-type thermoelectric conversion section 1N and an electrode 8B formed on top of the p-type thermoelectric conversion section 1P (second and third electrodes). The n-type thermoelectric conversion section 1N and the p-type thermoelectric conversion section 1P are separated from each other with an insulating layer 9 (insulator) therebetween. As the n-type thermoelectric conversion section 1N, an n-type thermoelectric conversion material layer 3N, a heat insulating layer 4A, an n-type thermoelectric conversion material layer 6N and a first anisotropic conductive material layer 5A are laminated in this order to the conductive substrate 2. The anisotropic conductive material layer 5A has an extended portion protruded from the laminated portion, and the electrode 8A is disposed on top of the extended portion of the anisotropic conductive material layer 5A. As the p-type thermoelectric conversion section 1P, a p-type thermoelectric conversion material layer 3P, a heat insulating layer 4B, a p-type thermoelectric conversion material layer 6P and a second anisotropic conductive material layer 5B are laminated in this order to the conductive substrate 2. The anisotropic conductive material layer 5B has an extended portion protruded from the laminated portion, and the electrode 8B is disposed on top of the extended portion of the anisotropic conductive material layer 5B. The heat insulating layer 4A has through holes 7A, and the heat insulating layer 4B has through holes 7B.

In the present embodiment, the heat insulating layers 4A and 4B are formed using the above-mentioned heat insulating material board. The through holes 7A and 7B are as described in Embodiment 7. In the present embodiment, the top surface and the bottom surface of each heat insulating material board and the inside of each through hole are coated with a layer including crystalline graphite and graphene synthesized through decomposition of acetylene as a raw material by a vapor phase method at a temperature in the range from 1000° C. to 1500° C. without a metal catalyst. As described above, the thermoelectric conversion element 1H of the present embodiment is produced by laminating the heat insulating material boards having the through holes coated with the charge transport material, which correspond to the heat insulating layers 4A and 4B, and the thermoelectric conversion material boards.

In the thermoelectric conversion element 1H of the present embodiment, the heat insulating layers 4A and 4B are formed, and the heat insulating layers 4A and 4B inhibit the thermal conduction from the high temperature effect part (region of the electrodes 8A and 8B) to the low temperature effect part (region of the conductive substrate 2). Since the heat insulating layers 4A and 4B have the through holes 7A and 7B, and the through holes are filled with the high conductivity charge transport material, it is possible to ensure high electric conductivity of the thermoelectric conversion element. In the thermoelectric conversion element, the heat insulating layers can be given a function of a charge transport section as well as a function of a heat insulating layer, and thus high electric conductivity and low thermal conductivity can be achieved. Furthermore, in the present embodiment, the areas of the electrodes 8A and 8B can be held small since the anisotropic conductive material layers 5A and 5B are formed, and the electrodes 8A and 8B, and the conductive substrate 2 can be formed so as not to overlap each other in the arrangement viewed from above. Thus, the thermal conduction from the heat generation effect part (region of the electrodes 8A and 8B) to the endothermic effect part (region of the conductive substrate 2) will be configurationally inhibited. Accordingly, the thermoelectric conversion element 1H of the present embodiment can achieve high thermoelectric conversion efficiency.

Embodiment 9

Figure 9:
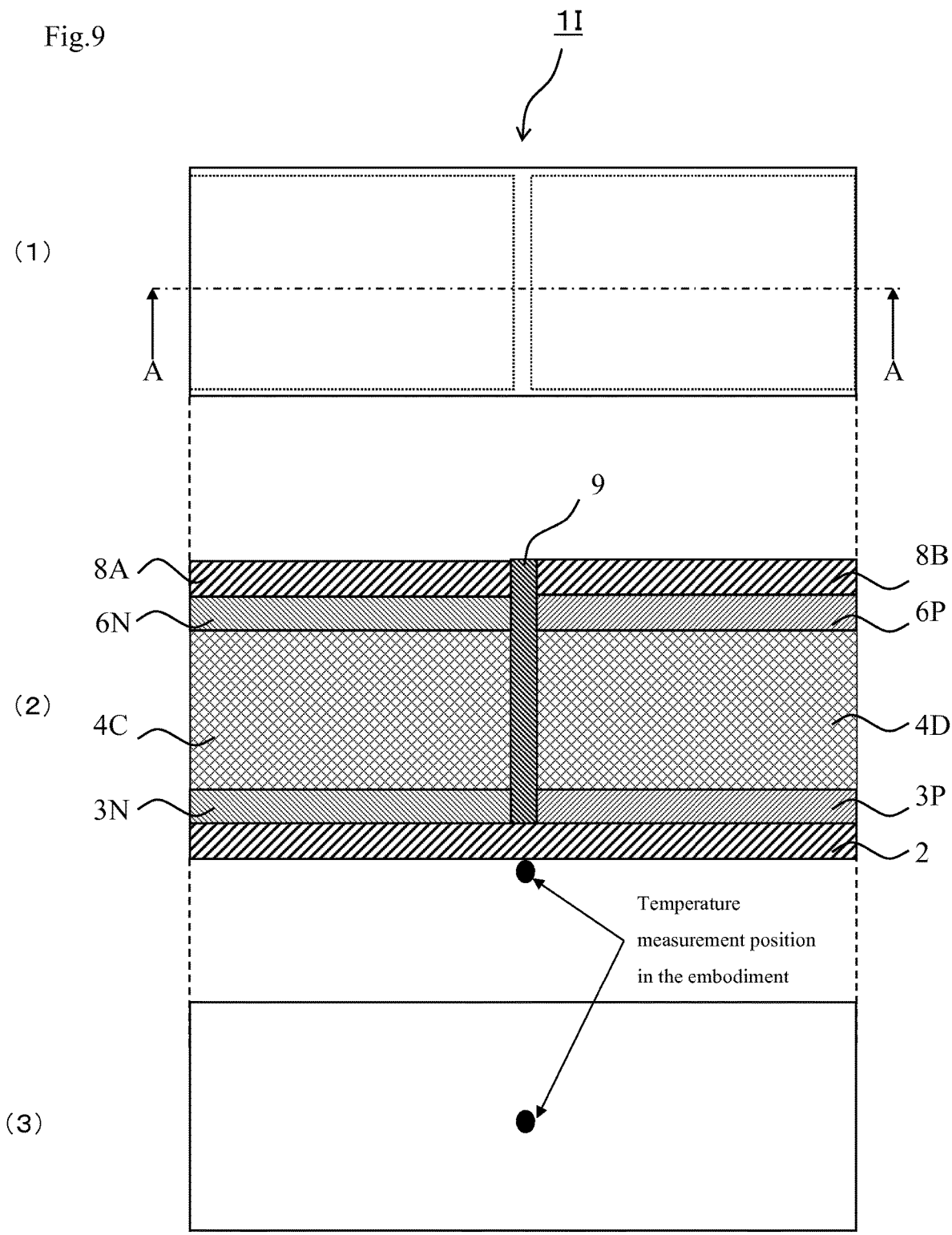
FIG. 9 is a top view, a sectional view and a bottom view of a thermoelectric conversion element according to Embodiment 9 of the present invention.

Next, a thermoelectric conversion element 1I according to Embodiment 9 will be described. FIG. 9 is a top view, a sectional view and a bottom view of the thermoelectric conversion element according to Embodiment 9 of the present invention. In FIG. 9, (1) is the top view, (2) is the sectional view taken along the line A-A in the top view, and (3) is the bottom view.

As illustrated in FIG. 9, the thermoelectric conversion element 1I according to the present embodiment has substantially the same configuration as the thermoelectric conversion element 1G of Embodiment 7 but is different therefrom in that the thermoelectric conversion element 1I includes heat insulating layers 4C and 4D formed of a porous heat insulating material in place of the heat insulating layers 4A and 4B of the thermoelectric conversion element 1G, and the heat insulating layers 4C and 4D are not provided with the through holes 7A and 7B.

For the heat insulating layers 4C and 4D of a porous material, heat insulating material boards corresponding to the heat insulating layers 4C and 4D are formed by preparing a paste of a mixture of an insulating material and resin particles, printing the paste onto a stainless releasable board, heating the paste to burn out the resin particles, and subsequently releasing the releasable board. In the present embodiment, a paste 1 for the heat insulating layer formation was prepared by mixing insulating material powder (average particle size: approximately 10 μm) obtained by pulverizing a glass wool board with polymethyl methacrylate (average particle size: approximately 10 μm, product by Toyobo Co., Ltd.), adding an organic solvent thereto and kneading the mixture. The formulation of the paste 1 for the heat insulating layer formation is shown below. A porous heat insulating material board is formed by applying and printing the paste 1 for the heat insulating layer formation onto a stainless releasable board, and heating the paste 1 at 400° C. to burn out the polymethyl methacrylate particles. The porous heat insulating material boards corresponding to the heat insulating layers 4C and 4D are formed so as to have a thickness of approximately 10 mm.

[Formulation of Paste 1 for Heat Insulating Layer Formation (Parts by Weight)]

Heat insulating material powder obtained from glass wool board: 100 parts
  Melamine resin: 60 parts
  Polymethyl methacrylate: 40 parts
  Terpineol: 15 parts
  Ethylcellulose: 5 parts The pores of each porous heat insulating material board are filled with a charge transport material. As the charge transport material, graphite, crystalline graphite, graphene, electron transport materials and hole transport materials may be used. In the present embodiment, the top surface and the bottom surface of each heat insulating material board and the inside of each pore are coated with a layer of a mixture of crystalline graphite and graphene synthesized at a temperature in the range from 1000° C. to 1500° C. by a vapor phase method using acetylene as a raw material without a metal catalyst.

As described above, the thermoelectric conversion element 1I of the present embodiment is produced by laminating the heat insulating material boards having the pores coated with the charge transport material, which correspond to the heat insulating layers 4C and 4D, and the thermoelectric conversion material boards.

In the thermoelectric conversion element 1I of the present embodiment, the heat insulating layers 4C and 4D are formed, and the heat insulating layers 4C and 4D inhibit the thermal conduction from the high temperature effect part (region of the electrodes 8A and 8B) to the low temperature effect part (region of the conductive substrate 2). Since the pores of the heat insulating layers 4C and 4D are filled with the high conductivity charge transport material, it is possible to ensure high electric conductivity of the thermoelectric conversion element. In the thermoelectric conversion element, the heat insulating layers can be given a function of a charge transport section as well as a function of a heat insulating layer, and thus high electric conductivity and low thermal conductivity can be achieved. As a result, the thermoelectric conversion element 1I can achieve high thermoelectric conversion efficiency.

Comparative Embodiment 1

Figure 16:
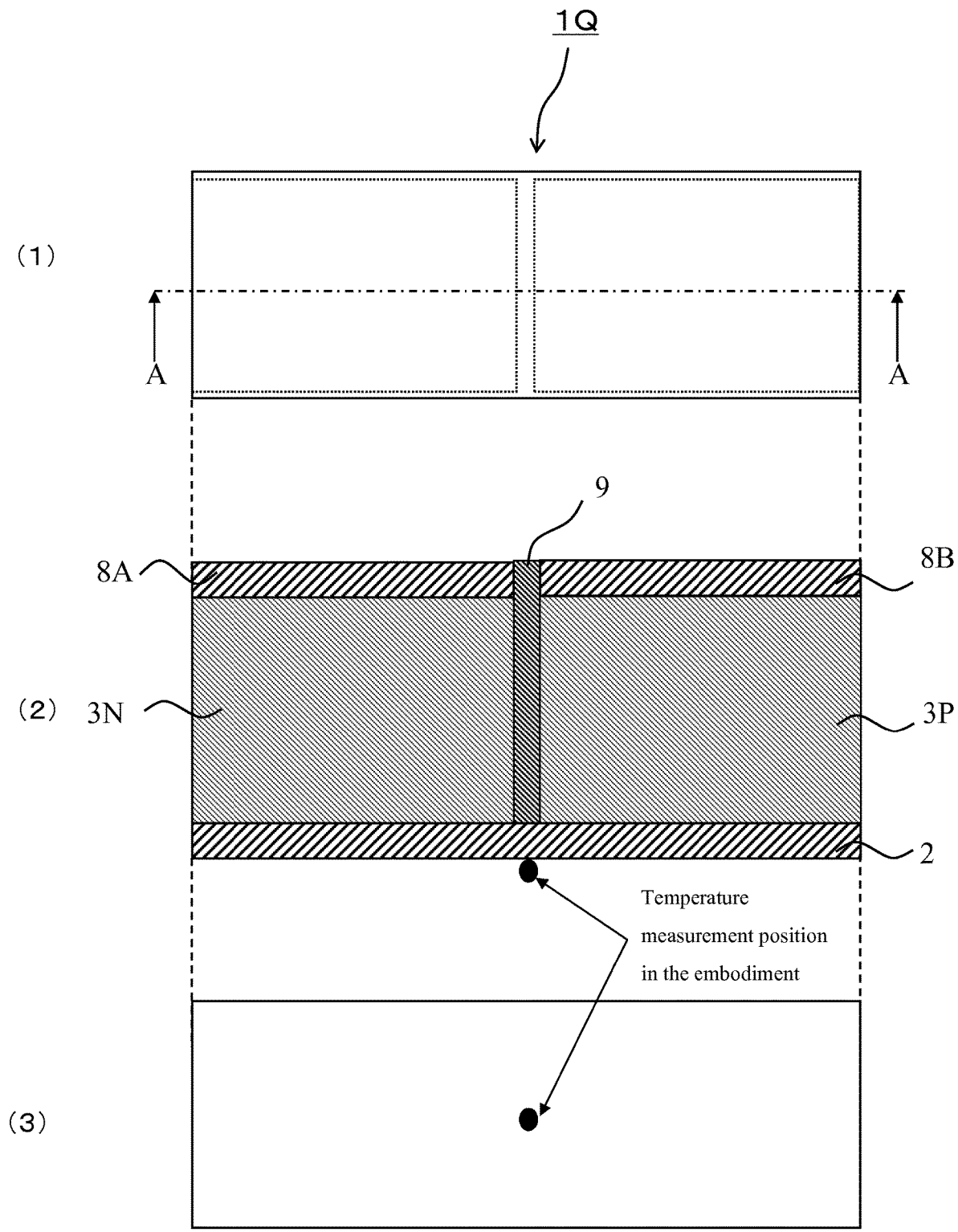
FIG. 16 is a top view, a sectional view and a bottom view of a conventional thermoelectric conversion element according to Comparative Embodiment 1 of the present invention.
Figure 17:
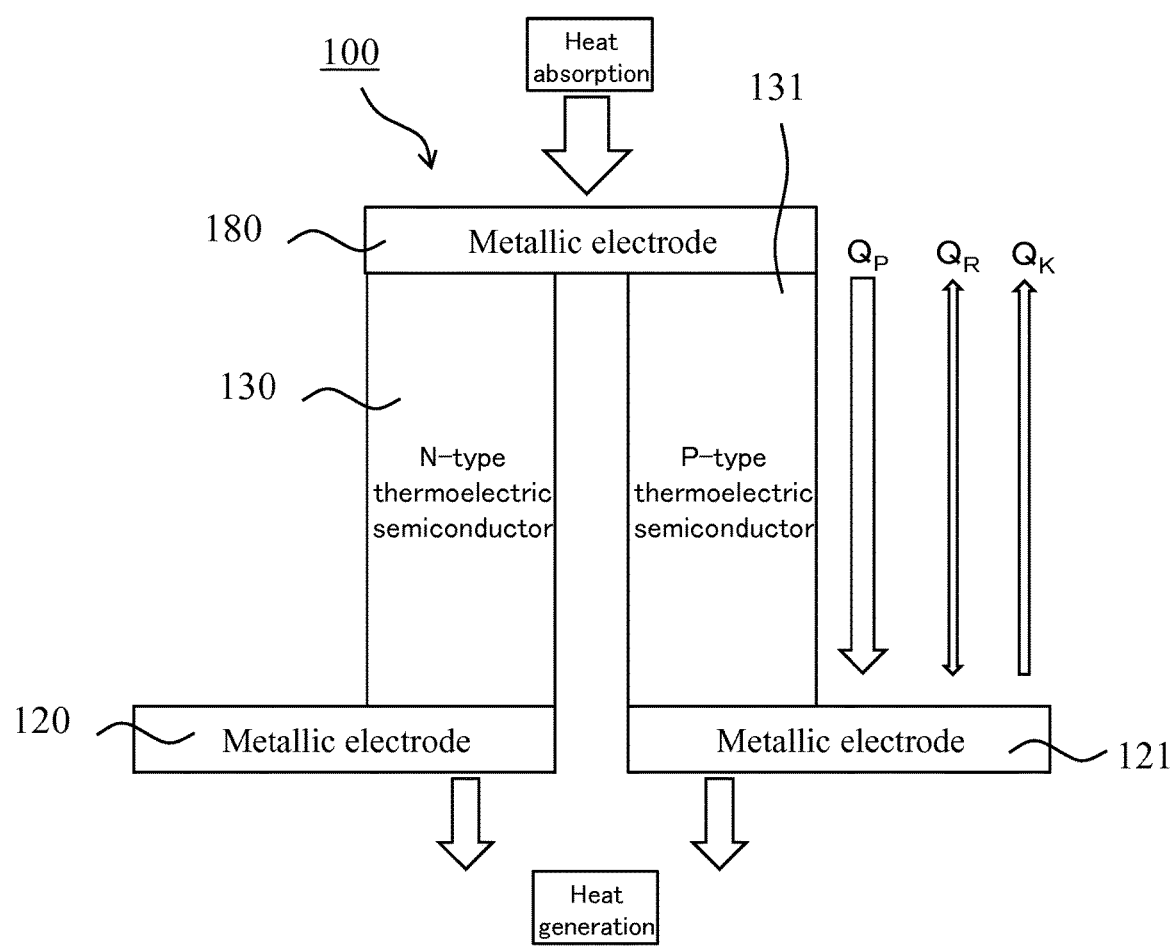
FIG. 17 is a conception diagram for illustrating a structure of the conventional thermoelectric conversion element.

FIG. 16 is a top view, a sectional view and a bottom view of a conventional thermoelectric conversion element according to Comparative Embodiment 1. In FIG. 16, (1) is the top view, (2) is the sectional view taken along the line A-A in the top view, and (3) is the bottom view. As illustrated in FIG. 16, the thermoelectric conversion element 1Q according to Comparative Embodiment 1 includes a conductive substrate 2 (first electrode), an n-type thermoelectric conversion section 1N consisting of an n-type thermoelectric conversion material layer 3N and a p-type thermoelectric conversion section 1P consisting of a p-type thermoelectric conversion material layer 3P formed on top of the conductive substrate 2, and an electrode 8A formed on top of the n-type thermoelectric conversion section 1N and an electrode 8B formed on top of the p-type thermoelectric conversion section 1P (second and third electrodes). The n-type thermoelectric conversion section 1N and the p-type thermoelectric conversion section 1P are separated from each other with an insulating layer 9 (insulator) therebetween. The thermoelectric conversion element 1Q has a conventional element structure and does not have a charge transport layer.

The thermoelectric conversion elements of Embodiments 1 to 9 described above may be used independently, or a plurality of elements may be used in combination. For example, a plurality of thermoelectric conversion elements may be combined to form a thermoelectric conversion power generation device.

Embodiment 10

Figure 10:
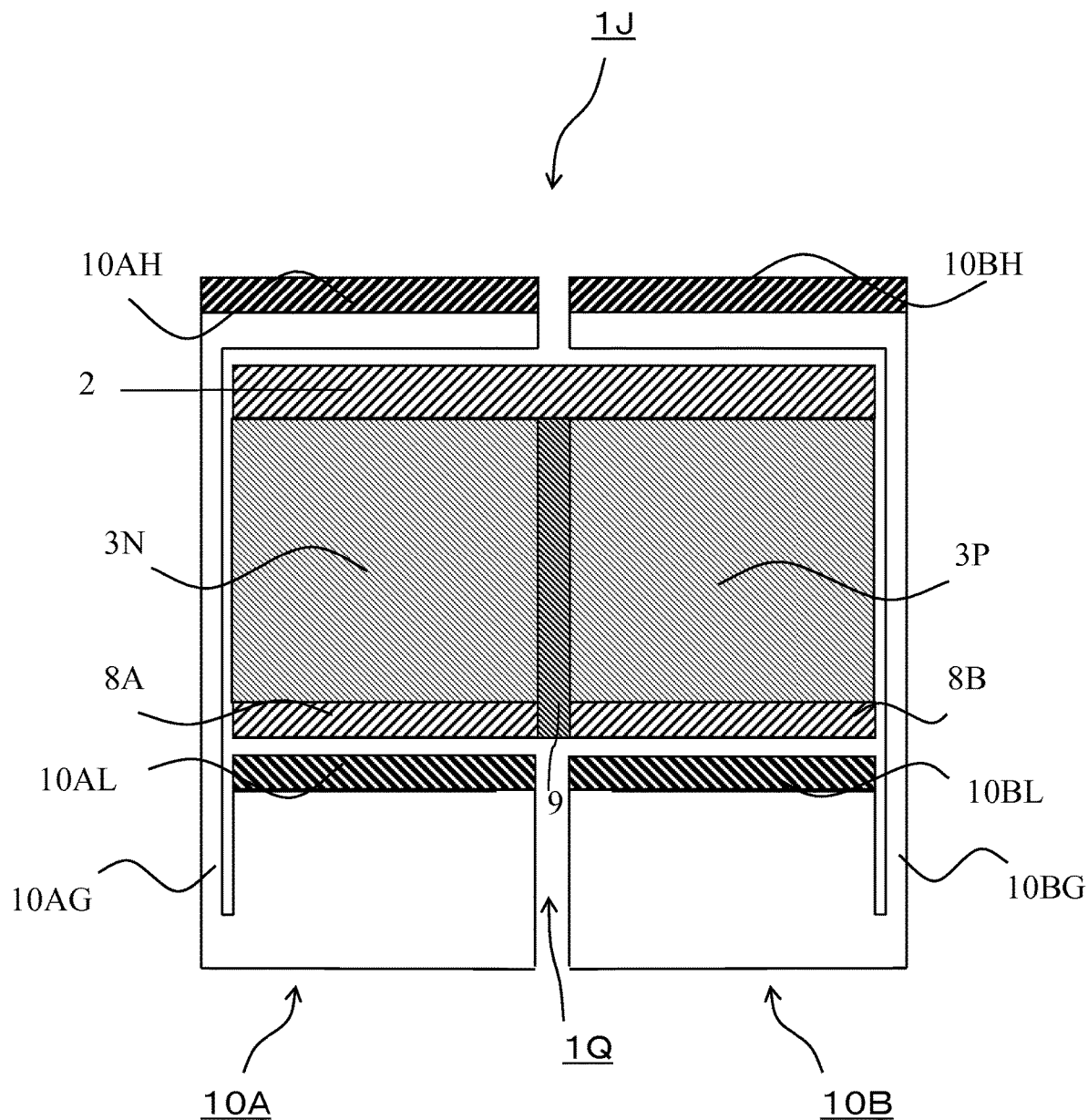
FIG. 10 is a sectional view of a thermoelectric conversion power generation device (device including a plurality of thermoelectric conversion elements) according to Embodiment 10 of the present invention.

Next, a thermoelectric conversion power generation device according to Embodiment 10 will be described. FIG. 10 is a sectional view of the thermoelectric conversion power generation device (device including a plurality of thermoelectric conversion elements) according to Embodiment 10 of the present invention. As illustrated in FIG. 10, the thermoelectric conversion power generation device 1J according to the present embodiment includes the thermoelectric conversion element 1Q having a conventional element structure and other thermoelectric conversion elements 10A and 10B. Here, the thermoelectric conversion element 1Q is a thermoelectric conversion power generation element contributing to power generation, and the thermoelectric conversion elements 10A and 10B are Peltier elements for facilitating efficient power generation by the thermoelectric conversion element 1Q.

As illustrated in FIG. 16, the thermoelectric conversion element 1Q is a thermoelectric conversion power generation element having a conventional element structure described in Comparative Embodiment 1. Beneath a conductive substrate 2 serving as a first electrode, an n-type thermoelectric conversion section 1N and a p-type thermoelectric conversion section 1P are disposed with an insulating layer 9 therebetween, and a second electrode 8A and a third electrode 8B are formed beneath the n-type thermoelectric conversion section 1N and the p-type thermoelectric conversion section 1P. The n-type thermoelectric conversion section 1N consists only of an n-type thermoelectric conversion material layer 3N, and the p-type thermoelectric conversion section 1P consists only of a p-type thermoelectric conversion material layer 3P. The thermoelectric conversion element 1Q generates electric power using the temperature difference between a high temperature effect part and a low temperature effect part, wherein the conductive substrate 2 functions as the high temperature effect part, and the second and third electrodes 8A and 8B function as the low temperature effect part.

Figure 14:
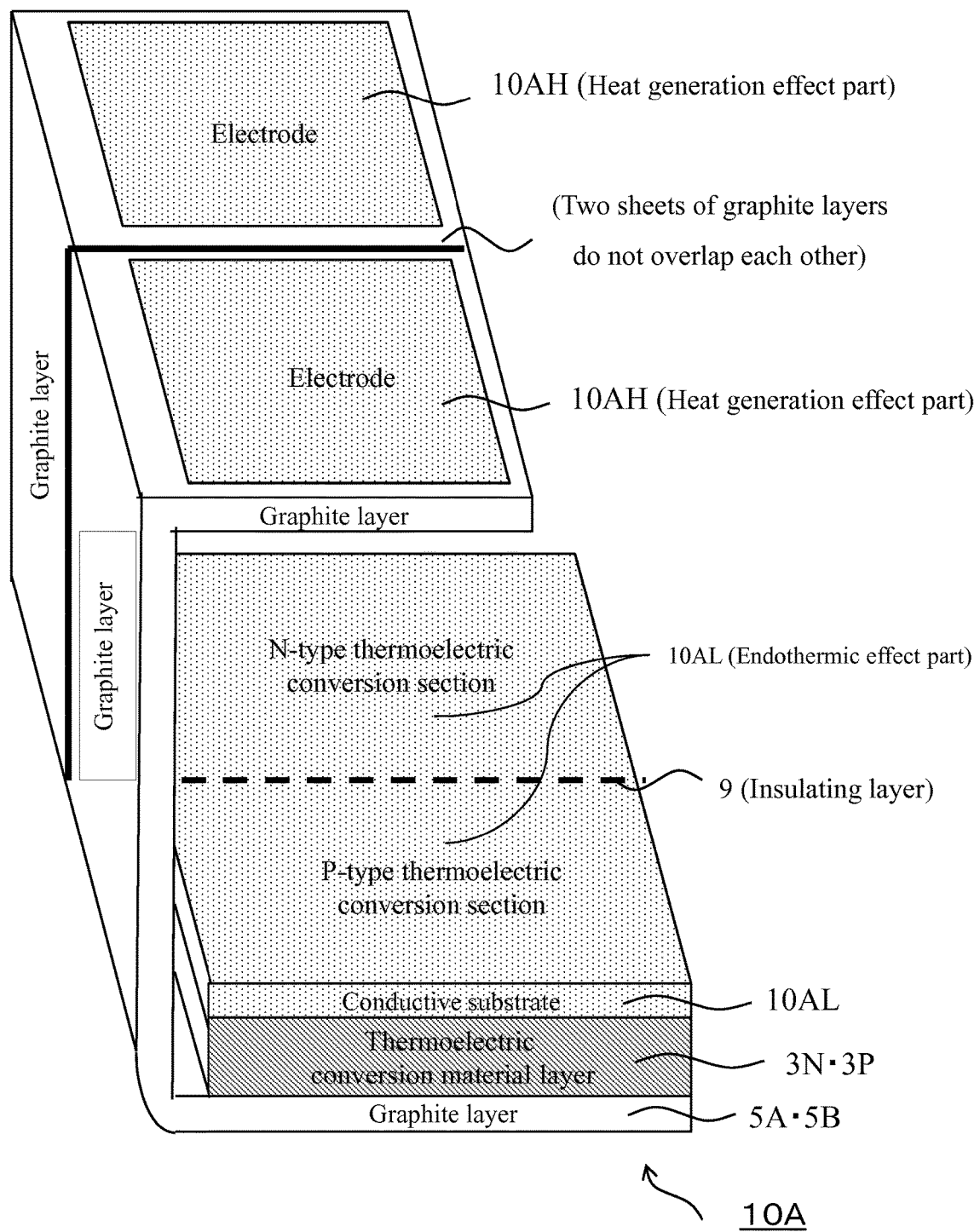
FIG. 14 is a perspective view for illustrating a structure of a thermoelectric conversion element (Peltier element) applied to the thermoelectric conversion power generation device according to Embodiment 10 of the present invention.

In the thermoelectric conversion power generation device 1J, the second and third thermoelectric conversion elements 10A and 10B are disposed in contact with the thermoelectric conversion power generation element 1Q. Here, the second and third thermoelectric conversion elements 10A and 10B have the same structure as the thermoelectric conversion element 1B of Embodiment 2 (FIG. 2). FIG. 14 is a perspective view of the second thermoelectric conversion element 10A. Electrodes 10AL and 10BL of FIG. 10 correspond to the conductive substrate 2 of the thermoelectric conversion element 1B of FIG. 2, and they are disposed in contact with electrodes 8A and 8B of the thermoelectric conversion power generation element 1Q. In the thermoelectric conversion elements 10A and 10B of FIG. 10, a thermoelectric conversion material layer and an anisotropic conductive material layer are laminated in sequence beneath each of the electrodes 10AL and 10BL. The anisotropic conductive material layers have extended portions 10AG and 10BG which are not in contact with the thermoelectric conversion material layers and which are protruded from the laminate structure. The extended portions 10AG and 10BG extend from the laminated surfaces of the anisotropic conductive material layers to regions above the conductive substrate 2 along side surfaces of the n-type thermoelectric conversion material 3N and the p-type thermoelectric conversion material 3P of the thermoelectric conversion power generation element 1Q. Furthermore, electrodes 10AH and 10BH (corresponding to the electrodes 8A and 8B of the thermoelectric conversion element 1B of FIG. 2) are disposed on top of end regions of the extended portions so as to be in contact with the conductive substrate 2 of the thermoelectric conversion power generation element 1Q.

The thermoelectric conversion elements 10A and 10B each have the electrodes, and surfaces of the electrodes are covered with an insulator, so that the electrodes do not have electric contact with the other elements or electrodes they contact, or with an object they contact. The elements have only comings and goings of heat as Peltier elements.

In the second and third thermoelectric conversion elements 10A and 10B as the Peltier elements, the electrodes 10AL and 10BL function as an endothermic effect part, and the electrodes 10AH and 10BH function as a heat generation effect part. Since the electrodes 10AL and 10BL functioning as the endothermic effect part are disposed in contact with the electrodes 8A and 8B functioning as a low temperature effect part of the thermoelectric conversion power generation element 1Q, the heat conducted from a high temperature effect part to the low temperature effect part of the thermoelectric conversion power generation element 1Q is absorbed by the electrodes 10AL and 10BL without being stored in the low temperature effect part. Thus, the low temperature effect part can be maintained at low temperature. On the other hand, the electrodes 10AH and 10BH functioning as the heat generation effect part are disposed in contact with the conductive substrate 2 functioning as the high temperature effect part of the thermoelectric conversion power generation element 1Q, and therefore the heat absorbed by the electrodes 10AL and 10BL is released to the high temperature effect part of thermoelectric conversion power generation element 1Q through the electrodes 10AH and 10BH. Thus, the heat lost due to the thermal conduction from the high temperature effect part to the low temperature effect part can be recovered, and the high temperature effect part can be maintained at high temperature. Since the temperature difference between the high temperature effect part and the low temperature effect part of the thermoelectric conversion power generation element 1Q is maintained by the effects, the thermoelectric conversion power generation element 1Q can perform highly efficient power generation continuously.

In the thermoelectric conversion power generation device 1J of the present embodiment, the Peltier elements 10A and 10B provide substantially complete circulation of the amount of heat: $Q_K$ conducted from the high temperature effect part to the low temperature effect part of the thermoelectric conversion power generation element 1Q with respect to the thermoelectric conversion power generation element 1Q. Thus, the element structure of the thermoelectric conversion power generation element 1Q does not need to take account of the amount of heat: $Q_K$ and therefore can be enlarged in area. The enlargement in area allows a greater amount of thermoelectric conversion electric power generation.

In the thermoelectric conversion power generation device 1J of the present embodiment, the thermoelectric conversion power generation element 1Q generates a thermoelectromotive force in proportion to the temperature difference $\Delta T$ between the high temperature effect part and the low temperature effect part, and thus a power output: $P_{out}$ is obtained. Likewise, the amount of heat: $Q_K$ that is conducted from the high temperature effect part to the low temperature effect part is in proportion to the temperature difference, and a power input $P_{in}$ for driving the second and third thermoelectric conversion elements (Peltier elements) 10A and 10B is needed in order to return $Q_K$ from the low temperature effect part to the high temperature effect part. The amount of heat: $Q_K$ depends on the thermal conductivity of the thermoelectric conversion material and on the temperature difference: $\Delta T$. When a Bi—Te material is used as the thermoelectric conversion material, and the power output: $P_{out}$ at $\Delta T$: 350 (K) is 100%, the power input: $P_{in}$ will be approximately 85%. The thermoelectric conversion power generation device 1J can maintain the temperature difference: $\Delta T$ between the high temperature effect part and the low temperature effect part, and as a result, approximately 15% of the power output: $P_{out}$ can be continuously obtained. While having the same element structure as conventional thermoelectric conversion elements, the thermoelectric conversion power generation element 1Q of the thermoelectric conversion power generation device 1J can be enlarged in area and can utilize the temperature difference with the larger area since the temperature difference between the high temperature effect part and the low temperature effect part of the thermoelectric conversion power generation element 1Q is maintained by the effects produced by the thermoelectric conversion elements 10A and 10B functioning as Peltier elements.

Embodiment 11

Figure 11:
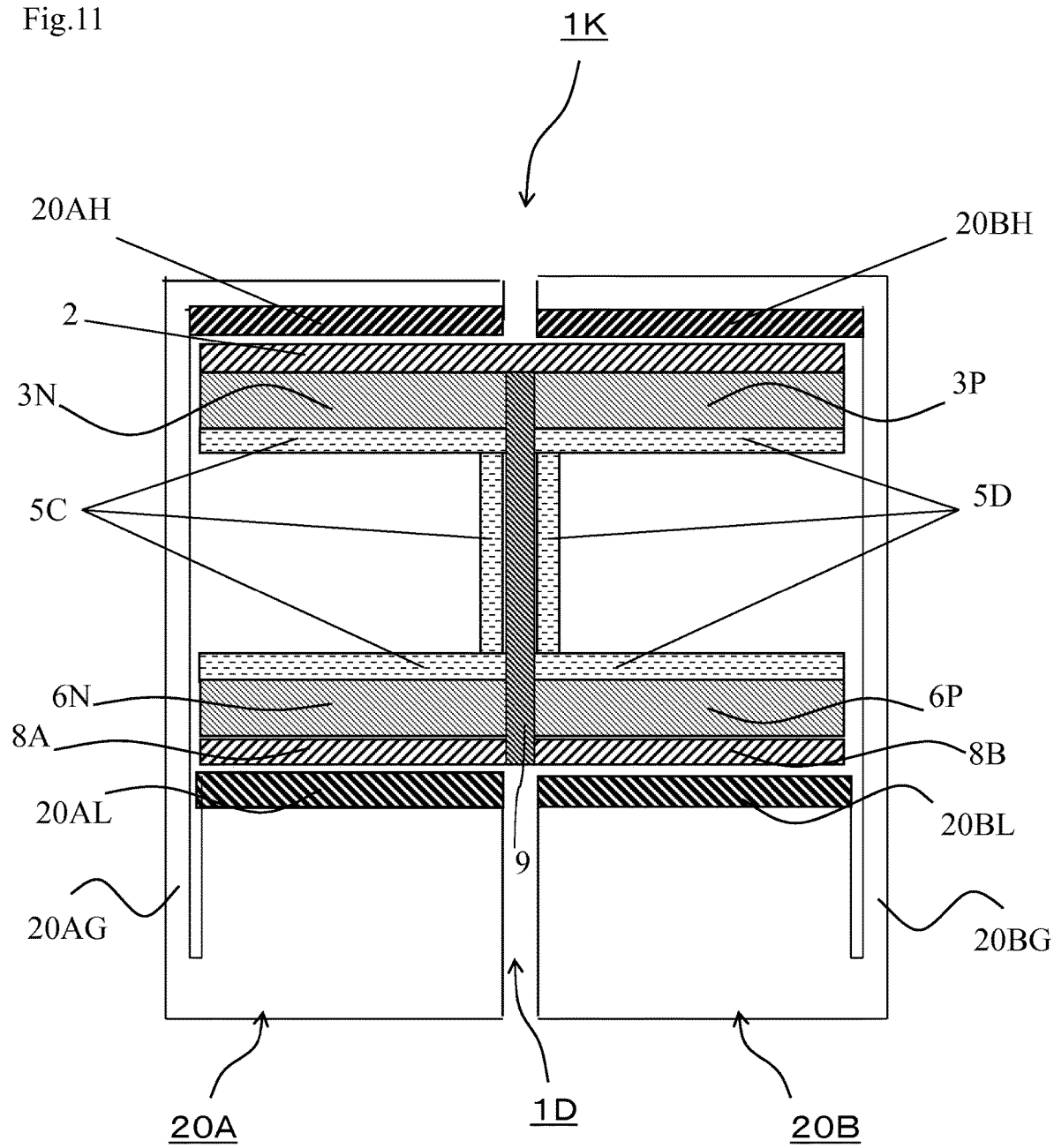
FIG. 11 is a sectional view of a thermoelectric conversion power generation device (device including a plurality of thermoelectric conversion elements) according to Embodiment 11 of the present invention.

Next, a thermoelectric conversion power generation device according to Embodiment 11 will be described. FIG. 11 is a sectional view of the thermoelectric conversion power generation device according to Embodiment 11 of the present invention. As illustrated in FIG. 11, the thermoelectric conversion power generation device 1K according to the present embodiment has substantially the same configuration as the thermoelectric conversion power generation device 1J of Embodiment 10. The thermoelectric conversion power generation device 1K of the present embodiment includes a thermoelectric conversion element 1D of the present invention (thermoelectric conversion element of Embodiment 4) to be used as a power generation element, and thermoelectric conversion elements 20A and 20B of the present invention (thermoelectric conversion elements of Embodiment 3) to be used as Peltier elements.

As illustrated in FIG. 4, the thermoelectric conversion element 1D to be used as a power generation element is a thermoelectric conversion power generation element having the element structure of the present invention described in Embodiment 4. Beneath a conductive substrate 2 serving as a first electrode, an n-type thermoelectric conversion section 1N and a p-type thermoelectric conversion section 1P are disposed with an insulating layer 9 therebetween, and a second electrode 8A and a third electrode 8B are formed beneath the n-type thermoelectric conversion section 1N and the p-type thermoelectric conversion section 1P. As the n-type thermoelectric conversion section 1N, an n-type thermoelectric conversion material layer 3N, an upper charge transport layer 5C, a cavity (air layer), a lower charge transport layer 5C and an n-type thermoelectric conversion material layer 6N are laminated in this order, wherein the upper charge transport layer 5C and the lower charge transport layer 5C are disposed so as to form one layer continuous along a side surface of the insulating layer 9 and so as to be electrically contacted. As the p-type thermoelectric conversion section 1P, a p-type thermoelectric conversion material layer 3P, an upper charge transport layer 5D, a cavity (air layer), a lower charge transport layer 5D and a p-type thermoelectric conversion material layer 6P are laminated in this order, wherein the upper charge transport layer 5D and the lower charge transport layer 5D are disposed so as to form one layer continuous along a side surface of the insulating layer 9 and so as to be electrically contacted. The thermoelectric conversion power generation element 1D has such an element structure. The thermoelectric conversion power generation element 1D generates electric power using the temperature difference between a high temperature effect part and a low temperature effect part, wherein the conductive substrate 2 functions as the high temperature effect part, and the second and third electrodes 8A and 8B function as the low temperature effect part.

In the thermoelectric conversion power generation device 1K, the second and third thermoelectric conversion elements 20A and 20B are disposed in contact with the thermoelectric conversion power generation element 1D. Here, the second and third thermoelectric conversion elements 20A and 20B have the same structure as the thermoelectric conversion element 1C of Embodiment 3 (FIG. 3). Electrodes 20AL and 20BL of FIG. 11 correspond to the conductive substrate 2 of the thermoelectric conversion element 1C of FIG. 3, and they are disposed in contact with the second and third electrodes 8A and 8B of the thermoelectric conversion power generation element 1D. In the thermoelectric conversion elements 20A and 20B of FIG. 11, thermoelectric conversion material layers and anisotropic conductive material layers are laminated in sequence beneath each of the electrode 20AL and 20BL. (see FIG. 14: a perspective view of the second thermoelectric conversion element 10A.) The anisotropic conductive material layers have extended portions 20AG and 20BG which are not in contact with the thermoelectric conversion material layers and which are protruded from the laminate structure. The extended portions 20AG and 20BG extend from the laminated surfaces of the anisotropic conductive material layers to regions above the conductive substrate 2 along side surfaces of the n-type thermoelectric conversion section 6N and the p-type thermoelectric conversion section 6P of the thermoelectric conversion power generation element 1D. Furthermore, electrodes 20AH and 20BH (corresponding to the electrodes 8A and 8B of the thermoelectric conversion element 1C of FIG. 3) are disposed beneath end regions of the extended portions so as to be in contact with the conductive substrate 2 of the thermoelectric conversion power generation element 1D.

The thermoelectric conversion elements 20A and 20B each have the electrodes, and surfaces of the electrodes are covered with an insulator, so that the electrodes do not have electric contact with the other elements or electrodes they contact, or with an object they contact. The elements have only comings and goings of heat as Peltier elements.

In the thermoelectric conversion power generation device 1K of the present embodiment, the thermoelectric conversion power generation element 1D generates a thermoelectromotive force in proportion to the temperature difference $\Delta T$ between the high temperature effect part and the low temperature effect part, and thus a power output: $P_{out}$ is obtained. Likewise, the amount of heat: $Q_K$ that is conducted from the high temperature effect part to the low temperature effect part is in proportion to the temperature difference, and a power input: $P_{in}$ for driving the second and third thermoelectric conversion elements (Peltier elements) 20A and 20B is needed in order to return $Q_K$ from the low temperature effect part to the high temperature effect part. The amount of heat: $Q_K$ depends on the thermal conductivity of the thermoelectric conversion material and on the temperature difference $\Delta T$. The thermoelectric conversion power generation element 1D of the present invention can significantly reduce the amount of heat: $Q_K$ using the cavities (air layers) and the charge transport layers. When a PGS graphite sheet is used for the charge transport layers of the thermoelectric conversion power generation element 1D, and the power output: $P_{out}$ at $\Delta T$: 35 (K) is 100%, the power input: $P_{in}$ will be approximately 50%. The thermoelectric conversion power generation device 1K can maintain the temperature difference: $\Delta T$ between the high temperature effect part and the low temperature effect part, and as a result, approximately 50% of the power output: $P_{out}$ can be continuously obtained.

Since the temperature difference between the high temperature effect part and the low temperature effect part of the thermoelectric conversion power generation element 1D is maintained by the effects produced by the thermoelectric conversion elements 20A and 20B functioning as Peltier elements also in the thermoelectric conversion power generation device 1K of the present embodiment, the thermoelectric conversion power generation element 1D can be enlarged in area and can perform highly efficient power generation continuously.

Embodiment 12

Figure 12:
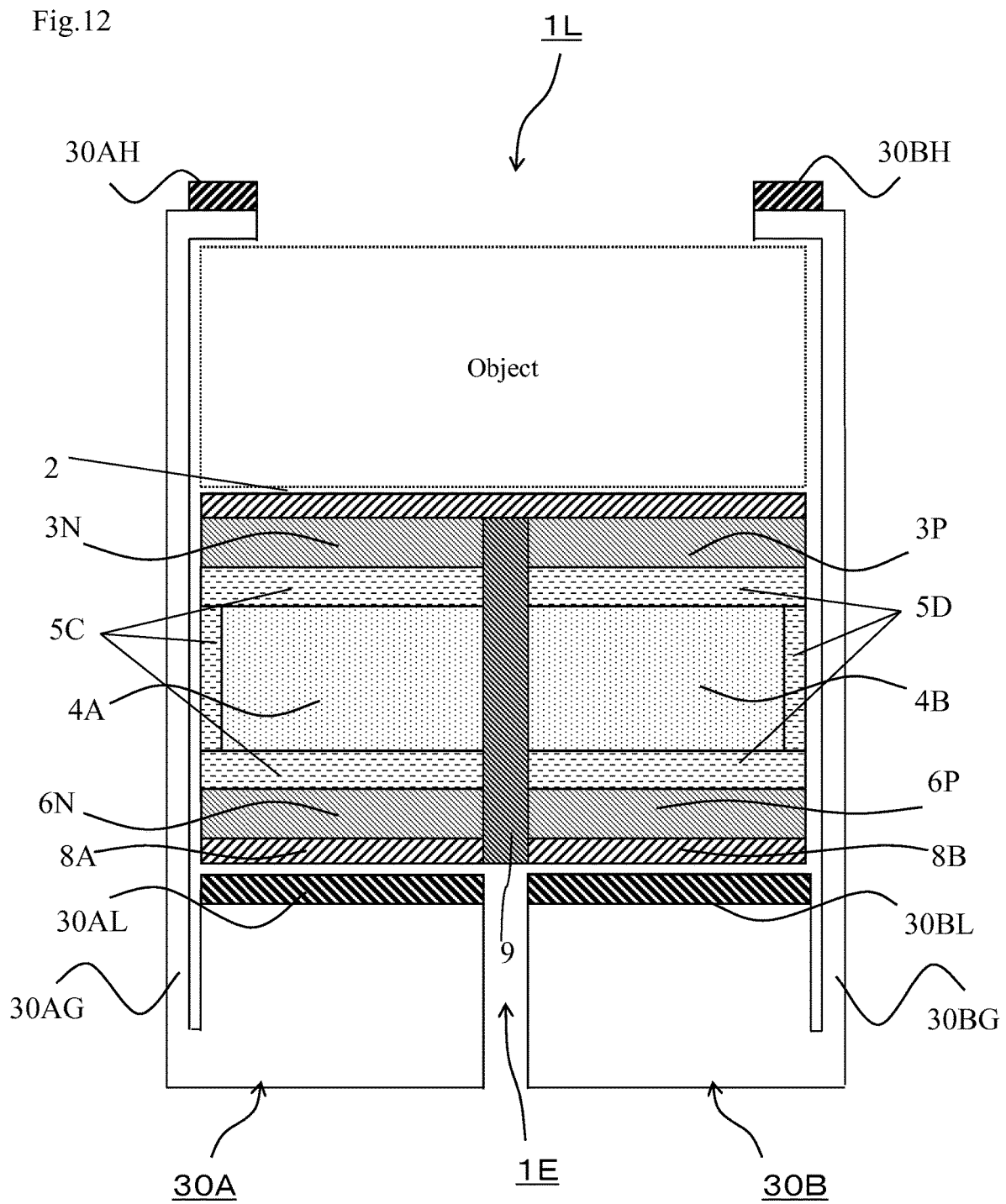
FIG. 12 is a sectional view of a thermoelectric conversion power generation device (device including a plurality of thermoelectric conversion elements) according to Embodiment 12 of the present invention.

Next, a thermoelectric conversion power generation device according to Embodiment 12 will be described. FIG. 12 is a sectional view of the thermoelectric conversion power generation device according to Embodiment 12 of the present invention. As illustrated in FIG. 12, the thermoelectric conversion power generation device 1L according to the present embodiment has substantially the same configuration as the thermoelectric conversion power generation device 1J of Embodiment 10. The thermoelectric conversion power generation device 1L of the present embodiment includes a thermoelectric conversion element 1E of the present invention (thermoelectric conversion element of Embodiment 5) to be used as a power generation element, and thermoelectric conversion elements 30A and 30B of the present invention (thermoelectric conversion elements of Embodiment 6) to be used as Peltier elements.

As illustrated in FIG. 5, the thermoelectric conversion element 1E is a thermoelectric conversion power generation element having the element structure of the present invention described in Embodiment 5. Beneath a conductive substrate 2 serving as a first electrode, an n-type thermoelectric conversion section 1N and a p-type thermoelectric conversion section 1P are disposed with an insulating layer 9 therebetween, and a second electrode 8A and a third electrode 8B are formed beneath the n-type thermoelectric conversion section 1N and the p-type thermoelectric conversion section 1P. As the n-type thermoelectric conversion section 1N, an n-type thermoelectric conversion material layer 3N, an upper charge transport layer 5C, a heat insulating layer 4A, a lower charge transport layer 5C and an n-type thermoelectric conversion material layer 6N are laminated in this order, wherein the upper charge transport layer 5C and the lower charge transport layer 5C are disposed so as to form one layer continuous along a side surface of the insulating layer 4A and so as to be electrically contacted. As the p-type thermoelectric conversion section 1P, a p-type thermoelectric conversion material layer 3P, an upper charge transport layer 5D, a heat insulating layer 4B, a lower charge transport layer 5D and a p-type thermoelectric conversion material layer 6P are laminated in this order, wherein the upper charge transport layer 5D and the lower charge transport layer 5D are disposed so as to form one layer continuous along a side surface of the insulating layer 4B and so as to be electrically contacted. The thermoelectric conversion power generation element 1E has such an element structure. The thermoelectric conversion power generation element 1E of the present embodiment generates electric power using the temperature difference between a high temperature effect part and a low temperature effect part, wherein the conductive substrate 2 functions as the high temperature effect part, and the second and third electrodes 8A and 8B function as the low temperature effect part.

Figure 15:
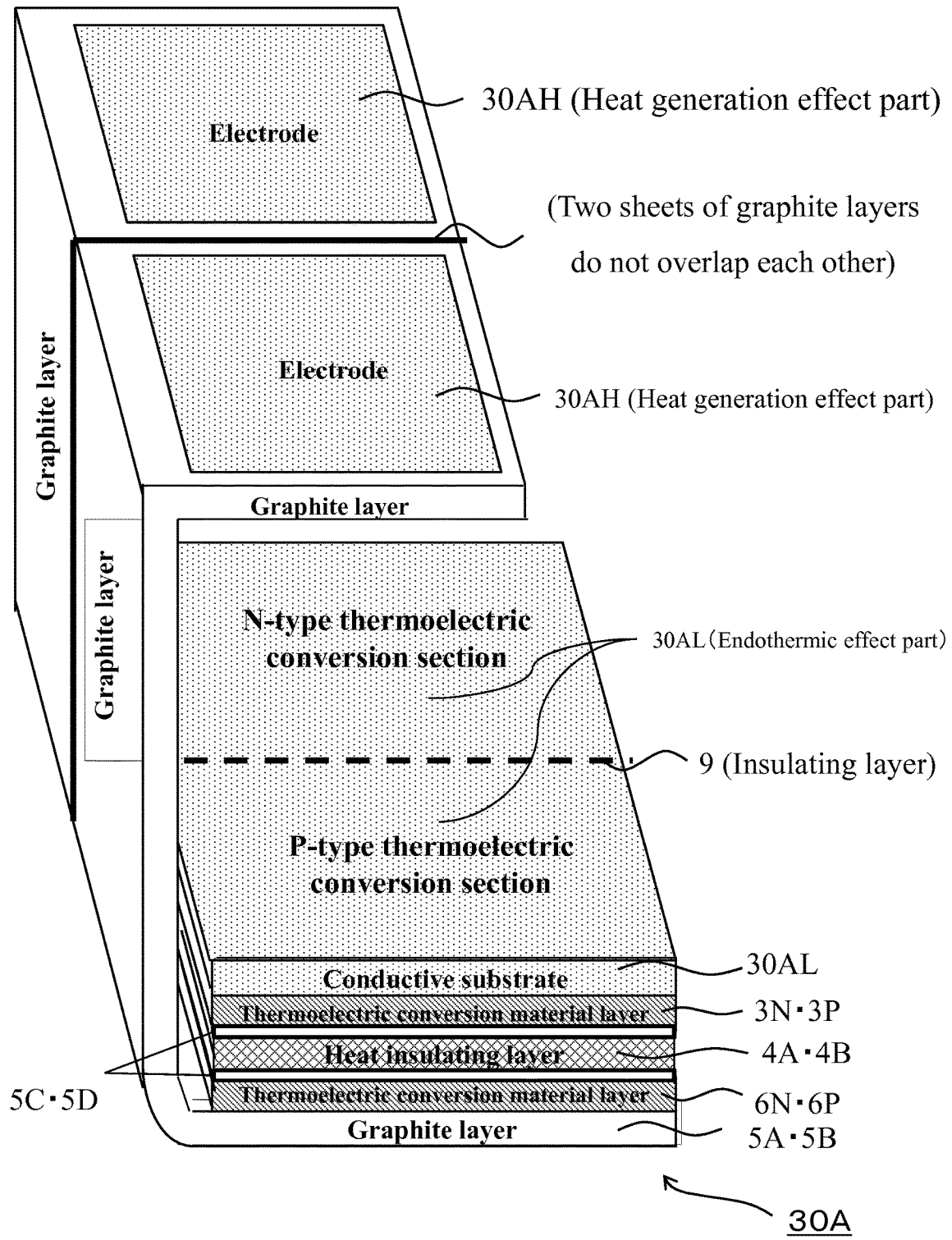
FIG. 15 is a perspective view for illustrating a structure of a thermoelectric conversion element (Peltier element) applied to the thermoelectric conversion power generation device according to Embodiment 12 of the present invention.

In the thermoelectric conversion power generation device 1L, the second and third thermoelectric conversion elements 30A and 30B are disposed in contact with the thermoelectric conversion power generation element 1E. Here, the second and third thermoelectric conversion elements 30A and 30B have the same structure as the thermoelectric conversion element 1F of Embodiment 6 (FIG. 6). FIG. 15 is a perspective view of the second thermoelectric conversion element 30A. Electrodes 30AL and 30BL of FIG. 12 correspond to the conductive substrate 2 of the thermoelectric conversion element 1F of FIG. 6, and they are disposed in contact with electrodes 8A and 8B of the thermoelectric conversion power generation element 1E. In the thermoelectric conversion elements 30A and 30B of FIG. 12, a thermoelectric conversion material layer, an upper charge transport layer, a heat insulating layer, a lower charge transport layer, a thermoelectric conversion material layer, an anisotropic conductive material layer are laminated in sequence beneath each of the electrodes 30AL and 30BL, and each upper charge transport layer and each lower charge transport layer are disposed so as to form one layer continuous along a side surface of each insulating layer and so as to be electrically contacted. The anisotropic conductive material layers have extended portions 30AG and 30BG which are not in contact with the thermoelectric conversion material layers and which are protruded from the laminate structure. The extended portions 30AG and 30BG extend from the laminated surfaces of the anisotropic conductive material layers to regions above an object along sides of the n-type thermoelectric conversion material layers 6N and 3N, and the p-type thermoelectric conversion material layers 6P and 3P of the thermoelectric conversion power generation element 1E, and further along sides of the conductive substrate 2 and sides of the object. Furthermore, electrodes 30AH and 30BH (corresponding to the electrodes 8A and 8B of the thermoelectric conversion element 1E of FIG. 6) are disposed on top of end regions of the extended portions so as to be in contact with the object serving as a heat reservoir.

The thermoelectric conversion elements 30A and 30B each have the electrodes, and surfaces of the electrodes are covered with an insulator, so that the electrodes do not have electric contact with the other elements or electrodes they contact, or with the object they contact. The elements have only comings and goings of heat as Peltier elements.

In the thermoelectric conversion power generation device 1L of the present embodiment, the thermoelectric conversion power generation element 1E generates a thermoelectromotive force in proportion to the temperature difference $\Delta T$ between the high temperature effect part and the low temperature effect part, and thus a power output: $P_{out}$ is obtained. Likewise, the amount of heat: $Q_K$ that is conducted from the high temperature effect part to the low temperature effect part is in proportion to the temperature difference, and a power input: $P_{in}$ for driving the second and third thermoelectric conversion elements (Peltier elements) 30A and 30B is needed in order to return $Q_K$ from the low temperature effect part to the high temperature effect part. The amount of heat: $Q_K$ depends on the thermal conductivity of the thermoelectric conversion material and on the temperature difference $\Delta T$. The thermoelectric conversion power generation element 1E of the present invention can significantly reduce the amount of heat: $Q_K$ using the heat insulating layers and the charge transport layers. When a PGS graphite sheet is used for the charge transport layers of the thermoelectric conversion power generation element 1E, and the power output: $P_{out}$ at $\Delta T$: 35 (K) is 100%, the power input: $P_{in}$ will be approximately 50%. The thermoelectric conversion power generation device 1L can maintain the temperature difference: $\Delta T$ between the high temperature effect part and the low temperature effect part, and as a result, approximately 50% of the power output: $P_{out}$ can be continuously obtained.

Since the temperature difference between the high temperature effect part and the low temperature effect part of the thermoelectric conversion power generation element 1E is maintained by the effects produced by the thermoelectric conversion elements 30A and 30B functioning as Peltier elements also in the thermoelectric conversion power generation device 1L of the present embodiment, the thermoelectric conversion power generation element 1E can be enlarged in area and can perform highly efficient power generation continuously.

Embodiment 13

Figure 13:
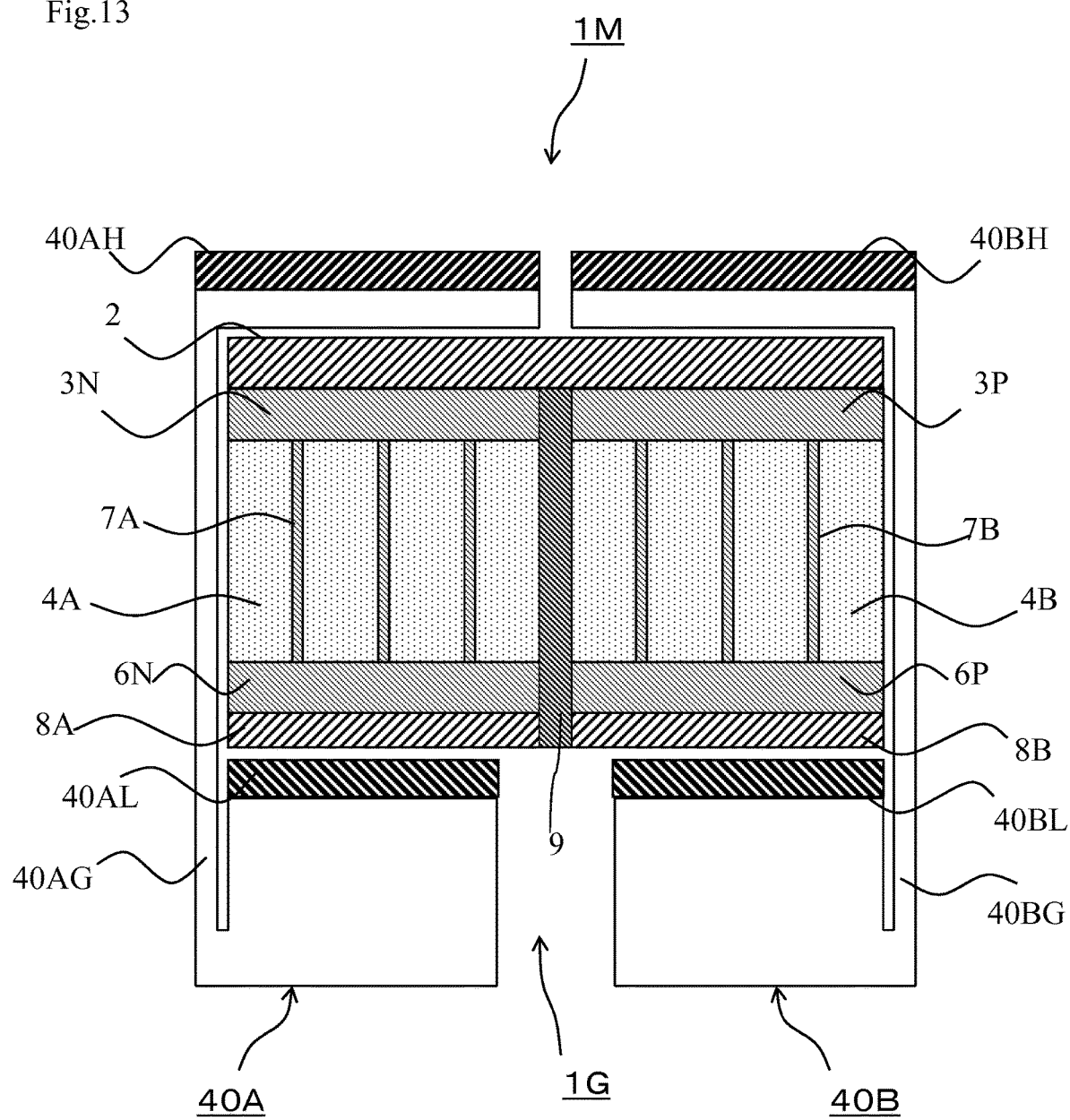
FIG. 13 is a sectional view of a thermoelectric conversion power generation device (device including a plurality of thermoelectric conversion elements) according to Embodiment 13 of the present invention.

Next, a thermoelectric conversion power generation device according to Embodiment 13 will be described. FIG. 13 is a sectional view of the thermoelectric conversion power generation device according to Embodiment 13 of the present invention. As illustrated in FIG. 13, the thermoelectric conversion power generation device 1M according to the present embodiment has substantially the same configuration as the thermoelectric conversion power generation device 1J of Embodiment 10. The thermoelectric conversion power generation device 1M of the present embodiment includes a thermoelectric conversion element 1G of the present invention (thermoelectric conversion element of Embodiment 7) to be used as a power generation element, and thermoelectric conversion elements 40A and 40B of the present invention (thermoelectric conversion elements of Embodiment 8) to be used as Peltier elements.

As illustrated in FIG. 7, the thermoelectric conversion element 1G is a thermoelectric conversion power generation element having the element structure of the present invention described in Embodiment 7. The element structure of the thermoelectric conversion power generation element is as follows. That is, beneath a conductive substrate 2 serving as a first electrode, an n-type thermoelectric conversion section and a p-type thermoelectric conversion section are formed with an insulating layer 9 therebetween, the n-type thermoelectric conversion section including an n-type thermoelectric conversion material layer 3N, a heat insulating layer 4A and an n-type thermoelectric conversion material layer 6N, the p-type thermoelectric conversion section including a p-type thermoelectric conversion material layer 3P, a heat insulating layer 4B and a p-type thermoelectric conversion material layer 6P, and the second and third electrodes 8A and 8B are formed beneath the thermoelectric conversion material layers 6N and 6P. The heat insulating layer 4A has through holes 7A, and the heat insulating layer 4B has through holes 7B. The through holes are filled with a high conductivity charge transport material. The thermoelectric conversion power generation element 1G of the present embodiment generates electric power using the temperature difference between a high temperature effect part and a low temperature effect part, wherein the conductive substrate 2 functions as the high temperature effect part, and the second and third electrodes 8A and 8B function as the low temperature effect part.

In the thermoelectric conversion power generation device 1M, the second and third thermoelectric conversion elements 40A and 40B are disposed in contact with the thermoelectric conversion power generation element 1G. Here, the second and third thermoelectric conversion elements 40A and 40B have the same structure as the thermoelectric conversion element 1H of Embodiment 8 (FIG. 8). Electrodes 40AL and 40BL of FIG. 13 correspond to the conductive substrate 2 of the thermoelectric conversion element 1H of FIG. 8, and they are disposed in contact with electrodes 8A and 8B of the thermoelectric conversion power generation element 1G. In the thermoelectric conversion elements 40A and 40B of FIG. 13, a thermoelectric conversion material layer, a heat insulating layer, a thermoelectric conversion material layer and an anisotropic conductive material (graphite) layer are laminated in sequence beneath each of the electrodes 40AL and 40BL. (see FIG. 15: a perspective view of the second thermoelectric conversion element 30A.) The anisotropic conductive material (graphite) layers have extended portions 40AG and 40BG which are not in contact with the thermoelectric conversion material layers and which are protruded from the laminate structure. The extended portions 40AG and 40BG extend from laminated surfaces of the anisotropic conductive material (graphite) layers to regions above the conductive substrate 2 along the sides of the heat insulating layers 4A and 4B of the thermoelectric conversion power generation element 1G. Furthermore, electrodes 40AH and 40BH (corresponding to the electrodes 8A and 8B of the thermoelectric conversion element 1H of FIG. 8) are disposed on top of end regions of the extended portions so as to be in contact with the conductive substrate 2 of the thermoelectric conversion power generation element 1G.

The thermoelectric conversion elements 40A and 40B each have the electrodes, and surfaces of the electrodes are covered with an insulator, so that the electrodes do not have electric contact with the other elements or electrodes they contact, or with an object they contact. The elements have only comings and goings of heat as Peltier elements.

In the thermoelectric conversion power generation device 1M of the present embodiment, the thermoelectric conversion power generation element 1G generates a thermoelectromotive force in proportion to the temperature difference $\Delta T$ between the high temperature effect part and the low temperature effect part, and thus a power output: $P_{out}$ is obtained. Likewise, the amount of heat: $Q_K$ that is conducted from the high temperature effect part to the low temperature effect part is in proportion to the temperature difference, and a power input: $P_{in}$ for driving the second and third thermoelectric conversion elements (Peltier elements) 40A and 40B is needed in order to return $Q_K$ from the low temperature effect part to the high temperature effect part. The amount of heat: $Q_K$ depends on the thermal conductivity of the thermoelectric conversion material and on the temperature difference $\Delta T$. The thermoelectric conversion power generation element 1G of the present invention can significantly reduce the amount of heat: $Q_K$ using the heat insulating layers and the charge transport layers. When a layer of a mixture of crystalline graphite and graphene formed by a CVD method is used for the charge transport layers of the thermoelectric conversion power generation element 1G, and the power output: $P_{out}$ at $\Delta T$: 35 (K) is 100%, the power input: $P_{in}$ will be approximately 50%. The thermoelectric conversion power generation device 1K can maintain the temperature difference: $\Delta T$ between the high temperature effect part and the low temperature effect part, and as a result, approximately 50% of the power output: $P_{out}$ can be continuously obtained.

Since the temperature difference between the high temperature effect part and the low temperature effect part of the thermoelectric conversion power generation element 1G is maintained by the effects produced by the thermoelectric conversion elements 40A and 40B functioning as Peltier elements also in the thermoelectric conversion power generation device 1M of the present embodiment, the thermoelectric conversion power generation element 1G can be enlarged in area and can perform highly efficient power generation continuously.

[Preparation and Evaluation of Thermoelectric Conversion Sections]

First, the performance (thermoelectric properties) of each n-type thermoelectric conversion section and each p-type thermoelectric conversion section was evaluated before the evaluation of each thermoelectric conversion element.

Performance evaluation samples were prepared by cutting pieces having a necessary size out of n-type and p-type thermoelectric conversion sections each prepared using a Bi—Te material board. The sizes of the evaluation samples of the n-type and p-type thermoelectric conversion sections are 20 mm×20 mm square and approximately 10 mm to 11 mm thick as thermoelectric property evaluation samples, and 50 mm×50 mm square and approximately 10 mm to 11 mm thick as thermal conductivity measurement samples.

[Preparation of First Evaluation Thermoelectric Conversion Sections]

An n-type thermoelectric conversion section and a p-type thermoelectric conversion section of Embodiment 1 (see FIG. 1) in which a graphite sheet is used for the anisotropic conductive material layer were prepared in such a manner as described below.

First, boards of Bi—Te thermoelectric conversion materials were prepared. A material prepared so as to have a composition of $Bi_2Te_{2.7}Se_{0.3}$ was used as an n-type thermoelectric conversion material, and a material prepared so as to have a composition of $Bi_{0.5}Sb_{1.5}Te_3$ was used as a p-type thermoelectric conversion material. Powder raw materials including Bi, Te and additives are mixed and melted, and subsequently the resulting base material is pulverized to give a powdered n-type or p-type thermoelectric conversion material. Then, the powdered material was put into a mold having a plate-like shape under pressure, re-melted at approximately 550 to 650° C. by zone melting, and subsequently annealed at 350 to 450° C. for 5 hours to give a sinter. A board of each Bi—Te thermoelectric conversion material having sides of 100 mm×100 mm and a thickness of 10 mm was prepared by cutting it out of the resulting sinter.

Next, a graphite sheet having sides of 100 mm×100 mm and a thickness of 50 μm (product by OTSUKA DENKI KK) was laminated to each Bi—Te material board. The graphite sheet was laminated by forming, on a mating surface of the graphite sheet, a Bi—Te material layer having a thickness of approximately 10 μm with a paste of a Bi—Te material having the same composition as the Bi—Te material board, bringing the Bi—Te material board and the graphite sheet into close contact, and thermally compressing the same.

As described above, the n-type and p-type thermoelectric conversion sections 1N and 1P having double-layer structures were prepared, the double-layer structures including thermoelectric conversion material layers 3N and 3P, and anisotropic conductive material layers 5A and 5B, respectively. The first evaluation thermoelectric conversion sections were prepared by cutting pieces having the sizes of the thermoelectric property evaluation samples and the thermal conductivity measurement samples out of the thermoelectric conversion sections 1N and 1P, and grinding the cut faces thereof. For the thermoelectric property evaluation samples, Al electrodes having sides of 20 mm×20 mm and a thickness of 0.2 mm, and for the thermal conductivity measurement samples, Al electrodes having sides of 50 mm×50 mm and a thickness of 0.2 mm were soldered onto a lower part and an upper part of each evaluation thermoelectric conversion section to complete the evaluation samples.

[Preparation of Second Evaluation Thermoelectric Conversion Sections]

An n-type thermoelectric conversion section and a p-type thermoelectric conversion section of Embodiment 1 (see FIG. 1) in which a charge transport material is used for the anisotropic conductive material layer were prepared in such a manner as described below.

A solution for formation of a low conductivity material layer prepared so as to have the composition specified below was applied onto a Bi—Te thermoelectric conversion material board having sides of 100 mm×100 mm and a thickness of 10 mm prepared in the same manner as in the first evaluation thermoelectric conversion sections by a spin coating method, dried and sintered at 200° C. for 60 minutes to remove the solvent to give a low conductivity material layer having a thickness of approximately 1 μm. The low conductivity material layer was formed so as to have an electric conductivity of approximately 5 S/cm.

(Solution for Formation of Low Conductivity Material Layer of n-Type Thermoelectric Conversion Section)
Polycarbonate resin: 100 parts
Diphenoquinone compound (Formula 1): 15 parts
Tetrahydrofuran solvent: 300 parts (Solution for Formation of Low Conductivity Material Layer of p-Type Thermoelectric Conversion Section)
Polycarbonate resin: 100 parts
Hydrazone compound (Formula 2): 20 parts
Tetrahydrofuran solvent: 300 parts Subsequently, a charge transport material was applied by a resistance heating vapor deposition method to form a high conductivity material layer on a surface of each low conductivity material layer formed. An electron transport material: Alq3 (aluminato-tris-8B-hydoroxyquinolate: Formula 3) was used as the charge transport material for the n-type thermoelectric conversion section, and a hole transport material: NPP (N,N-di(naphthalene-1-yl)-N,N-diphenyl-benzidene) was used as the charge transport material for the p-type thermoelectric conversion section. The coat layer was formed so as to have a thickness of approximately 300 nm and an in-plane electric conductivity of approximately 300 S/cm.

As described above, the n-type and p-type thermoelectric conversion sections 1N and 1P having double-layer structures were prepared, the double-layer structures including thermoelectric conversion material layers 3N and 3P, and anisotropic conductive material layers 5A and 5B, respectively. The first evaluation thermoelectric conversion sections were prepared by cutting pieces having the sizes of the thermoelectric property evaluation samples and the thermal conductivity measurement samples out of the thermoelectric conversion sections 1N and 1P, and grinding the cut faces thereof. For the thermoelectric property evaluation samples, Al electrodes having sides of 20 mm×20 mm and a thickness of 0.2 mm, and for the thermal conductivity measurement samples, Al electrodes having sides of 50 m×50 m and a thickness of 0.2 mm were soldered onto a lower part and an upper part of each evaluation thermoelectric conversion section to complete the evaluation samples.

[Preparation of Third Evaluation Thermoelectric Conversion Sections]

An n-type thermoelectric conversion section 1N and a p-type thermoelectric conversion section 1P of Embodiment 4 (see FIG. 4) in which a graphite sheet is used for the charge transport layer were prepared in such a manner as described below.

First, in the same manner as in the first evaluation thermoelectric conversion sections, a board of each Bi—Te thermoelectric conversion material having sides of 100 mm×100 mm and a thickness of 2.5 mm was prepared and cut into a board having sides of 20 mm×20 mm and a thickness of 2.5 mm for a thermoelectric property evaluation sample, and into a board having sides of 50 m×50 m and a thickness of 2.5 mm for a thermal conductivity measurement sample to give thermoelectric conversion material layers 3N and 3P.

Next, a paste of each Bi—Te material was prepared. The paste of each Bi—Te material was obtained by processing Bi—Te material powder (average particle size: approximately 5 which was prepared by pulverizing each Bi—Te base material, into a paste. Bi—Te thermoelectric conversion material powder prepared so as to have a composition of $Bi_2Te_{2.7}Se_{0.3}$ was used as an n-type thermoelectric conversion material, and Bi—Te thermoelectric conversion material powder prepared so as to have a composition of $Bi_{0.5}Sb_{1.5}Te_3$ was used as a p-type thermoelectric conversion material. The formulation of the Bi—Te material paste is shown below.

[Formulation of paste for Bi—Te material layer formation (parts by weight)]

Bi—Te material powder: 100 parts

Terpineol: 10 parts

Ethylcellulose: 3 parts

A PGS graphite sheet (product by Panasonic Corporation) having sides of 20 mm×45 mm and a thickness of 50 μm for the thermoelectric property evaluation samples was laminated to each of the thermoelectric conversion material layers 3N and 3P as the thermoelectric property evaluation samples, and a PGS graphite sheet (product by Panasonic Corporation) having sides of 50 mm×105 mm and a thickness of 50 for the thermal conductivity measurement samples was laminated to each of the thermoelectric conversion material layers 3N and 3P as the thermal conductivity measurement samples. The Bi—Te material paste having the same composition as the thermoelectric conversion material layer 3N or 3P was applied and printed on a mating surface of the graphite sheet so as to have a thickness of approximately 10 μm, and the graphite sheet was bonded to the thermoelectric conversion material layer 3N or 3P under reduced pressure and under heating at approximately 580° C. for preventing oxidation of the graphite.

Subsequently, boards of the above-mentioned Bi—Te thermoelectric conversion materials were cut into boards each having sides of 20 mm×20 mm and a thickness of 2.5 mm for the thermoelectric property evaluation samples and into boards each having sides of 50 m×50 m and a thickness of 2.5 mm for the thermal conductivity measurement samples to give thermoelectric conversion material layers 6N and 6P. The resulting thermoelectric conversion material layers 6N and 6P were laminated to upper surfaces of end regions of the graphite sheets, which surfaces correspond to upper surfaces of the upper graphite layers 5C and 5D, for the respective thermoelectric property evaluation samples and for the respective thermal conductivity measurement samples. The Bi—Te material paste having the same composition as the thermoelectric conversion material layer 6N or 6P was applied and printed on a mating surface of the graphite sheet so as to have a thickness of approximately 10 μm, and the thermoelectric conversion material layer 6N or 6P was bonded to the graphite sheet under reduced pressure and under heating at approximately 580° C. for preventing oxidation of the graphite.

Subsequently, glass wool plates each having sides of 20 mm×5 mm and a thickness of 10 mm for the thermoelectric property evaluation samples, and glass wool plates each having sides of 50 mm×5 mm and a thickness of 10 mm for the thermal conductivity measurement samples were prepared as equivalents of the insulating layer 9 of FIG. 4. As illustrated in FIG. 4, each glass wool plate, side surfaces of the thermoelectric conversion material layers 3N and 3P, graphite sheets, and side surfaces of the thermoelectric conversion material layers 6N and 6P were bonded together. For the bonding, a paste of each Bi—Te material was applied and printed so as to have a thickness of approximately 10 μm, and the plate, the sheets and the layers were bonded under reduced pressure and under heating at approximately 580° C. for preventing oxidation of the graphite.

As described above, n-type and p-type thermoelectric conversion sections 1N and 1P having five-layer structures were prepared for the thermoelectric property evaluation samples and for the thermal conductivity measurement samples, the five-layer structures including the thermoelectric conversion material layers 3N and 3P, the lower charge transport layers 5C and 5D, the cavities (air layers), the upper charge transport layers 5C and 5D, and the thermoelectric conversion material layers 6N and 6P, respectively. For the thermoelectric property evaluation samples, Al electrodes having sides of 20 mm×20 mm and a thickness of 0.2 mm, and for the thermal conductivity measurement samples, Al electrodes having sides of 50 m×50 m and a thickness of 0.2 mm were soldered onto a lower part and an upper part of each of the thermoelectric conversion sections 1N and 1P to complete the evaluation samples.

[Preparation of Forth Evaluation Thermoelectric Conversion Sections]

An n-type thermoelectric conversion section 1N and a p-type thermoelectric conversion section 1P of Embodiment 5 (see FIG. 5) in which a graphite sheet is used for the charge transport layer were prepared in such a manner as described below.

First, in the same manner as in the first evaluation thermoelectric conversion sections, a board of each Bi—Te thermoelectric conversion material having sides of 100 mm×100 mm and a thickness of 2.5 mm was prepared and cut into a board having sides of 20 mm×20 mm and a thickness of 2.5 mm for a thermoelectric property evaluation sample, and into a board having sides of 50 m×50 m and a thickness of 2.5 mm for a thermal conductivity measurement sample to give thermoelectric conversion material layers 3N and 3P.

A PGS graphite sheet (product by Panasonic Corporation) having sides of 20 mm×45 mm and a thickness of 50 μm for the thermoelectric property evaluation samples was laminated to each of the thermoelectric conversion material layers 3N and 3P as the thermoelectric property evaluation samples, and a PGS graphite sheet (product by Panasonic Corporation) having sides of 50 mm×105 mm and a thickness of 50 μm for the thermal conductivity measurement samples was laminated to each of the thermoelectric conversion material layers 3N and 3P as the thermal conductivity measurement samples. The Bi—Te material paste having the same composition as the thermoelectric conversion material layer 3N or 3P was applied and printed on a mating surface of the graphite sheet so as to have a thickness of approximately 10 μm, and the graphite sheet was bonded to the thermoelectric conversion material layer 3N or 3P under reduced pressure and under heating at approximately 580° C. for preventing oxidation of the graphite.

Glass wool plates each having sides of 20 mm×20 mm and a thickness of 5 mm for the thermoelectric property evaluation samples, and glass wool plates each having sides of 50 mm×50 mm and a thickness of 5 mm for the thermal conductivity measurement samples were prepared as equivalents of the heat insulating layers 4A and 4B of FIG. 5. As illustrated in FIG. 5, each graphite sheet was bonded to a side surface and an upper surface of each glass wool plate. For the bonding, a paste of each Bi—Te material was applied and printed so as to have a thickness of approximately 10 µm, and the sheet and the plate were bonded under reduced pressure and under heating at approximately 580° C. for preventing oxidation of the graphite.

Subsequently, boards of the above-mentioned Bi—Te thermoelectric conversion materials were cut into boards each having sides of 20 mm×20 mm and a thickness of 2.5 mm for the thermoelectric property evaluation samples and into boards each having sides of 50 m×50 m and a thickness of 2.5 mm for the thermal conductivity measurement samples to give thermoelectric conversion material layers 6N and 6P. The resulting thermoelectric conversion material layers 6N and 6P were laminated to upper surfaces of end regions of the graphite sheets, which surfaces correspond to upper surfaces of the graphite layers 5C and 5D, for the respective thermoelectric property evaluation samples and for the respective thermal conductivity measurement samples. The Bi—Te material paste having the same composition as the thermoelectric conversion material layer 6N or 6P was applied and printed on a mating surface of the graphite sheet so as to have a thickness of approximately 10 µm, and the thermoelectric conversion material layer 6N or 6P was bonded to the graphite sheet under reduced pressure and under heating at approximately 580° C. for preventing oxidation of the graphite.

As described above, n-type and p-type thermoelectric conversion sections 1N and 1P having five-layer structures were prepared for the thermoelectric property evaluation samples and for the thermal conductivity measurement samples, the five-layer structures including the thermoelectric conversion material layers 3N and 3P, the lower charge transport layers 5C and 5D, the heat insulating layers 4A and 4B, the upper charge transport layers 5C and 5D, and the thermoelectric conversion material layers 6N and 6P, respectively. For the thermoelectric property evaluation samples, Al electrodes having sides of 20 mm×20 mm and a thickness of 0.2 mm, and for the thermal conductivity measurement samples, Al electrodes having sides of 50 m×50 m and a thickness of 0.2 mm were soldered onto a lower part and an upper part of each of the thermoelectric conversion sections 1N and 1P to complete the evaluation samples.

[Preparation of Fifth Evaluation Thermoelectric Conversion Sections]

An n-type thermoelectric conversion section 1N and a p-type thermoelectric conversion section 1P of Embodiment 7 (see FIG. 7) in which a heat insulating material layer provided with through holes is used were prepared in such a manner as described below.

First, in the same manner as in the first evaluation thermoelectric conversion sections, a board of each Bi—Te thermoelectric conversion material having sides of 100 mm×100 mm and a thickness of 2.5 mm was prepared and cut into boards each having sides of 20 mm×20 mm and a thickness of 2.5 mm for a thermoelectric property evaluation sample, and into boards each having sides of 50 mm×50 mm and a thickness of 2.5 mm for a thermal conductivity measurement sample to give thermoelectric conversion material layers 3N, 3P, 6N and 6P.

Glass wool plates each having sides of 20 mm×20 mm and a thickness of 5 mm for the thermoelectric property evaluation samples, and glass wool plates each having sides of 50 mm×50 mm and a thickness of 5 mm for the thermal conductivity measurement samples were prepared as equivalents of the heat insulating layers 4A and 4B of FIG. 7. Through holes with a diameter of 1 mm were formed in the whole area of each glass wool plate on a 5-mm pitch with a drill. Top and bottom surfaces of each glass wool plate and the inside of the through holes were coated with a layer of a mixture of crystalline graphite and graphene synthesized at 1100° C. by a vapor phase method using acetylene as a raw material.

For the thermoelectric property evaluation samples and for the thermal conductivity measurement samples, the respective glass wool plates were bonded to the respective thermoelectric conversion material layer 3N and 3P, and the respective thermoelectric conversion material layers 6N and 6P were bonded to upper surfaces of the respective glass wool plates. For the bonding, a paste of each Bi—Te material was applied and printed so as to have a thickness of approximately 10 µm, and the plates and the layers were bonded under reduced pressure and heating at approximately 580° C. for preventing oxidation of the graphite.

As described above, n-type and p-type thermoelectric conversion sections 1N and 1P having triple-layer structures were prepared for the thermoelectric property evaluation samples and for the thermal conductivity measurement samples, the triple-layer structures including the thermoelectric conversion material layers 3N and 3P, the heat insulating layers 4A and 4B, and the thermoelectric conversion material layers 6N and 6P, respectively. For the thermoelectric property evaluation samples, Al electrodes having sides of 20 mm×20 mm and a thickness of 0.2 mm, and for the thermal conductivity measurement samples, Al electrodes having sides of 50 m×50 m and a thickness of 0.2 mm were soldered onto a lower part and an upper part of each of the thermoelectric conversion sections 1N and 1P to complete the evaluation samples.

[Preparation of Comparative Thermoelectric Conversion Sections]

First, an n-type thermoelectric conversion section 1N and a p-type thermoelectric conversion section 1P of Comparative Embodiment 1 (see FIG. 16) were prepared in such a manner as described below.

A board of each Bi—Te thermoelectric conversion material prepared in the same manner as in the first evaluation thermoelectric conversion sections and having sides of 100 mm×100 mm and a thickness of 10 mm was cut into an evaluation sample size of 20 mm×20 mm for a thermoelectric property evaluation sample and into an evaluation sample size of 50 mm×50 mm for a thermal conductivity measurement sample, and the cut faces thereof were ground to give comparative thermoelectric conversion sections 1N and 1P. For the thermoelectric property evaluation samples, Al electrodes having sides of 20 mm×20 mm and a thickness of 0.2 mm, and for the thermal conductivity measurement samples, Al electrodes having sides of 50 m×50 m and a thickness of 0.2 mm were soldered onto a lower part and an upper part of each of the comparative n-type and p-type thermoelectric conversion sections 1N and 1P to complete the comparative samples.

[Evaluation Method]

The performance of the thermoelectric conversion sections was evaluated as follows.

1) Electric conductivity: The electric conductivity was measured with a thermoelectric property evaluation instrument ZEM-3 produced by ULVAC-RIKO, Inc. A platinum wire was attached to each thermoelectric conversion material processed into a cylindrical shape, and the electric conductivity was measured at room temperature by a direct-current four-terminal method.

2) Seebeck coefficient: The Seebeck coefficient was measured with a thermoelectric property evaluation instrument ZEM-3 produced by ULVAC-RIKO, Inc. The measurement conditions were the same as those for the electric conductivity evaluation.

3) Thermal conductivity: The thermal conductivity was measured with a steady-state thermal conductivity measuring apparatus GH-1 produced by ULVAC-RIKO, Inc.

Table 1 shows evaluation results of the first to fifth evaluation thermoelectric conversion sections and of the comparative thermoelectric conversion sections prepared as described above. The first evaluation thermoelectric conversion sections and the second evaluation thermoelectric conversion sections have anisotropic conductive material layers but are comparable in performance index to the comparative thermoelectric conversion sections. This means that the graphite and the charge transport material used for the anisotropic conductive material layers do not have an adverse effect on the thermoelectric conversion materials. The first evaluation thermoelectric conversion sections and the second evaluation thermoelectric conversion sections have element structures in which the heat generation effect part is configurationally separated from the endothermic effect part by the anisotropic conductive material layer thereby to reduce the amount of heat: $Q_K$ that is conducted between the heat generation effect part and the endothermic effect part. However, the steady-state thermal conductivity measuring apparatus GH-1 used for the thermal conductivity measurement cannot configurationally separate the heat generation effect part from the endothermic effect part of each evaluation thermoelectric conversion section in measurement. That is, the performance index of the first evaluation thermoelectric conversion sections and the second evaluation thermoelectric conversion sections shown in Table 1 is not to evaluate the effect of the element structures allowing the configurational separation and do not represent the ability of the element structures. On the other hand, the performance index of the third to fifth evaluation thermoelectric conversion sections is improved to be 50 times to 150 times the performance index of the comparative thermoelectric conversion sections. This means that the thermoelectric conversion elements can ensure high electric conductivity and low thermal conductivity to achieve high thermoelectric conversion efficiency by configurationally separating the thermal conduction part from the electric conduction part of each thermoelectric conversion element using the cavities or the heat insulating layers and the charge transport layers.

TABLE 1

| No. | Type | Seebeck coefficient µV/K | Electric conductivity S/m | Thermal conductivity W/(m · k) | Performance index /k |
|---|---|---|---|---|---|
| 1$^{st}$ evaluation thermoelectric conversion section | n | 182 | 91200 | 1.362 | $2.22 \times 10^{-3}$ |
|  | p | 175 | 95100 | 1.448 | $2.01 \times 10^{-3}$ |
| 2$^{nd}$ evaluation thermoelectric conversion section | n | 182 | 91300 | 1.366 | $2.21 \times 10^{-3}$ |
|  | p | 175 | 95100 | 1.450 | $2.01 \times 10^{-3}$ |
| 3$^{rd}$ evaluation thermoelectric conversion section | n | 182 | 481700 | 0.049 | $3.22 \times 10^{-3}$ |
|  | p | 175 | 481600 | 0.050 | $2.92 \times 10^{-3}$ |
| 4$^{th}$ evaluation thermoelectric conversion section | n | 182 | 482500 | 0.054 | $2.80 \times 10^{-3}$ |
|  | p | 175 | 481700 | 0.055 | $2.53 \times 10^{-3}$ |
| 5$^{th}$ evaluation thermoelectric conversion section | n | 182 | 550600 | 0.062 | $2.78 \times 10^{-3}$ |
|  | p | 175 | 554100 | 0.060 | $2.67 \times 10^{-3}$ |
| Comparative | n | 182 | 91400 | 1.365 | $2.22 \times 10^{-3}$ |
| thermoelectric conversion section | p | 175 | 95200 | 1.452 | $2.01 \times 10^{-3}$ |

EXAMPLES

The Examples to be describe below were prepared as follows.

Example 1

An element of Embodiment 1 (FIG. 1) was prepared as described in (1-1) to (1-4) below. The element was prepared basically in the same manner as in the first evaluation thermoelectric conversion sections (see preparation of first evaluation thermoelectric conversion sections).

(1-1)

A graphite sheet (product by OTSUKA DENKI KK) as an equivalent of the anisotropic conductive material layer 5A was laminated to a board of an n-type thermoelectric conversion material ($Bi_2Te_{2.7}Se_{0.3}$) having sides of 100 mm×150 mm and a thickness of 10 mm as an equivalent of the thermoelectric conversion material layer 3N by thermal compression bonding to give an n-type thermoelectric conversion section 1N. The graphite sheet had sides of 100 mm×150 mm and a thickness of 50 µm, and laminated by forming, on a mating surface of the graphite sheet, a Bi—Te material layer having a thickness of approximately 10 µm with a paste of an n-type Bi—Te material having the same composition as the board, bringing the Bi—Te material board and the graphite sheet into close contact, and thermally compressing the same. Thus, the n-type thermoelectric conversion section 1N was formed to have a double-layer structure of the n-type thermoelectric conversion material layer 3N and the anisotropic conductive material layer 5A made of graphite.

(1-2)

A graphite sheet as an equivalent of the anisotropic conductive material layer 5B was laminated to a board of a p-type thermoelectric conversion material ($Bi_{0.5}Sb_{1.5}Te_3$) having sides of 100 mm×150 mm and a thickness of 10 mm as an equivalent of the thermoelectric conversion material layer 3P by thermal compression bonding to give a p-type thermoelectric conversion section 1P. The graphite sheet had sides of 100 mm×150 mm and a thickness of 50 µm, and laminated by forming, on a mating surface of the graphite sheet, a Bi—Te material layer having a thickness of approximately 10 µm with a paste of a p-type Bi—Te material having the same composition as the board, bringing the Bi—Te material board and the graphite sheet into close contact, and thermally compressing the same. Thus, the p-type thermoelectric conversion section 1P was formed to have a double-layer structure of the p-type thermoelectric conversion material layer 3P and the anisotropic conductive material layer 5B made of graphite.

(1-3)

An insulating layer 9 made of a glass wool plate having sides of 100 mm×10 mm and a height of 10.5 mm was formed on a center of a conductive substrate 2 made of an Al board having sides of 100 mm×310 mm and a thickness of 0.4 mm, and the n-type thermoelectric conversion section 1N and the p-type thermoelectric conversion section 1P were arranged on the conductive substrate 2 so that they were opposed to each other with the insulating layer 9 therebetween. An Al paste was used for the bonding with the conductive substrate 2.
(1-4)
An electrode 8A and an electrode 8B each made of an Al board having sides of 50 mm×50 mm and a thickness of 0.2 mm were arranged on upper end regions of the anisotropic conductive material layers 5A and 5B, respectively. (See FIG. 1.)

Next, a voltage/current was applied to the thermoelectric conversion element 1A (1) prepared as described above, and then a temperature change was examined to evaluate the element. A thermocouple was set at a temperature measurement point TP shown in FIG. 1, and a voltage/current of 8V/8 A was applied between the electrode 8A and the electrode 8B under an environment at a room temperature of 25° C. and a relative humidity of 50%. At the time, the temperature change at the temperature measurement point TP was ΔT: −22K.

Example 2

An element of Embodiment 1 (FIG. 1) was prepared as described in (2-1) to (2-4) below. The element was prepared basically in the same manner as in the second evaluation thermoelectric conversion sections (see preparation of second evaluation thermoelectric conversion sections).
(2-1)
A solution for formation of a low conductivity material layer prepared so as to have the composition specified below was applied onto an n-type thermoelectric conversion material ($Bi_2Te_{2.7}Se_{0.3}$) having sides of 100 mm×150 mm and a thickness of 10 mm as an equivalent of the thermoelectric conversion material layer 3N by a spin coating method, dried and sintered at 200° C. for 60 minutes to remove the solvent, thereby to give a low conductivity material layer having a thickness of approximately 1 μm. The low conductivity material layer was formed so as to have an electric conductivity of approximately 5 S/cm.
(Solution for Formation of Low Conductivity Material Layer of n-Type Thermoelectric Conversion Section 1N)
  Polycarbonate resin: 100 parts
  Diphenoquinone compound (Formula 1): 15 parts
  Tetrahydrofuran solvent: 300 parts
Subsequently, a charge transport material: Alq3 (aluminato-tris-8B-hydoroxyquinolate: Formula 3) was applied by a resistance heating vapor deposition method to form a high conductivity material layer on a surface of the low conductivity material layer formed. The coat layer was formed so as to have a thickness of approximately 100 nm and an in-plane electric conductivity of approximately 300 S/cm. Thus, the n-type thermoelectric conversion section 1N was formed to have a double-layer structure of the n-type thermoelectric conversion material layer 3N and an anisotropic conductive material layer 5A including the low conductivity material layer and the high conductivity material layer.
(2-2)
A solution for formation of a low conductivity material layer prepared so as to have the composition specified below was applied onto a p-type thermoelectric conversion material ($Bi_{0.5}Sb_{1.5}Te_3$) having sides of 100 mm×150 mm and a thickness of 10 mm as an equivalent of the thermoelectric conversion material layer 3P by a spin coating method, dried and sintered at 200° C. for 60 minutes to remove the solvent, thereby to give a low conductivity material layer having a thickness of approximately 1 μm. The low conductivity material layer was formed so as to have an electric conductivity of approximately 5 S/cm.
(Solution for Formation of Low Conductivity Material Layer of p-Type Thermoelectric Conversion Section 1P)
  Polycarbonate resin: 100 parts
  Hydrazone compound (Formula 2): 20 parts
  Tetrahydrofuran solvent: 300 parts
Subsequently, a hole transport material: NPP (N,N-di (naphthalene-1-yl)-N,N-diphenyl-benzidene) was applied by a resistance heating vapor deposition method to form a high conductivity material layer on a surface of the low conductivity material layer formed. The coat layer was formed so as to have a thickness of approximately 100 nm and an in-plane electric conductivity of 300 S/cm. Thus, the p-type thermoelectric conversion section 1P was formed to have a double-layer structure of the p-type thermoelectric conversion material layer 3P and an anisotropic conductive material layer 5B including the low conductivity material layer and the high conductivity material layer.
(2-3)
An insulating layer 9 made of a glass wool plate having sides of 100 mm×10 mm and a height of 10.5 mm was formed on a center of a conductive substrate 2 made of an Al board having sides of 100 mm×310 mm and a thickness of 0.4 mm, and the n-type thermoelectric conversion section 1N and the p-type thermoelectric conversion section 1P were arranged on the conductive substrate 2 so that they were opposed to each other with the insulating layer 9 therebetween. An Al paste was used for the bonding with the conductive substrate 2.
(2-4)
An electrode 8A and an electrode 8B each made of an Al board having sides of 50 mm×50 mm and a thickness of 0.2 mm were arranged on upper end regions of the anisotropic conductive material layers 5A and 5B, respectively. (See FIG. 1.)

Next, a voltage/current was applied to the thermoelectric conversion element 1A (2) prepared as described above, and then a temperature change was examined to evaluate the element. A thermocouple was set at the temperature measurement point TP shown in FIG. 1, and a voltage/current of 8V/8 A was applied between the electrode 8A and the electrode 8B under an environment at a room temperature of 25° C. and a relative humidity of 50%. At the time, the temperature change at the temperature measurement point TP was ΔT: −21K.

Example 3

An element of Embodiment 2 (FIG. 2) was prepared as described in (3-1) to (3-4) below.
(3-1)
A graphite sheet (product by OTSUKA DENKI KK) as an equivalent of the anisotropic conductive material layer 5A was laminated to a board of an n-type thermoelectric conversion material ($Bi_2Te_{2.7}Se_{0.3}$) having sides of 100 mm×100 mm and a thickness of 10 mm as an equivalent of the thermoelectric conversion material layer 3N by thermal compression bonding to give an n-type thermoelectric conversion section 1N. The graphite sheet had sides of 100 mm×150 mm and a thickness of 50 μm, and was laminated by forming, on a thermal compression bonding surface of the graphite sheet, a Bi—Te material layer having a thickness of approximately 10 μm with a paste of an n-type Bi—Te material having the same composition as the board, bringing the Bi—Te material board and the graphite sheet into close contact, and thermally compressing the same. Thus, the n-type thermoelectric conversion section 1N was formed to have a double-layer structure of the n-type thermoelectric conversion material layer 3N and the anisotropic conductive material layer 5A made of graphite. In the case of this structure, the graphite sheet has a wider width than the n-type thermoelectric conversion material layer 3N, and thus the anisotropic conductive material layer 5A has an extended portion protruded from the laminated portion.

(3-2)

A graphite sheet (product by OTSUKA DENKI KK) as an equivalent of the anisotropic conductive material layer 5B was laminated to a board of a p-type thermoelectric conversion material ($Bi_{0.5}Sb_{1.5}Te_3$) having sides of 100 mm×100 mm and a thickness of 10 mm as an equivalent of the thermoelectric conversion material layer 3P by thermal compression bonding to give a p-type thermoelectric conversion section 1P. The graphite sheet had sides of 100 mm×150 mm and a thickness of 50 μm, and was laminated by forming, on a thermal compression bonding surface of the graphite sheet, a Bi—Te material layer having a thickness of approximately 10 μm with a paste of a p-type Bi—Te material having the same composition as the board, bringing the Bi—Te material board and the graphite sheet into close contact, and thermally compressing the same. Thus, the p-type thermoelectric conversion section 1P was formed to have a double-layer structure of the p-type thermoelectric conversion material layer 3P and the anisotropic conductive material layer 5B made of graphite. In the case of this structure, the graphite sheet has a wider width than the p-type thermoelectric conversion material layer 3P, and thus the anisotropic conductive material layer 5B has an extended portion protruded from the laminated portion.

(3-3)

An insulating layer 9 made of a glass wool plate having sides of 100 mm×10 mm and a height of 10.5 mm was formed on a center of a conductive substrate 2 made of an Al board having sides of 100 mm×210 mm and a thickness of 0.4 mm, and the n-type thermoelectric conversion section 1N and the p-type thermoelectric conversion section 1P were arranged on the conductive substrate 2 so that they were opposed to each other with the insulating layer 9 therebetween. An Al paste was used for the bonding with the conductive substrate 2.

(3-4)

Electrodes 8A and 8B each made of an Al board having sides of 50 mm×50 mm and a thickness of 0.2 mm were arranged on the extended portions of the anisotropic conductive material layers 5A and 5B, respectively. (See FIG. 2.)

Next, a voltage/current was applied to the thermoelectric conversion element 1B prepared as described above, and then a temperature change was examined to evaluate the element. A thermocouple was set at a temperature measurement point TP shown in FIG. 2, and a voltage/current of 8V/8 A was applied between the electrode 8A and the electrode 8B under an environment at a room temperature of 25° C. and a relative humidity of 50%. At the time, the temperature change at the temperature measurement point TP was ΔT: −28K.

Example 4

An element of Embodiment 3 (FIG. 3) was prepared as described in (4-1) to (4-4) below.

(4-1)

A PGS graphite sheet (product by Panasonic Corporation) as an equivalent of the anisotropic conductive material layer 5A was laminated to a board of an n-type thermoelectric conversion material ($Bi_2Te_{2.7}Se_{0.3}$) having sides of 100 mm×100 mm and a thickness of 10 mm as an equivalent of the thermoelectric conversion material layer 3N by thermal compression bonding to give an n-type thermoelectric conversion section 1N. The graphite sheet had sides of 100 mm×150 mm and a thickness of 50 μm, and was laminated by forming, on a thermal compression bonding surface of the graphite sheet, a Bi—Te material layer having a thickness of approximately 10 μm with a paste of an n-type Bi—Te material having the same composition as the board, bringing the Bi—Te material board and the graphite sheet into close contact, and thermally compressing the same. Thus, the n-type thermoelectric conversion section 1N was formed to have a double-layer structure of the n-type thermoelectric conversion material layer 3N and the anisotropic conductive material layer 5A made of graphite. In the case of this structure, the graphite sheet has a wider width than the n-type thermoelectric conversion material layer 3N, and thus the anisotropic conductive material layer 5A has an extended portion protruded from the laminated portion.

(4-2)

A PGS graphite sheet (product by Panasonic Corporation) as an equivalent of the anisotropic conductive material layer 5B was laminated to a board of a p-type thermoelectric conversion material ($Bi_{0.5}Sb_{1.5}Te_3$) having sides of 100 mm×100 mm and a thickness of 10 mm as an equivalent of the thermoelectric conversion material layer 3P by thermal compression bonding to give a p-type thermoelectric conversion section 1P. The graphite sheet had sides of 100 mm×150 mm and a thickness of 50 μm, and was laminated by forming, on a thermal compression bonding surface of the graphite sheet, a Bi—Te material layer having a thickness of approximately 10 μm with a paste of a p-type Bi—Te material having the same composition as the board, bringing the Bi—Te material board and the graphite sheet into close contact, and thermally compressing the same. Thus, the p-type thermoelectric conversion section 1P was formed to have a double-layer structure of the p-type thermoelectric conversion material layer 3P and the anisotropic conductive material layer 5B made of graphite. In the case of this structure, the graphite sheet has a wider width than the p-type thermoelectric conversion material layer 3P, and thus the anisotropic conductive material layer 5B has an extended portion protruded from the laminated portion.

(4-3)

An insulating layer 9 made of a glass wool plate having sides of 100 mm×10 mm and a height of 10.5 mm was formed on a center of a conductive substrate 2 made of an Al board having sides of 100 mm×210 mm and a thickness of 0.4 mm, and the n-type thermoelectric conversion section 1N and the p-type thermoelectric conversion section 1P were arranged on the conductive substrate 2 so that they were opposed to each other with the insulating layer 9 therebetween. An Al paste was used for the bonding with the conductive substrate 2.

(4-4)

Electrodes 8A and 8B each made of an Al board having sides of 50 mm×50 mm and a thickness of 0.2 mm were arranged beneath the extended portions of the anisotropic conductive material layers 5A and 5B, respectively. (See FIG. 3.)

Next, a voltage/current was applied to the thermoelectric conversion element 1C prepared as described above, and then a temperature change was examined to evaluate the element. A thermocouple was set at a temperature measurement point TP shown in FIG. 3, and a voltage/current of 8V/8 A was applied between the electrode 8A and the electrode 8B under an environment at a room temperature of 25° C. and a relative humidity of 50%. At the time, the temperature change at the temperature measurement point TP was ΔT: −29K.

Example 5

A thermoelectric conversion element 1D of Embodiment 4 (FIG. 4) was prepared as described in (5-1) to (5-4) below. The element was prepared basically in the same manner as in the third evaluation thermoelectric conversion sections (see preparation of third evaluation thermoelectric conversion sections).

(5-1)

One end region of a PGS graphite sheet (product by Panasonic Corporation) having sides of 100 mm×310 mm and a thickness of 50 μm as an equivalent of the charge transport layer 5C was laminated to a board of an n-type thermoelectric conversion material ($Bi_2Te_{2.7}Se_{0.3}$) having sides of 100 mm×150 mm and a thickness of 5 mm as an equivalent of the thermoelectric conversion material layer 3N by thermal compression bonding. Subsequently, a board of an n-type thermoelectric conversion material ($Bi_2Te_{2.7}Se_{0.3}$) having sides of 100 mm×150 mm and a thickness of 5 mm as an equivalent of the thermoelectric conversion material layer 6N was laminated to an upper surface of the other end region of the graphite sheet, which upper surface corresponds to an upper surface of the upper graphite layer 5C. Subsequently, a glass wool plate having sides of 100 mm×5 mm and a thickness of 20.5 mm as an equivalent of the insulating layer 9 was prepared, and the glass wool plate as the equivalent of the insulating layer 9, a side surface of the thermoelectric conversion material layer 3N, the remaining region of the graphite sheet and a side surface of a thermoelectric conversion material layer 6N were bonded together. For the bonding, a paste of the above-mentioned Bi—Te material was used. As described above, an n-type thermoelectric conversion section 1N was formed to have a five-layer structure of the n-type thermoelectric conversion material layer 3N, the lower charge transport layer 5C made of graphite, a cavity (air layer), the upper charge transport layer 5C made of graphite and the n-type thermoelectric conversion material layer 6N.

(5-2)

One end region of a PGS graphite sheet (product by Panasonic Corporation) having sides of 100 mm×310 mm and a thickness of 50 μm as an equivalent of the charge transport layer 5D was laminated to a board of a p-type thermoelectric conversion material ($Bi_{0.5}Sb_{1.5}Te_3$) having sides of 100 mm×150 mm and a thickness of 5 mm as an equivalent of the thermoelectric conversion material layer 3P by thermal compression bonding. Subsequently, a board of a p-type thermoelectric conversion material ($Bi_{0.5}Sb_{1.5}Te_3$) having sides of 100 mm×150 mm and a thickness of 5 mm as an equivalent of the thermoelectric conversion material layer 6P was laminated to an upper surface of the other end region of the graphite sheet, which upper surface corresponds to an upper surface of the upper graphite layer 5D. Subsequently, a glass wool plate having sides of 100 mm×5 mm and a thickness of 20.5 mm as an equivalent of the insulating layer 9 was prepared, and the glass wool plate as the equivalent of the insulating layer 9, a side surface of the thermoelectric conversion material layer 3P, the remaining region of the graphite sheet and a side surface of a thermoelectric conversion material layer 6P were bonded together. For the bonding, a paste of the above-mentioned Bi—Te material was used. As described above, a p-type thermoelectric conversion section 1P was formed to have a five-layer structure of the p-type thermoelectric conversion material layer 3P, the lower charge transport layer 5D made of graphite, a cavity (air layer), the upper charge transport layer 5D made of graphite and the p-type thermoelectric conversion material layer 6P.

(5-3)

The n-type thermoelectric conversion section 1N and the p-type thermoelectric conversion section 1P were bonded onto a conductive substrate 2 made of an Al board having sides of 100 mm×310 mm and a thickness of 0.4 mm. An Al paste was used for the bonding with the conductive substrate 2. The insulating layers 9 made of the glass wool plates of the n-type thermoelectric conversion section 1N and the p-type thermoelectric conversion section 1P were brought into close contact with a center of the Al substrate and disposed on the conductive substrate so that the n-type thermoelectric conversion section 1N and the p-type thermoelectric conversion section 1P were opposed to each other with the insulating layers 9 therebetween.

(5-4)

Electrodes 8A and 8B each made of an Al board having sides of 100 mm×150 mm and a thickness of 0.2 mm were arranged on the thermoelectric conversion material layers 6N and 6P, respectively. (See FIG. 4.)

Next, a voltage/current was applied to the thermoelectric conversion element 1D (1) prepared as described above, and then a temperature change was examined to evaluate the element. A thermocouple was set at a temperature measurement point TP shown in FIG. 4, and a voltage/current of 8V/8 A was applied between the electrode 8A and the electrode 8B under an environment at a room temperature of 25° C. and a relative humidity of 50%. At the time, the temperature change at the temperature measurement point TP was ΔT: −37K.

Example 6

A thermoelectric conversion element 1E of Embodiment 5 (FIG. 5) was prepared as described in (6-1) to (6-4) below. The element was prepared basically in the same manner as in the forth evaluation thermoelectric conversion sections (see preparation of forth evaluation thermoelectric conversion sections).

(6-1)

One end region of a PGS graphite sheet (product by Panasonic Corporation) having sides of 100 mm×310 mm and a thickness of 50 μm as an equivalent of the charge transport layer 5C was laminated to a board of an n-type thermoelectric conversion material ($Bi_2Te_{2.7}Se_{0.3}$) having sides of 100 mm×150 mm and a thickness of 5 mm as an equivalent of the thermoelectric conversion material layer 3N by thermal compression bonding. Subsequently, a lower surface of a glass wool plate having sides of 100 mm×150 mm and a thickness of 10 mm as an equivalent of the heat insulating layer 4A was bonded onto the laminated region of the graphite layer, and the remaining region of the graphite sheet was bonded to a side surface and an upper surface of the glass wool plate as the equivalent of the heat insulating layer 4A. Subsequently, a board of an n-type thermoelectric conversion material ($Bi_2Te_{2.7}Se_{0.3}$) having sides of 100 mm×150 mm and a thickness of 5 mm as an equivalent of the thermoelectric conversion material layer 6N was laminated to an upper surface of the graphite sheet, which upper surface corresponds to an uppermost region of the graphite layer. For the bonding, a paste of the above-mentioned Bi—Te material was used. As described above, an n-type thermoelectric conversion section 1N was formed to have a five-layer structure of the n-type thermoelectric conversion material layer 3N, the lower charge transport layer 5C made of graphite, the heat insulating layer 4A, the upper charge transport layer 5C made of graphite and the n-type thermoelectric conversion material layer 6N.

(6-2)

One end region of a PGS graphite sheet (product by Panasonic Corporation) having sides of 100 mm×310 mm and a thickness of 50 μm as an equivalent of the charge transport layer 5D was laminated to a board of a p-type thermoelectric conversion material ($Bi_{0.5}Sb_{1.5}Te_3$) having sides of 100 mm×150 mm and a thickness of 5 mm as an equivalent of the thermoelectric conversion material layer 3P by thermal compression bonding. Subsequently, a lower surface of a glass wool plate having sides of 100 mm×150 mm and a thickness of 10 mm as an equivalent of the heat insulating layer 4B was bonded onto the laminated region of the graphite layer, and the remaining region of the graphite sheet was bonded to a side surface and an upper surface of the glass wool plate as the equivalent of the heat insulating layer 4B. Subsequently, a board of a p-type thermoelectric conversion material ($Bi_{0.5}Sb_{1.5}Te_3$) having sides of 100 mm×150 mm and a thickness of 5 mm as an equivalent of the thermoelectric conversion material layer 6P was laminated to an upper surface of the graphite sheet, which upper surface corresponds to an uppermost region of the graphite layer. For the bonding, a paste of the above-mentioned Bi—Te material was used. As described above, a p-type thermoelectric conversion section 1P was formed to have a five-layer structure of the p-type thermoelectric conversion material layer 3P, the lower charge transport layer 5D made of graphite, the heat insulating layer 4B, the upper charge transport layer 5D made of graphite and the p-type thermoelectric conversion material layer 6P.

(6-3)

An insulating layer 9 made of a glass wool plate having sides of 100 mm×10 mm and a height of 20.5 mm was formed on a center of a conductive substrate 2 made of an Al board having sides of 100 mm×310 mm and a thickness of 0.4 mm, and the n-type thermoelectric conversion section 1N and the p-type thermoelectric conversion section 1P were arranged on the conductive substrate 2 so that they were opposed to each other with the insulating layer 9 therebetween. An Al paste was used for the bonding with the conductive substrate 2.

(6-4)

Electrodes 8A and 8B each made of an Al board having sides of 100 mm×150 mm and a thickness of 0.2 mm were arranged on the thermoelectric conversion material layers 6N and 6P, respectively. (See FIG. 5.)

Next, a voltage/current was applied to the thermoelectric conversion element 1E prepared as described above, and then a temperature change was examined to evaluate the element. A thermocouple was set at a temperature measurement point TP shown in FIG. 5, and a voltage/current of 8V/8 A was applied between the electrode 8A and the electrode 8B under an environment at a room temperature of 25° C. and a relative humidity of 50%. At the time, the temperature change at the temperature measurement point TP was ΔT: −36K.

Example 7

A thermoelectric conversion element 1F of Embodiment 6 (FIG. 6) was prepared as described in (7-1) to (7-4) below.

(7-1)

One end region of a PGS graphite sheet (product by Panasonic Corporation) having sides of 100 mm×210 mm and a thickness of 50 μm as an equivalent of the charge transport layer 5C was laminated to a board of an n-type thermoelectric conversion material ($Bi_2Te_{2.7}Se_{0.3}$) having sides of 100 mm×100 mm and a thickness of 5 mm as an equivalent of the thermoelectric conversion material layer 3N by thermal compression bonding. Subsequently, a lower surface of a glass wool plate having sides of 100 mm×100 mm and a thickness of 10 mm as an equivalent of the heat insulating layer 4A was bonded onto the laminated region of the graphite layer, and the remaining region of the graphite sheet was bonded to a side surface and an upper surface of the glass wool plate. Subsequently, a board of an n-type thermoelectric conversion material ($Bi_2Te_{2.7}Se_{0.3}$) having sides of 100 mm×100 mm and a thickness of 5 mm as an equivalent of the thermoelectric conversion material layer 6N was laminated to an upper surface of the graphite sheet, which upper surface corresponds to an uppermost region of the graphite layer, and a graphite sheet (product by Panasonic Corporation) having sides of 100 mm×150 mm and a thickness of 50 μm as an equivalent of the anisotropic conductive material layer 5A was laminated to the board as the equivalent of the thermoelectric conversion material layer 6N by thermal compression bonding to give an n-type thermoelectric conversion section 1N. For the bonding, a paste of the above-mentioned Bi—Te material was used. As described above, an n-type thermoelectric conversion section 1N was formed to have a six-layer structure of the n-type thermoelectric conversion material layer 3N, the lower charge transport layer 5C, the heat insulating layer 4A, the upper charge transport layer 5C, the n-type thermoelectric conversion material layer 6N and the anisotropic conductive material layer 5A. In the case of this structure, the graphite sheet has a wider width than the n-type thermoelectric conversion material layer 6N, and thus the anisotropic conductive material layer 5A has an extended portion protruded from the laminated portion.

(7-2)

One end region of a PGS graphite sheet (product by Panasonic Corporation) having sides of 100 mm×210 mm and a thickness of 50 μm as an equivalent of the charge transport layer 5D was laminated to a board of a p-type thermoelectric conversion material ($Bi_{0.5}Sb_{1.5}Te_3$) having sides of 100 mm×100 mm and a thickness of 5 mm as an equivalent of the thermoelectric conversion material layer 3P by thermal compression bonding. Subsequently, a lower surface of a glass wool plate having sides of 100 mm×100 mm and a thickness of 10 mm as an equivalent of the heat insulating layer 4B was bonded onto the laminated region of the graphite layer, and the remaining region of the graphite sheet was bonded to a side surface and an upper surface of the glass wool plate.

Subsequently, a board of a p-type thermoelectric conversion material ($Bi_{0.5}Sb_{1.5}Te_3$) having sides of 100 mm×150 mm and a thickness of 5 mm as an equivalent of the thermoelectric conversion material layer 6P was laminated to an upper surface of the graphite sheet, which upper surface corresponds to an uppermost region of the graphite layer, and a graphite sheet (product by Panasonic Corporation) having sides of 100 mm×150 mm and a thickness of 50 μm as an equivalent of the anisotropic conductive material layer 5B was laminated to the board as the equivalent of the thermoelectric conversion material layer 6P by thermal compression bonding to give a p-type thermoelectric conversion section 1P. As described above, the p-type thermoelectric conversion section was formed to have a six-layer structure of the p-type thermoelectric conversion material layer 3P, the lower charge transport layer 5D, the heat insulating layer 4B, the upper charge transport layer 5D, the p-type thermoelectric conversion material layer 6P and the anisotropic conductive material layer 5B. For the bonding, a paste of the above-mentioned Bi—Te material was used. In the case of this structure, the graphite sheet has a wider width than the p-type thermoelectric conversion material layer 6P, and thus the anisotropic conductive material layer 5B has an extended portion protruded from the laminated portion.

(7-3)

An insulating layer 9 made of a glass wool plate having sides of 100 mm×10 mm and a height of 20.5 mm was formed on a center of a conductive substrate 2 made of an Al board having sides of 100 mm×210 mm and a thickness of 0.4 mm, and the n-type thermoelectric conversion section 1N and the p-type thermoelectric conversion section 1P were arranged on the conductive substrate 2 so that they were opposed to each other with the insulating layer 9 therebetween. An Al paste was used for the bonding with the conductive substrate 2.

(7-4)

Electrodes 8A and 8B each made of an Al board having sides of 100 mm×150 mm and a thickness of 0.2 mm were arranged on the extended portions of the anisotropic conductive material layers 5A and 5B, respectively. (See FIG. 6.)

Next, a voltage/current was applied to the thermoelectric conversion element 1F prepared as described above, and then a temperature change was examined to evaluate the element. A thermocouple was set at a temperature measurement point TP shown in FIG. 6, and a voltage/current of 8V/8 A was applied between the electrode 8A and the electrode 8B under an environment at a room temperature of 25° C. and a relative humidity of 50%. At the time, the temperature change at the temperature measurement point TP was ΔT: −39K.

Example 8

A thermoelectric conversion element 1G of Embodiment 7 (FIG. 7) was prepared as described in (8-1) to (8-4) below. The element was prepared basically in the same manner as in the fifth evaluation thermoelectric conversion sections (see preparation of fifth evaluation thermoelectric conversion sections).

(8-1)

A glass wool plate having sides of 100 mm×150 mm and a thickness of 10 mm, and having through holes with a diameter of 2 mm on a 10-mm pitch in the whole area thereof was prepared as an equivalent of the heat insulating layer 4A, and top and bottom surfaces of the glass wool plate and the inside of the through holes were coated with a layer of a mixture of crystalline graphite and graphene synthesized at 1100° C. by a vapor phase method using acetylene as a raw material. The glass wool plate coated with the charge transport material was bonded to a board of an n-type thermoelectric conversion material ($Bi_2Te_{2.7}Se_{0.3}$) having sides of 100 mm×150 mm and a thickness of 5 mm as an equivalent of the thermoelectric conversion material layer 3N. Subsequently, a board of an n-type thermoelectric conversion material ($Bi_2Te_{2.7}Se_{0.3}$) having sides of 100 mm×150 mm and a thickness of 5 mm as an equivalent of the thermoelectric conversion material layer 6N was laminated to an upper surface of the glass wool plate. For the bonding, a paste of the above-mentioned Bi—Te material was used. As described above, an n-type thermoelectric conversion section 1N was formed to have a triple-layer structure of the n-type thermoelectric conversion material layer 3N, the heat insulating layer 4A and the n-type thermoelectric conversion material layer 6N.

(8-2)

A glass wool plate having sides of 100 mm×150 mm and a thickness of 10 mm, and having through holes with a diameter of 2 mm on a 10-mm pitch in the whole area thereof was prepared as an equivalent of the heat insulating layer 4B, and top and bottom surfaces of the glass wool plate and the inside of the through holes were coated with a layer of a mixture of crystalline graphite and graphene synthesized at 1100° C. by a vapor phase method using acetylene as a raw material. The glass wool plate coated with the charge transport material was bonded to a board of a p-type thermoelectric conversion material ($Bi_{0.5}Sb_{1.5}Te_3$) having sides of 100 mm×150 mm and a thickness of 5 mm as an equivalent of the thermoelectric conversion material layer 3P. Subsequently, a board of a p-type thermoelectric conversion material ($Bi_{0.5}Sb_{1.5}Te_3$) having sides of 100 mm×150 mm and a thickness of 5 mm as an equivalent of the thermoelectric conversion material layer 6P was laminated to an upper surface of the glass wool plate. For the bonding, a paste of the above-mentioned Bi—Te material was used. As described above, a p-type thermoelectric conversion section 1P was formed to have a triple-layer structure of the p-type thermoelectric conversion material layer 3P, the heat insulating layer 4B and the p-type thermoelectric conversion material layer 6P.

(8-3)

An insulating layer 9 made of a glass wool plate having sides of 100 mm×10 mm and a height of 20.5 mm was formed on a center of a conductive substrate 2 made of an Al board having sides of 100 mm×310 mm and a thickness of 0.4 mm, and the n-type thermoelectric conversion section 1N and the p-type thermoelectric conversion section 1P were arranged on the conductive substrate 2 so that they were opposed to each other with the insulating layer 9 therebetween. An Al paste was used for the bonding with the conductive substrate 2.

(8-4)

Electrodes 8A and 8B each made of an Al board having sides of 100 mm×150 mm and a thickness of 0.2 mm were arranged on the thermoelectric conversion material layers 6N and 6P, respectively. (See FIG. 7.)

Next, a voltage/current was applied to the thermoelectric conversion element 1G prepared as described above, and then a temperature change was examined to evaluate the element. A thermocouple was set at a temperature measurement point TP shown in FIG. 7, and a voltage/current of 8V/8 A was applied between the electrode 8A and the electrode 8B under an environment at a room temperature of 25° C. and a relative humidity of 50%. At the time, the temperature change at the temperature measurement point TP was ΔT: −35K.

Example 9

A thermoelectric conversion element 1H of Embodiment 8 (FIG. 8) was prepared as described in (9-1) to (9-4) below.

(9-1)

A glass wool plate having sides of 100 mm×100 mm and a thickness of 10 mm, and having through holes with a diameter of 2 mm on a 10-mm pitch in the whole area thereof was prepared as an equivalent of the heat insulating layer 4A, and top and bottom surfaces of the glass wool plate and the inside of the through holes were coated with a layer of a mixture of crystalline graphite and graphene synthesized at 1100° C. by a vapor phase method using acetylene as a raw material. The glass wool plate coated with the charge transport material was bonded to a board of an n-type thermoelectric conversion material ($Bi_2Te_{2.7}Se_{0.3}$) having sides of 100 mm×150 mm and a thickness of 5 mm as an equivalent of the thermoelectric conversion material layer 3N. Subsequently, a board of an n-type thermoelectric conversion material ($Bi_2Te_{2.7}Se_{0.3}$) having sides of 100 mm×100 mm and a thickness of 5 mm as an equivalent of the thermoelectric conversion material layer 6N was laminated to an upper surface of the glass wool plate, and a graphite sheet (product by Panasonic Corporation) having sides of 100 mm×150 mm and a thickness of 50 µm as an equivalent of the anisotropic conductive material layer 5A was laminated to the board as the equivalent of the thermoelectric conversion material layer 6N by thermal compression bonding to give an n-type thermoelectric conversion section 1N. For the bonding, a paste of the above-mentioned Bi—Te material was used. As described above, an n-type thermoelectric conversion section 1N was formed to have a four-layer structure of the n-type thermoelectric conversion material layer 3N, the heat insulating layer 4A, the n-type thermoelectric conversion material layer 6N and the anisotropic conductive material layer 5A. In the case of this structure, the graphite sheet has a wider width than the n-type thermoelectric conversion material layer 6N, and thus the anisotropic conductive material layer 5A has an extended portion protruded from the laminated portion.

(9-2)

A glass wool plate having sides of 100 mm×100 mm and a thickness of 10 mm, and having through holes with a diameter of 1 mm on a 5-mm pitch in the whole area thereof was prepared as an equivalent of the heat insulating layer 4B, and top and bottom surfaces of the glass wool plate and the inside of the through holes were coated with a layer of a mixture of crystalline graphite and graphene synthesized at 1100° C. by a vapor phase method using acetylene as a raw material. The glass wool plate coated with the charge transport material was bonded to a board of a p-type thermoelectric conversion material ($Bi_{0.5}Sb_{1.5}Te_3$) having sides of 100 mm×100 mm and a thickness of 5 mm as an equivalent of the thermoelectric conversion material layer 3P. Subsequently, a board of a p-type thermoelectric conversion material ($Bi_{0.5}Sb_{1.5}Te_3$) having sides of 100 mm×150 mm and a thickness of 5 mm as an equivalent of the thermoelectric conversion material layer 6P was laminated to an upper surface of the glass wool plate, and a graphite sheet (product by Panasonic Corporation) having sides of 100 mm×150 mm and a thickness of 50 µm as an equivalent of the anisotropic conductive material layer 5B was laminated to the board as the equivalent of the thermoelectric conversion material layer 6P by thermal compression bonding to give a p-type thermoelectric conversion section 1P. As described above, the p-type thermoelectric conversion section was formed to have a four-layer structure of the p-type thermoelectric conversion material layer 3P, the heat insulating layer 4B, the p-type thermoelectric conversion material layer 6P and the anisotropic conductive material layer 5B. For the bonding, a paste of the above-mentioned Bi—Te material was used. In the case of this structure, the graphite sheet has a wider width than the p-type thermoelectric conversion material layer 6P, and thus the anisotropic conductive material layer 5B has an extended portion protruded from the laminated portion.

(9-3)

An insulating layer 9 made of a glass wool plate having sides of 100 mm×10 mm and a height of 20.5 mm was formed on a center of a conductive substrate 2 made of an Al board having sides of 100 mm×210 mm and a thickness of 0.4 mm, and the n-type thermoelectric conversion section 1N and the p-type thermoelectric conversion section 1P were arranged on the conductive substrate 2 so that they were opposed to each other with the insulating layer 9 therebetween. An Al paste was used for the bonding with the conductive substrate 2.

(9-4)

Electrodes 8A and 8B each made of an Al board having sides of 100 mm×150 mm and a thickness of 0.2 mm were arranged on the extended portions of the anisotropic conductive material layers 5A and 5B, respectively. (See FIG. 8.)

Next, a voltage/current was applied to the thermoelectric conversion element 1H prepared as described above, and then a temperature change was examined to evaluate the element. A thermocouple was set at a temperature measurement point TP shown in FIG. 8, and a voltage/current of 8V/8 A was applied between the electrode 8A and the electrode 8B under an environment at a room temperature of 25° C. and a relative humidity of 50%. At the time, the temperature change at the temperature measurement point TP was ΔT: −38K.

Example 10

A thermoelectric conversion element 1I of Embodiment 9 (FIG. 9) was prepared as described in (10-1) to (10-4) below. The porous heat insulating material board used in this Example was formed using the following paste 1 for heat insulating layer formation. For the preparation method thereof, see Embodiment 9. [Formulation of paste 1 for heat insulating layer formation (parts by weight)]

Heat insulating material powder obtained from glass wool board: 100 parts
Melamine resin: 60 parts
Polymethyl methacrylate: 40 parts
Terpineol: 15 parts
Ethylcellulose: 5 parts (10-1)

A porous heat insulating material board having sides of 100 mm×150 mm and a thickness of 10 mm was prepared as an equivalent of the heat insulating layer 4C, and top and bottom surfaces of the heat insulating material board and the inside of the pores were coated with a layer of a mixture of crystalline graphite and graphene synthesized at 1100° C. by a vapor phase method using acetylene as a raw material. The heat insulating material board coated with the charge transport material was bonded to a board of an n-type thermoelectric conversion material ($Bi_2Te_{2.7}Se_{0.3}$) having sides of 100 mm×150 mm and a thickness of 5 mm as an equivalent of the thermoelectric conversion material layer 3N. Subsequently, a board of an n-type thermoelectric conversion material ($Bi_2Te_{2.7}Se_{0.3}$) having sides of 100 mm×150 mm and a thickness of 5 mm as an equivalent of the thermoelectric conversion material layer 6N was laminated to an upper surface of the heat insulating material board. For the bonding, a paste of the above-mentioned Bi—Te material was used. As described above, an n-type thermoelectric conversion section 1N was formed to have a triple-layer structure of the n-type thermoelectric conversion material layer 3N, the heat insulating layer 4C and the n-type thermoelectric conversion material layer 6N.

(10-2)

A porous heat insulating material board having sides of 100 mm×150 mm and a thickness of 10 mm was prepared as an equivalent of the heat insulating layer 4D, and top and bottom surfaces of the heat insulating material board and the inside of the holes were coated with a layer of a mixture of crystalline graphite and graphene synthesized at 1100° C. by a vapor phase method using acetylene as a raw material. The heat insulating material board coated with the charge transport material was bonded to a board of a p-type thermoelectric conversion material ($Bi_{0.5}Sb_{1.5}Te_3$) having sides of 100 mm×150 mm and a thickness of 5 mm as an equivalent of the thermoelectric conversion material layer 3P. Subsequently, a board of a p-type thermoelectric conversion material ($Bi_{0.5}Sb_{1.5}Te_3$) having sides of 100 mm×150 mm and a thickness of 5 mm as an equivalent of the thermoelectric conversion material layer 6P was laminated to an upper surface of the heat insulating material board. For the bonding, a paste of the above-mentioned Bi—Te material was used. As described above, a p-type thermoelectric conversion section 1P was formed to have a triple-layer structure of the p-type thermoelectric conversion material layer 3P, the heat insulating layer 4D and the p-type thermoelectric conversion material layer 6P.

(10-3)

An insulating layer 9 made of a glass wool plate having sides of 100 mm×10 mm and a height of 20.5 mm was formed on a center of a conductive substrate 2 made of an Al board having sides of 100 mm×310 mm and a thickness of 0.4 mm, and the n-type thermoelectric conversion section 1N and the p-type thermoelectric conversion section 1P were arranged on the conductive substrate 2 so that they were opposed to each other with the insulating layer 9 therebetween. An Al paste was used for the bonding with the conductive substrate 2.

(10-4)

Electrodes 8A and 8B each made of an Al board having sides of 100 mm×150 mm and a thickness of 0.2 mm were arranged on the thermoelectric conversion material layers 6N and 6P, respectively. (See FIG. 9.)

Next, a voltage/current was applied to the thermoelectric conversion element 1I prepared as described above, and then a temperature change was examined to evaluate the element. A thermocouple was set at a temperature measurement point TP shown in FIG. 9, and a voltage/current of 8V/8 A was applied between the electrode 8A and the electrode 8B under an environment at a room temperature of 25° C. and a relative humidity of 50%. At the time, the temperature change at the temperature measurement point TP was ΔT: −35K.

Example 11

A thermoelectric conversion power generation device 1J of Embodiment 10 (FIG. 10) was prepared and evaluated for the thermoelectric power generation.

As described in Embodiment 10, the thermoelectric conversion power generation device 1J is a combination of the first thermoelectric conversion element 1Q contributing to electric power generation with the second and third thermoelectric conversion elements 10A and 10B to be used as Peltier elements for giving a stable temperature difference to the first thermoelectric conversion element.

The first thermoelectric conversion element 1Q is a thermoelectric conversion element having a conventional structure of Comparative Embodiment 1 (FIG. 16) and was prepared as described in (11-1) to (11-4) below.

An n-type thermoelectric conversion section 1N was formed using a board of an n-type thermoelectric conversion material ($Bi_2Te_{2.7}Se_{0.3}$) having sides of 100 mm×150 mm and a thickness of 10 mm as the n-type thermoelectric conversion material layer 3N.

(11-2)

A p-type thermoelectric conversion section 1P was formed using a board of a p-type thermoelectric conversion material ($Bi_{0.5}Sb_{1.5}Te_3$) having sides of 100 mm×150 mm and a thickness of 10 mm as the p-type thermoelectric conversion material layer 3P.

(11-3)

An insulating layer 9 made of a glass wool plate having sides of 100 mm×10 mm and a height of 10.5 mm was formed beneath a center of a conductive substrate 2 made of an Al board having sides of 100 mm×310 mm and a thickness of 0.4 mm, and the n-type thermoelectric conversion section 1N and the p-type thermoelectric conversion section 1P were arranged beneath the conductive substrate 2 so that they were opposed to each other with the insulating layer 9 therebetween. An Al paste was used for the bonding with the conductive substrate 2.

(11-4)

Electrodes 8A and 8B each made of an Al board having sides of 100 mm×150 mm and a thickness of 0.2 mm were arranged beneath the thermoelectric conversion material layers 3N and 3P, respectively, with the insulating layer 9 therebetween, and the second and third thermoelectric conversion elements 10A and 10B to be used as Peltier elements were arranged beneath the electrodes 8A and 8B, respectively. (See FIG. 10 and FIG. 16.)

The second and third thermoelectric conversion elements 10A and 10B to be used as Peltier elements of the device of FIG. 10 were prepared as described in (11-5) to (11-8) below. Since the Peltier elements 10A and 10B have the same basic structure as that of Example 3 (FIG. 2, the element of Embodiment 2), the description thereof will be made with reference to FIG. 2 and FIG. 10. FIG. 14 is a perspective view of the Peltier element 10A prepared.

(11-5)

A graphite sheet (product by OTSUKA DENKI KK) as an equivalent of the anisotropic conductive material layer 5A was laminated to a lower surface of a board of an n-type thermoelectric conversion material ($Bi_2Te_{2.7}Se_{0.3}$) having sides of 45 mm×150 mm and a thickness of 10 mm as an equivalent of the thermoelectric conversion material layer 3N by thermal compression bonding to give an n-type thermoelectric conversion section. The graphite sheet had sides of 45 mm×325 mm and a thickness of 50 µm, and was laminated by forming, on a thermal compression bonding surface of the graphite sheet, a Bi—Te material layer having a thickness of approximately 10 µm with a paste of an n-type Bi—Te material having the same composition as the board, bringing the Bi—Te material board and the graphite sheet into close contact, and thermally compressing the same. Thus, the n-type thermoelectric conversion section 1N was formed to have a double-layer structure of the n-type thermoelectric conversion material layer 3N and the anisotropic conductive material layer 5A made of graphite. In the case of this structure, the graphite sheet has a wider width than the n-type thermoelectric conversion material layer 3N, and thus the anisotropic conductive material layer 5A has an extended portion protruded from the laminated portion.

(11-6)

A graphite sheet (product by OTSUKA DENKI KK) as an equivalent of the anisotropic conductive material layer 5B was laminated to a lower surface of a board of a p-type thermoelectric conversion material ($Bi_{0.5}Sb_{1.5}Te_3$) having sides of 45 mm×150 mm and a thickness of 10 mm as an equivalent of the thermoelectric conversion material layer 3P by thermal compression bonding to give a p-type thermoelectric conversion section. The graphite sheet had sides of 45 mm×325 mm and a thickness of 50 and was laminated by forming, on a thermal compression bonding surface of the graphite sheet, a Bi—Te material layer having a thickness of approximately 10 μm with a paste of a p-type Bi—Te material having the same composition as the board, bringing the Bi—Te material board and the graphite sheet into close contact, and thermally compressing the same. Thus, the p-type thermoelectric conversion section 1P was formed to have a double-layer structure of the p-type thermoelectric conversion material layer 3P and the anisotropic conductive material layer 5B made of graphite. In the case of this structure, the graphite sheet has a wider width than the p-type thermoelectric conversion material layer 3P, and thus the anisotropic conductive material layer 5B has an extended portion protruded from the laminated portion.

(11-7)

An insulating layer 9 made of a glass wool plate having sides of 10 mm×150 mm and a height of 10.5 mm was formed on a center of a conductive substrate 2 (10AL and 10BL in FIG. 10) made of an Al board having sides of 100 mm×150 mm and a thickness of 0.4 mm, and the n-type thermoelectric conversion section 1N and the p-type thermoelectric conversion section 1P were arranged beneath the conductive substrate 2 so that they were opposed to each other with the insulating layer 9 therebetween. An Al paste was used for the bonding with the conductive substrate 2.

(11-8)

Electrodes 8A and 8B (10AH and 10BH in FIG. 10) each made of an Al board having sides of 45 mm×150 mm and a thickness of 0.2 mm were arranged beneath end regions of the extended portions protruded from the laminated portions of the anisotropic conductive material layers 5A and 5B, respectively. (See FIG. 2, FIG. 10 and FIG. 14.)

Top and bottom surfaces of the Peltier elements 10A and 10 B prepared as described above were covered and insulated with a PET film (product by Teijin DuPont Films Japan Limited) having a thickness of 100 μm.

The endothermic effect part (electrodes 10AL and 10BL) of the Peltier elements 10A and 10B as shown in FIG. 10 was disposed in contact with the low temperature effect part (electrodes 8A and 8B) of the thermoelectric conversion element 1Q contributing to electric power generation, and the heat generation effect part (electrodes 10AH and 10BH) of the Peltier elements 10A and 10B was disposed in contact with the high temperature effect part (conductive substrate 2) of the thermoelectric conversion element 1Q to form the thermoelectric conversion power generation device 1J.

The thermoelectric conversion power generation device 1J prepared as described above was evaluated for the thermoelectric electric power generation properties. The high temperature effect part (conductive substrate 2) and the low temperature effect part (electrodes 8A and 8B) of the thermoelectric conversion element 1Q were given a temperature difference: ΔT of 350 (K), and a voltage/current of 2V/2 A was applied to the respective Peltier elements 10A and 10B to continuously drive the elements while detecting and evaluating the voltage/current generated between the electrode 8A and the electrode 8B of the thermoelectric conversion power generation element 1Q. A power output of approximately 9.4 W was detected on an average for a power input of 8 W in total.

Example 12

A thermoelectric conversion power generation device 1K of Embodiment 11 (FIG. 11) was prepared and evaluated for the thermoelectric power generation.

As described in Embodiment 11, the thermoelectric conversion power generation device 1K is a combination of the first thermoelectric conversion element 1D contributing to electric power generation with the second and third thermoelectric conversion elements 20A and 20B to be used as Peltier elements for giving a stable temperature difference to the first thermoelectric conversion element.

The first thermoelectric conversion element 1D is an element of Example 5 (Embodiment 4, FIG. 4) and was prepared as described in (12-1) to (12-4) below.

(12-1)

One end region of a PGS graphite sheet (product by Panasonic Corporation) having sides of 100 mm×310 mm and a thickness of 50 μm as an equivalent of the charge transport layer 5C was laminated to a lower surface of a board of an n-type thermoelectric conversion material $(Bi_2Te_{2.7}Se_{0.3})$ having sides of 100 mm×150 mm and a thickness of 5 mm as an equivalent of the thermoelectric conversion material layer 3N by thermal compression bonding. Subsequently, a board of an n-type thermoelectric conversion material $(Bi_2Te_{2.7}Se_{0.3})$ having sides of 100 mm×150 mm and a thickness of 5 mm as an equivalent of the thermoelectric conversion material layer 6N was laminated to a lower surface of the other end region of the graphite sheet, which lower surface corresponds to a lower surface of the lower graphite layer 5C. Subsequently, a glass wool plate having sides of 100 mm×5 mm and a thickness of 20.5 mm as an equivalent of the insulating layer 9 was prepared, and the glass wool plate as the equivalent of the insulating layer 9, a side surface of the thermoelectric conversion material layer 3N, the remaining region of the graphite sheet and a side surface of a thermoelectric conversion material layer 6N were bonded together. For the bonding, a paste of the above-mentioned Bi—Te material was used. As described above, an n-type thermoelectric conversion section 1N was formed to have a five-layer structure of the n-type thermoelectric conversion material layer 3N, the upper charge transport layer 5C, a cavity (air layer), the lower charge transport layer 5C and the n-type thermoelectric conversion material layer 6N.

(12-2)

One end region of a PGS graphite sheet (product by Panasonic Corporation) having sides of 100 mm×310 mm and a thickness of 50 μm as an equivalent of the charge transport layer 5D was laminated to a lower surface of a board of a p-type thermoelectric conversion material $(Bi_{0.5}Sb_{1.5}Te_3)$ having sides of 100 mm×150 mm and a thickness of 5 mm as an equivalent of the thermoelectric conversion material layer 3P by thermal compression bonding. Subsequently, a board of a p-type thermoelectric conversion material $(Bi_{0.5}Sb_{1.5}Te_3)$ having sides of 100 mm×150 mm and a thickness of 5 mm as an equivalent of the thermoelectric conversion material layer 6P was laminated to a lower surface of the other end region of the graphite sheet, which lower surface corresponds to a lower surface of the lower graphite layer 5D. Subsequently, a glass wool plate having sides of 100 mm×5 mm and a thickness of 20.5 mm as an equivalent of the insulating layer 9 was prepared, and the glass wool plate as the equivalent of the insulating layer 9, a side surface of the thermoelectric conversion material layer 3P, the remaining region of the graphite sheet and a side surface of a thermoelectric conversion material layer 6P were bonded together. For the bonding, a paste of the above-mentioned Bi—Te material was used. As described above, a p-type thermoelectric conversion section 1P was formed to have a five-layer structure of the p-type thermoelectric conversion material layer 3P, the upper charge transport layer 5D made of graphite, a cavity (air layer), the lower charge transport layer 5D made of graphite and the p-type thermoelectric conversion material layer 6P.

(12-3)

The n-type thermoelectric conversion section 1N and the p-type thermoelectric conversion section 1P were bonded beneath a conductive substrate 2 made of an Al board having sides of 100 mm×310 mm and a thickness of 0.4 mm. For the bonding, a paste of a Bi—Te material was used. The insulating layers 9 made of the glass wool plates of the n-type thermoelectric conversion section and the p-type thermoelectric conversion section were brought into close contact with a center of the Al substrate and arranged beneath the conductive substrate 2 so that the n-type thermoelectric conversion section 1N and the p-type thermoelectric conversion section 1P were opposed to each other with the insulating layers 9 therebetween. An Al paste was used for the bonding with the conductive substrate 2.

(12-4)

Electrodes 8A and 8B each made of an Al board having sides of 100 mm×150 mm and a thickness of 0.2 mm were arranged beneath the thermoelectric conversion material layers 6N and 6P, respectively, and the second and third thermoelectric conversion elements 20A and 20B to be used as Peltier elements were arranged beneath the electrodes 8A and 8B, respectively. (See FIG. 4 and FIG. 11.)

The second and third thermoelectric conversion elements 20A and 20B to be used as Peltier elements of the device of FIG. 11 were prepared as described in (12-5) to (12-8) below.

Since the Peltier elements 20A and 20B have the same basic structure as that of Example 4 (FIG. 3, the element of Embodiment 3), the description thereof will be made with reference to FIG. 3 and FIG. 11. (See FIG. 14: a perspective view of the Peltier element 10A.)

(12-5)

A PGS graphite sheet (product by Panasonic Corporation) as an equivalent of the anisotropic conductive material layer 5A was laminated to a lower surface of a board of an n-type thermoelectric conversion material ($Bi_2Te_{2.7}Se_{0.3}$) having sides of 45 mm×150 mm and a thickness of 10 mm as an equivalent of the thermoelectric conversion material layer 3N by thermal compression bonding to give an n-type thermoelectric conversion section. The graphite sheet had sides of 45 mm×335 mm and a thickness of 50 μm, and laminated by forming, on a thermal compression mating surface of the graphite sheet, a Bi—Te material layer having a thickness of approximately 10 μm with a paste of an n-type Bi—Te material having the same composition as the board, bringing the Bi—Te material board and the graphite sheet into close contact, and thermally compressing the same. Thus, the n-type thermoelectric conversion section 1N was formed to have a double-layer structure of the n-type thermoelectric conversion material layer 3N and the anisotropic conductive material layer 5A made of graphite. In the case of this structure, the graphite sheet has a wider width than the n-type thermoelectric conversion material layer 3N, and thus the anisotropic conductive material layer 5A has an extended portion protruded from the laminated portion.

(12-6)

A PGS graphite sheet (product by Panasonic Corporation) as an equivalent of the anisotropic conductive material layer 5B was laminated to a lower surface of a board of a p-type thermoelectric conversion material ($Bi_{0.5}Sb_{1.5}Te_3$) having sides of 45 mm×150 mm and a thickness of 10 mm as an equivalent of the thermoelectric conversion material layer 3P by thermal compression bonding to give a p-type thermoelectric conversion section. The graphite sheet had sides of 45 mm×335 mm and a thickness of 50 μm, and laminated by forming, on a thermal compression mating surface of the graphite sheet, a Bi—Te material layer having a thickness of approximately 10 μm with a paste of a p-type Bi—Te material having the same composition as the board, bringing the Bi—Te material board and the graphite sheet into close contact, and thermally compressing the same. Thus, the p-type thermoelectric conversion section 1P was formed to have a double-layer structure of the p-type thermoelectric conversion material layer 3P and the anisotropic conductive material layer 5B made of graphite. In the case of this structure, the graphite sheet has a wider width than the p-type thermoelectric conversion material layer 3P, and thus the anisotropic conductive material layer 5B has an extended portion protruded from the laminated portion.

(12-7)

An insulating layer 9 made of a glass wool plate having sides of 10 mm×150 mm and a height of 10.5 mm was formed on a center of a conductive substrate 2 (20AL and 20BL in FIG. 11) made of an Al board having sides of 100 mm×150 mm and a thickness of 0.4 mm, and the n-type thermoelectric conversion section 1N and the p-type thermoelectric conversion section 1P were arranged beneath the conductive substrate 2 so that they were opposed to each other with the insulating layer 9 therebetween. An Al paste was used for the bonding with the conductive substrate 2.

(12-8)

Electrodes 8A and 8B (20AH and 20BH in FIG. 11) each made of an Al board having sides of 45 mm×150 mm and a thickness of 0.2 mm were arranged on end regions of the extended portions of the anisotropic conductive material layers 5A and 5B, respectively. (See FIG. 3, FIG. 11 and FIG. 14.)

Top and bottom surfaces of the Peltier elements 20A and 20 B prepared as described above were covered and insulated with a PET film (product by Teijin DuPont Films Japan Limited) having a thickness of 100 μm.

The endothermic effect part (electrodes 20AL and 20BL) of the Peltier elements 20A and 20B as shown in FIG. 11 was disposed in contact with the low temperature effect part (electrodes 8A and 8B) of the thermoelectric conversion element 1D contributing to electric power generation, and the heat generation effect part (electrodes 20AH and 20BH) of the Peltier elements 20A and 20B was disposed in contact with the high temperature effect part (conductive substrate 2) of the thermoelectric conversion element 1D to form the thermoelectric conversion power generation device 1K.

The thermoelectric conversion power generation device 1K prepared as described above was evaluated for the thermoelectric electric power generation properties. The high temperature effect part (conductive substrate 2) and the low temperature effect part (electrodes 8A and 8B) of the thermoelectric conversion element 1D were given a temperature difference: $\Delta T$ of 35 (K), and a voltage/current of 2V/2 A was applied to the respective Peltier elements 20A and 20B to continuously drive the elements while detecting and evaluating the voltage/current generated between the electrode 8A and the electrode 8B of the thermoelectric conversion power generation element 1D. A power output of approximately 16.1 W was detected on an average for a power input of 8 W in total.

Example 13

A thermoelectric conversion power generation device 1L of Embodiment 12 (FIG. 12) was prepared and evaluated for the thermoelectric power generation.

As described in Embodiment 12, the thermoelectric conversion power generation device 1L is a combination of the first thermoelectric conversion element 1E contributing to electric power generation with the second and third thermoelectric conversion elements 30A and 30B to be used as Peltier elements for giving a stable temperature difference to the first thermoelectric conversion element.

The first thermoelectric conversion element 1E is an element of Example 6 (Embodiment 5, FIG. 5) and was prepared as described in (13-1) to (13-4) below.

(13-1)

One end region of a PGS graphite sheet (product by Panasonic Corporation) having sides of 100 mm×310 mm and a thickness of 50 µm as an equivalent of the charge transport layer 5C was laminated to a lower surface of a board of an n-type thermoelectric conversion material ($Bi_2Te_{2.7}Se_{0.3}$) having sides of 100 mm×150 mm and a thickness of 5 mm as an equivalent of the thermoelectric conversion material layer 3N by thermal compression bonding. Subsequently, an upper surface of a glass wool plate having sides of 100 mm×150 mm and a thickness of 10 mm as an equivalent of the heat insulating layer 4A was bonded beneath the laminated region of the graphite layer, and the remaining region of the graphite sheet was bonded to a side surface and a lower surface of the glass wool plate as the equivalent of the heat insulating layer 4A. Subsequently, a board of an n-type thermoelectric conversion material ($Bi_2Te_{2.7}Se_{0.3}$) having sides of 100 mm×150 mm and a thickness of 5 mm as an equivalent of the thermoelectric conversion material layer 6N was laminated to a lower surface of the graphite layer, which lower surface corresponds to a lowermost region of the graphite layer. For the bonding, a paste of the above-mentioned Bi—Te material was used. As described above, an n-type thermoelectric conversion section 1N was formed to have a five-layer structure of the n-type thermoelectric conversion material layer 3N, the upper charge transport layer 5C made of graphite, the heat insulating layer 4A, the lower charge transport layer 5C made of graphite and the n-type thermoelectric conversion material layer 6N.

(13-2)

One end region of a PGS graphite sheet (product by Panasonic Corporation) having sides of 100 mm×310 mm and a thickness of 50 µm as an equivalent of the charge transport layer 5D was laminated to a lower surface of a board of a p-type thermoelectric conversion material ($Bi_{0.5}Sb_{1.5}Te_3$) having sides of 100 mm×150 mm and a thickness of 5 mm as an equivalent of the thermoelectric conversion material layer 3P by thermal compression bonding. Subsequently, an upper surface of a glass wool plate having sides of 100 mm×150 mm and a thickness of 10 mm as an equivalent of the heat insulating layer 4B was bonded beneath the laminated region of the graphite layer, and the remaining region of the graphite sheet was bonded to a side surface and a lower surface of the glass wool plate as the equivalent of the heat insulating layer 4B. Subsequently, a board of a p-type thermoelectric conversion material ($Bi_{0.5}Sb_{1.5}Te_3$) having sides of 100 mm×150 mm and a thickness of 5 mm as an equivalent of the thermoelectric conversion material layer 6P was laminated to a lower surface of the graphite layer, which lower surface corresponds to a lowermost region of the graphite layer. For the bonding, a paste of the above-mentioned Bi—Te material was used. As described above, a p-type thermoelectric conversion section 1P was formed to have a five-layer structure of the p-type thermoelectric conversion material layer 3P, the lower charge transport layer 5D made of graphite, the heat insulating layer 4B, the upper charge transport layer 5D made of graphite and the p-type thermoelectric conversion material layer 6P.

(13-3)

An insulating layer 9 made of a glass wool plate having sides of 100 mm×10 mm and a height of 20.5 mm was formed beneath a center of a conductive substrate 2 made of an Al board having sides of 100 mm×310 mm and a thickness of 0.4 mm, and the n-type thermoelectric conversion section 1N and the p-type thermoelectric conversion section 1P were arranged beneath the conductive substrate 2 so that they were opposed to each other with the insulating layer 9 therebetween. An Al paste was used for the bonding with the conductive substrate 2.

(13-4)

Electrodes 8A and 8B each made of an Al board having sides of 100 mm×150 mm and a thickness of 0.2 mm were arranged beneath the thermoelectric conversion material layers 6N and 6P, respectively, and the second and third thermoelectric conversion elements 30A and 30B to be used as Peltier elements were arranged beneath the electrodes 8A and 8B, respectively. (See FIG. 5 and FIG. 12.)

The second and third thermoelectric conversion elements 30A and 30B to be used as Peltier elements of the device of FIG. 12 were prepared as described in (13-5) to (13-8) below. Since the Peltier elements 30A and 30B have the same basic structure as that of Example 7 (FIG. 6, the element of Embodiment 6), the description thereof will be made with reference to FIG. 6 and FIG. 12. FIG. 15 is a perspective view of the Peltier element 30A prepared.

(13-5)

One end region of a PGS graphite sheet (product by Panasonic Corporation) having sides of 45 mm×310 mm and a thickness of 50 µm as an equivalent of the charge transport layer 5C was laminated to a lower surface of a board of an n-type thermoelectric conversion material ($Bi_2Te_{2.7}Se_{0.3}$) having sides of 45 mm×150 mm and a thickness of 5 mm as an equivalent of the thermoelectric conversion material layer 3N by thermal compression bonding. Subsequently, an upper surface of a glass wool plate having sides of 45 mm×150 mm and a thickness of 10 mm as an equivalent of the heat insulating layer 4A was bonded beneath the laminated region of the graphite layer, and the remaining region of the graphite sheet was bonded to a side surface and a lower surface of the glass wool plate. Subsequently, a board of an n-type thermoelectric conversion material ($Bi_2Te_{2.7}Se_{0.3}$) having sides of 45 mm×150 mm and a thickness of 5 mm as an equivalent of the thermoelectric conversion material layer 6N was laminated to a lower surface of the graphite sheet, which lower surface corresponds to a lowermost region of the graphite layer, and a graphite sheet (product by Panasonic Corporation) having sides of 45 mm×220 mm and a thickness of 50 µm as an equivalent of the anisotropic conductive material layer 5A was laminated to a lower surface of the board as the equivalent of the thermoelectric conversion material layer 6N by thermal compression bonding to give an n-type thermoelectric conversion section 1N. For the bonding, a paste of the above-mentioned Bi—Te material was used. As described above, the n-type thermoelectric conversion section 1N was formed to have a six-layer structure of the n-type thermoelectric conversion material layer 3N, the upper charge transport layer 5C, the heat insulating layer 4A, the lower charge transport layer 5C, the n-type thermoelectric conversion material layer 6N and the anisotropic conductive material layer 5A. In the case of this structure, the graphite sheet has a wider width than the n-type thermoelectric conversion material layer 6N, and thus the anisotropic conductive material layer 5A has an extended portion protruded from the laminated portion.

(13-6)

One end region of a PGS graphite sheet (product by Panasonic Corporation) having sides of 45 mm×310 mm and a thickness of 50 μm as an equivalent of the charge transport layer 5D was laminated to a lower surface of a board of a p-type thermoelectric conversion material ($Bi_{0.5}Sb_{1.5}Te_3$) having sides of 45 mm×150 mm and a thickness of 5 mm as an equivalent of the thermoelectric conversion material layer 3P by thermal compression bonding. Subsequently, an upper surface of a glass wool plate having sides of 45 mm×150 mm and a thickness of 10 mm as an equivalent of the heat insulating layer 4B was bonded beneath the laminated region of the graphite layer, and the remaining region of the graphite sheet was bonded to a side surface and a lower surface of the glass wool plate. Subsequently, a board of a p-type thermoelectric conversion material ($Bi_{0.5}Sb_{1.5}Te_3$) having sides of 45 mm×150 mm and a thickness of 5 mm as an equivalent of the thermoelectric conversion material layer 6P was laminated to a lower surface of the graphite sheet, which lower surface corresponds to a lowermost region of the graphite layer, and a graphite sheet (product by Panasonic Corporation) having sides of 45 mm×220 mm and a thickness of 50 μm as an equivalent of the anisotropic conductive material layer 5B was laminated to a lower surface of the board as the equivalent of the thermoelectric conversion material layer 6P by thermal compression bonding to give a p-type thermoelectric conversion section 1P. For the bonding, a paste of the above-mentioned Bi—Te material was used. As described above, the p-type thermoelectric conversion section was formed to have a six-layer structure of the p-type thermoelectric conversion material layer 3P, the upper charge transport layer 5D, the heat insulating layer 4B, the lower charge transport layer 5D, the p-type thermoelectric conversion material layer 6P and the anisotropic conductive material layer 5B. In the case of this structure, the graphite sheet has a wider width than the p-type thermoelectric conversion material layer 6P, and thus the anisotropic conductive material layer 5B has an extended portion protruded from the laminated portion.

(13-7)

An insulating layer 9 made of a glass wool plate having sides of 10 mm×150 mm and a height of 10.5 mm was formed on a center of a conductive substrate 2 (30AL and 30BL in FIG. 12) made of an Al board having sides of 100 mm×150 mm and a thickness of 0.4 mm, and the n-type thermoelectric conversion section 1N and the p-type thermoelectric conversion section 1P were arranged beneath the conductive substrate 2 so that they were opposed to each other with the insulating layer 9 therebetween. An Al paste was used for the bonding with the conductive substrate 2.

(13-8)

Electrodes 8A and 8B (30AH and 30BH in FIG. 12) each made of an Al board having sides of 45 mm×20 mm and a thickness of 0.2 mm were arranged beneath end regions of the extended portions protruded from the laminated portions of the anisotropic conductive material layers 5A and 5B, respectively. (See FIG. 6, FIG. 12 and FIG. 15.)

Top and bottom surfaces of the Peltier elements 30A and 30B prepared as described above were covered and insulated with a PET film (product by Teijin DuPont Films Japan Limited) having a thickness of 100 μm.

The endothermic effect part (electrodes 30AL and 30BL) of the Peltier elements 30A and 30B as shown in FIG. 12 was disposed in contact with the low temperature effect part (electrodes 8A and 8B) of the thermoelectric conversion element 1E contributing to electric power generation, and the heat generation effect part (electrodes 30AH and 30BH) of the Peltier elements 30A and 30B was disposed in contact with an object disposed on the high temperature effect part (conductive substrate 2) of the thermoelectric conversion element 1E to form the thermoelectric conversion power generation device 1L.

The thermoelectric conversion power generation device 1L prepared as described above was evaluated for the thermoelectric electric power generation properties. The high temperature effect part (object) and the low temperature effect part (electrodes 8A and 8B) of the thermoelectric conversion element 1E were given a temperature difference: ΔT of 35 (K), and a voltage/current of 2V/2 A was applied to the respective Peltier elements 30A and 30B to continuously drive the elements while detecting and evaluating the voltage/current generated between the electrode 8A and the electrode 8B of the thermoelectric conversion power generation element 1E. A power output of approximately 15.7 W was detected on an average for a power input of 8 W in total.

Example 14

A thermoelectric conversion power generation device 1M of Embodiment 13 (FIG. 13) was prepared and evaluated for the thermoelectric power generation.

As described in Embodiment 13, the thermoelectric conversion power generation device 1M is a combination of the first thermoelectric conversion element 1G contributing to electric power generation with the second and third thermoelectric conversion elements 40A and 40B to be used as Peltier elements for giving a stable temperature difference to the first thermoelectric conversion element.

The first thermoelectric conversion element 1G is an element of Example 8 (Embodiment 7, FIG. 7) and was prepared as described in (14-1) to (14-4) below.

(14-1)

A glass wool plate having sides of 100 mm×150 mm and a thickness of 10 mm, and having through holes with a diameter of 2 mm on a 10-mm pitch in the whole area thereof was prepared as an equivalent of the heat insulating layer 4A, and top and bottom surfaces of the glass wool plate and the inside of the through holes were coated with a layer of a mixture of crystalline graphite and graphene synthesized at 1100° C. by a vapor phase method using acetylene as a raw material. The glass wool plate coated with the charge transport material was bonded beneath a board of an n-type thermoelectric conversion material ($Bi_2Te_{2.7}Se_{0.3}$) having sides of 100 mm×150 mm and a thickness of 5 mm as an equivalent of the thermoelectric conversion material layer 3N. Subsequently, a board of an n-type thermoelectric conversion material ($Bi_2Te_{2.7}Se_{0.3}$) having sides of 100 mm×150 mm and a thickness of 5 mm as an equivalent of the thermoelectric conversion material layer 6N was laminated to a lower surface of the glass wool plate. For the bonding, a paste of the above-mentioned Bi—Te material was used. As described above, an n-type thermoelectric conversion section 1N was formed to have a triple-layer structure of the n-type thermoelectric conversion material layer 3N, the heat insulating layer 4A and the n-type thermoelectric conversion material layer 6N.

(14-2)

A glass wool plate having sides of 100 mm×150 mm and a thickness of 10 mm, and having through holes with a diameter of 2 mm on a 10-mm pitch in the whole area thereof was prepared as an equivalent of the heat insulating layer 4B, and top and bottom surfaces of the glass wool plate and the inside of the through holes were coated with a layer of a mixture of crystalline graphite and graphene synthesized at 1100° C. by a vapor phase method using acetylene as a raw material. The glass wool plate coated with the charge transport material was bonded beneath a board of a p-type thermoelectric conversion material ($Bi_{0.5}Sb_{1.5}Te_3$) having sides of 100 mm×150 mm and a thickness of 5 mm as an equivalent of the thermoelectric conversion material layer 3P. Subsequently, a board of a p-type thermoelectric conversion material ($Bi_{0.5}Sb_{1.5}Te_3$) having sides of 100 mm×150 mm and a thickness of 5 mm as an equivalent of the thermoelectric conversion material layer 6P was laminated to a lower surface of the glass wool plate. For the bonding, a paste of the above-mentioned Bi—Te material was used. As described above, a p-type thermoelectric conversion section 1P was formed to have a triple-layer structure of the p-type thermoelectric conversion material layer 3P, the heat insulating layer 4B and the p-type thermoelectric conversion material layer 6P.

(14-3)

An insulating layer 9 made of a glass wool plate having sides of 100 mm×10 mm and a height of 20.5 mm was formed beneath a center of a conductive substrate 2 made of an Al board having sides of 100 mm×310 mm and a thickness of 0.4 mm, and the n-type thermoelectric conversion section 1N and the p-type thermoelectric conversion section 1P were arranged beneath the conductive substrate 2 so that they were opposed to each other with the insulating layer 9 therebetween. An Al paste was used for the bonding with the conductive substrate 2.

(14-4)

Electrodes 8A and 8B each made of an Al board having sides of 100 mm×150 mm and a thickness of 0.2 mm were arranged beneath the thermoelectric conversion material layers 6N and 6P, respectively, and the second and third thermoelectric conversion elements 40A and 40B to be used as Peltier elements were arranged beneath the electrodes 8A and 8B, respectively. (See FIG. 7 and FIG. 13.)

The second and third thermoelectric conversion elements 40A and 40B to be used as Peltier elements of the device of FIG. 13 were prepared as described in (14-5) to (14-8) below. Since the Peltier elements 40A and 40B have the same basic structure as that of Example 9 (FIG. 8, the element of Embodiment 8), the description thereof will be made with reference to FIG. 8 and FIG. 13. (See FIG. 15: a perspective view of the Peltier element 30A.)

(14-5)

A glass wool plate having sides of 45 mm×150 mm and a thickness of 10 mm, and having through holes with a diameter of 2 mm on a 10-mm pitch in the whole area thereof was prepared as an equivalent of the heat insulating layer 4A, and top and bottom surfaces of the glass wool plate and the inside of the through holes were coated with a layer of a mixture of crystalline graphite and graphene synthesized at 1100° C. by a vapor phase method using acetylene as a raw material. The glass wool plate coated with the charge transport material was bonded beneath a board of an n-type thermoelectric conversion material ($Bi_2Te_{2.7}Se_{0.3}$) having sides of 45 mm×150 mm and a thickness of 5 mm as an equivalent of the thermoelectric conversion material layer 3N. Subsequently, a board of an n-type thermoelectric conversion material ($Bi_2Te_{2.7}Se_{0.3}$) having sides of 45 mm×150 mm and a thickness of 5 mm as an equivalent of the thermoelectric conversion material layer 6N was laminated to a lower surface of the glass wool plate, and a graphite sheet (product by Panasonic Corporation) having sides of 45 mm×345 mm and a thickness of 50 μm as an equivalent of the anisotropic conductive material layer 5A was laminated to a lower surface of the board as the equivalent of the thermoelectric conversion material layer 6N by thermal compression bonding to give an n-type thermoelectric conversion section 1N. For the bonding, a paste of the above-mentioned Bi—Te material was used. As described above, the n-type thermoelectric conversion section 1N was formed to have a four-layer structure of the n-type thermoelectric conversion material layer 3N, the heat insulating layer 4A, the n-type thermoelectric conversion material layer 6N and the anisotropic conductive material layer 5A. In the case of this structure, the graphite sheet has a wider width than the n-type thermoelectric conversion material layer 6N, and thus the anisotropic conductive material layer 5A has an extended portion protruded from the laminated portion.

(14-6)

A glass wool plate having sides of 45 mm×150 mm and a thickness of 10 mm, and having through holes with a diameter of 1 mm on a 5-mm pitch in the whole area thereof was prepared as an equivalent of the heat insulating layer 4B, and top and bottom surfaces of the glass wool plate and the inside of the through holes were coated with a layer of a mixture of crystalline graphite and graphene synthesized at 1100° C. by a vapor phase method using acetylene as a raw material. The glass wool plate coated with the charge transport material was bonded beneath a board of a p-type thermoelectric conversion material ($Bi_{0.5}Sb_{1.5}Te_3$) having sides of 45 mm×150 mm and a thickness of 5 mm as an equivalent of the thermoelectric conversion material layer 3P. Subsequently, a board of a p-type thermoelectric conversion material ($Bi_{0.5}Sb_{1.5}Te_3$) having sides of 45 mm×150 mm and a thickness of 5 mm as an equivalent of the thermoelectric conversion material layer 6P was laminated to a lower surface of the glass wool plate, and a graphite sheet (product by Panasonic Corporation) having sides of 45 mm×345 mm and a thickness of 50 μm as an equivalent of the anisotropic conductive material layer 5B was laminated to a lower surface of the board as the equivalent of the thermoelectric conversion material layer 6P by thermal compression bonding to give a p-type thermoelectric conversion section 1P. As described above, the p-type thermoelectric conversion section was formed to have a four-layer structure of the p-type thermoelectric conversion material layer 3P, the heat insulating layer 4B, the p-type thermoelectric conversion material layer 6P and the anisotropic conductive material layer 5B. For the bonding, a paste of the above-mentioned Bi—Te material was used. In the case of this structure, the graphite sheet has a wider width than the p-type thermoelectric conversion material layer 6P, and thus the anisotropic conductive material layer 5B has an extended portion protruded from the laminated portion.

(14-7)

An insulating layer 9 made of a glass wool plate having sides of 10 mm×150 mm and a height of 10.5 mm was formed on a center of a conductive substrate 2 (40AL and 40BL in FIG. 13) made of an Al board having sides of 100 mm×150 mm and a thickness of 0.4 mm, and the n-type thermoelectric conversion section 1N and the p-type thermoelectric conversion section 1P were arranged beneath the conductive substrate 2 so that they were opposed to each other with the insulating layer 9 therebetween. An Al paste was used for the bonding with the conductive substrate 2.

(14-8)

Electrodes 8A and 8B (40AH and 40BH in FIG. 13) each made of an Al board having sides of 45 mm×20 mm and a thickness of 0.2 mm were arranged beneath end regions of the extended portions protruded from the laminated portions of the anisotropic conductive material layers 5A and 5B, respectively. (See FIG. 8, FIG. 13 and FIG. 15.)

Top and bottom surfaces of the Peltier elements 40A and 40B prepared as described above were covered and insulated with a PET film (product by Teijin DuPont Films Japan Limited) having a thickness of 100 μm.

The endothermic effect part (electrodes 40AL and 40BL) of the Peltier elements 40A and 40B as shown in FIG. 13 was disposed in contact with the low temperature effect part (electrodes 8A and 8B) of the thermoelectric conversion element 1G contributing to electric power generation, and the heat generation effect part (electrodes 40AH and 40BH) of the Peltier elements 40A and 40B was disposed in contact with the high temperature effect part (conductive substrate 2) of the thermoelectric conversion element 1G to form the thermoelectric conversion power generation device 1M.

The thermoelectric conversion power generation device 1M prepared as described above was evaluated for the thermoelectric electric power generation properties. The high temperature effect part (conductive substrate 2) and the low temperature effect part (electrodes 8A and 8B) of the thermoelectric conversion element 1E were given a temperature difference: ΔT of 35 (K), and a voltage/current of 2V/2 A was applied to the respective Peltier elements 40A and 40B to continuously drive the elements while detecting and evaluating the voltage/current generated between the electrode 8A and the electrode 8B of the thermoelectric conversion power generation element 1E. A power output of approximately 15.8 W was detected on an average for a power input of 8 W in total.

The thermoelectric conversion elements of Embodiments 1 to 9 described above may be used independently, or two or more of the thermoelectric conversion elements may be combined to form a thermoelectric conversion power generation device. The combinations are not limited to the examples described in the present specification, and may be a thermoelectric conversion power generation device formed from the thermoelectric conversion element 1B of Embodiment 3 and the thermoelectric conversion element 1E of Embodiment 5 or a thermoelectric conversion power generation device formed from the thermoelectric conversion element 1D of Embodiment 4 and the thermoelectric conversion element 1H of Embodiment 8, for example.

DESCRIPTION OF REFERENCE NUMERALS 1A, 1B, 1C, 1D, 1E, 1F, 1G, 1H, 1I: Thermoelectric conversion element of the present invention
1J, 1K, 1L, 1M: Thermoelectric conversion power generation device of the present invention
1Q: Conventional thermoelectric conversion element
1N: N-type thermoelectric conversion section
1P: P-type thermoelectric conversion section
2: Conductive substrate (first electrode)
3N: N-type thermoelectric conversion material layer
3P: P-type thermoelectric conversion material layer
4A, 4C: First heat insulating layer
4B, 4D: Second heat insulating layer
5A: First anisotropic conductive material layer
5B: Second anisotropic conductive material layer
5C: First charge transport layer
5D: Second charge transport layer
6N: N-type thermoelectric conversion material layer
6P: P-type thermoelectric conversion material layer
7A: First through hole
7B: Second through hole
8A: Second electrode
8B: Third electrode
9: Insulating layer
10A, 20A, 30A, 40A: Second thermoelectric conversion element (Peltier element)
10B, 20B, 30B, 40B: Third thermoelectric conversion element (Peltier element)
10AL, 10BL, 20AL, 20BL, 30AL, 30BL, 40AL, 40BL: First electrode
10AH, 10BH, 20AH, 20BH, 30AH, 30BH, 40AH, 40BH: Second electrode or third electrode
10AG, 10BG, 20AG, 20BG, 30AG, 30BG, 40AG, 40BG: Extended portion (extended portion of anisotropic conductive material layer)
100: Thermoelectric conversion element
120, 121, 180: Electrode
130: N-type thermoelectric semiconductor
131: P-type thermoelectric semiconductor
TP: Temperature measurement point

What is claimed is:

1. A thermoelectric conversion element, comprising a thermoelectric conversion section and electrodes,
wherein the thermoelectric conversion section has a laminate structure which includes at least a thermoelectric conversion material layer and a charge transport layer,
wherein the thermoelectric conversion material layer is formed of thermoelectric conversion material having semiconducting electric conduction properties consisting of either an n-type or a p-type,
wherein the charge transport layer is formed of charge transport material having semiconducting electric conduction properties so that energy can be hardly released or absorbed as carriers in the conduction band of the thermoelectric conversion material transfer to the conduction band of the charge transport material,
wherein the charge transport layer is an anisotropic conductive material layer having anisotropy with respect to conductivity, and the anisotropic conductive material layer has a larger electric conductivity in a plane direction than in a thickness direction,
wherein the charge transport layer comprises an extended portion protruded from the laminate structure,
wherein one of the electrodes is disposed on the extended portion so that carriers can move in a plane direction of the charge transport layer between the electrode and the thermoelectric conversion material layer, and
wherein the thermoelectric conversion section has one thermoelectric conversion property of either an n-type or a p-type.

2. The thermoelectric conversion element according to claim 1, wherein the charge transport material is selected from the group of graphite, graphene, electron transport material and hole transport material.

3. A thermoelectric conversion element, comprising a thermoelectric conversion section and electrodes,
wherein the thermoelectric conversion section includes at least a first thermoelectric conversion material layer, a charge transport layer and a second thermoelectric conversion material layer,
wherein the first thermoelectric conversion material layer and the second thermoelectric conversion material layer are formed of thermoelectric conversion material having semiconducting electric conduction properties, and have the same property of either an n-type or a p-type, and are made of the same material,
wherein the charge transport layer is formed of charge transport material having semiconducting electric conduction properties so that energy can be hardly released or absorbed as carriers in the conduction band of the thermoelectric conversion material transfer to the conduction band of the charge transport material, wherein the charge transport layer is an anisotropic conductive material layer having anisotropy with respect to conductivity, and the anisotropic conductive material layer has a larger electric conductivity in a plane direction than in a thickness direction, wherein the first thermoelectric conversion material layer and the second thermoelectric conversion material layer are formed on the same surface of the charge transport layer so that carriers transported to the charge transport layer can move in a plane direction of the charge transport layer between the first thermoelectric conversion material layer and the second thermoelectric conversion material layer, and wherein the thermoelectric conversion section has one thermoelectric conversion property of either an n-type or a p-type.

4. The thermoelectric conversion element according to claim 3, wherein the charge transport layer is spatially separated into a lower charge transport layer and an upper charge transport layer by a cavity, and the lower charge transport layer and the upper charge transport layer are continuous with each other along a side surface of the thermoelectric conversion section and form one charge transport layer, and wherein the first thermoelectric conversion material layer, the lower charge transport layer, the cavity, the upper charge transport layer and the second thermoelectric conversion material layer are laminated in sequence.

5. The thermoelectric conversion element according to claim 3, wherein the thermoelectric conversion section further includes a heat insulating layer, wherein the charge transport layer is structurally separated into a lower charge transport layer and an upper charge transport layer by the heat insulating layer, and the lower charge transport layer and the upper charge transport layer are continuous with each other along a side surface of the heat insulating layer and form one charge transport layer, and wherein the first thermoelectric conversion material layer, the lower charge transport layer, the heat insulating layer, the upper charge transport layer and the second thermoelectric conversion material layer are laminated in sequence.

6. The thermoelectric conversion element according to claim 3, wherein the thermoelectric conversion section further includes a heat insulating layer which has through holes or is formed of a porous material comprising pores, wherein the charge transport layers are formed inside of the through holes or the pores by coating the inside of them with the charge transport material, and wherein the first thermoelectric conversion material layer, the heat insulating layer and the second thermoelectric conversion material layer are laminated in sequence.

7. The thermoelectric conversion element according to claim 3, wherein the charge transport material is selected from the group of graphite, graphene, electron transport material and hole transport material.

* * * * *